(12) United States Patent
Fujimoto et al.

(10) Patent No.: US 8,993,869 B2
(45) Date of Patent: Mar. 31, 2015

(54) PHOTOELECTRIC CONVERSION ELEMENT

(75) Inventors: Akira Fujimoto, Kanagawa-ken (JP); Tsutomu Nakanishi, Tokyo (JP); Kenji Nakamura, Kanagawa-ken (JP); Kumi Masunaga, Kanagawa-ken (JP); Koji Asakawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/422,728

(22) Filed: Mar. 16, 2012

(65) Prior Publication Data

US 2012/0247552 A1 Oct. 4, 2012

(30) Foreign Application Priority Data

Mar. 28, 2011 (JP) ................................ 2011-069149
Sep. 30, 2011 (JP) ................................ 2011-218681

(51) Int. Cl.
*H01L 31/0232* (2014.01)
*H01L 31/0224* (2006.01)
*H01L 31/0216* (2014.01)
*H01L 31/0288* (2006.01)

(52) U.S. Cl.
CPC .. *H01L 31/022425* (2013.01); *H01L 31/02168* (2013.01); *H01L 31/0288* (2013.01); *Y02E 10/50* (2013.01)
USPC ........... 136/243; 136/245; 136/246; 136/247; 136/250

(58) Field of Classification Search
CPC ........ H01L 31/00–31/208; Y02E 10/50–10/60
USPC ........................................................ 977/767
See application file for complete search history.

(56) References Cited

U.S. PATENT DOCUMENTS

| | | | |
|---|---|---|---|
| 4,525,223 A * | 6/1985 | Tsuya et al. .................. | 438/490 |
| 7,928,353 B2 | 4/2011 | Fujimoto et al. | |
| 8,334,547 B2 | 12/2012 | Tsutsumi et al. | |
| 2001/0008145 A1 * | 7/2001 | Takato et al. ................. | 136/256 |
| 2002/0000242 A1 * | 1/2002 | Matushiita et al. ........... | 136/244 |
| 2006/0137737 A1 * | 6/2006 | Nakayama et al. ........... | 136/255 |

(Continued)

FOREIGN PATENT DOCUMENTS

CN       1198597 A    11/1998
EP     0 875 945 A2   11/1998

(Continued)

OTHER PUBLICATIONS

U.S. Appl. No. 13/619,360, filed Sep. 14, 2012, Tsutsumi, et al.

(Continued)

*Primary Examiner* — Bach Dinh
(74) *Attorney, Agent, or Firm* — Oblon, McClelland, Maier & Neustadt, L.L.P.

(57) ABSTRACT

A photoelectric conversion element includes a photoelectric conversion layer to include a first metal layer, a semiconductor layer, and a second metal layer, all of which are laminated. In addition, at least one of the first metal layer and the second metal layer is a nano-mesh metal having a plurality of through holes or a dot metal having a plurality of metal dots arranged separately from each other on the semiconductor layer. The photoelectric conversion layer includes a long-wavelength absorption layer containing an impurity which is different from impurities for p-type doping and n-type doping of the semiconductor layer. The long-wavelength absorption layer is within a depth of 5 nm from the nano-mesh metal or the dot metal.

21 Claims, 43 Drawing Sheets

(56) References Cited

U.S. PATENT DOCUMENTS

| | | | |
|---|---|---|---|
| 2008/0199701 A1* | 8/2008 | Kuehnle et al. | 428/403 |
| 2009/0165845 A1* | 7/2009 | Tsao et al. | 136/256 |
| 2009/0188552 A1* | 7/2009 | Wang et al. | 136/255 |
| 2009/0211783 A1 | 8/2009 | Tsutsumi et al. | |
| 2010/0126567 A1* | 5/2010 | Kaufman | 136/252 |
| 2010/0175749 A1 | 7/2010 | Tsutsumi et al. | |
| 2010/0229930 A1* | 9/2010 | Fetzer | 136/255 |
| 2010/0236607 A1* | 9/2010 | Korevaar et al. | 136/249 |
| 2010/0236619 A1* | 9/2010 | Tsutsumi et al. | 136/256 |
| 2010/0236620 A1 | 9/2010 | Nakanishi et al. | |
| 2011/0073173 A1* | 3/2011 | Hwang | 136/255 |
| 2011/0220190 A1* | 9/2011 | Lee et al. | 136/255 |
| 2011/0220976 A1 | 9/2011 | Iida et al. | |
| 2011/0226317 A1* | 9/2011 | Xu et al. | 136/255 |
| 2012/0042946 A1 | 2/2012 | Masunaga et al. | |

FOREIGN PATENT DOCUMENTS

| | | |
|---|---|---|
| JP | H03-160763 | 7/1991 |
| JP | 2010-219399 A | 9/2010 |
| WO | WO 2007/118815 A2 | 10/2007 |

OTHER PUBLICATIONS

Combined Chinese Office Action and Search Report issued May 4, 2014 in Patent Application No. 201210054850.0 (with English language translation).

Office Action issued Jun. 27, 2014 in Japanese Patent Application No. 2011-218681 filed Sep. 30, 2011 (with English Translation).

* cited by examiner

| ΔE | exp(ΔE/RT) |
|---|---|
| 0.01 | 0.67868587 |
| 0.05 | 0.14399388 |
| 0.1 | 0.02073424 |
| 0.15 | 0.0029856 |
| 0.2 | 0.00042891 |

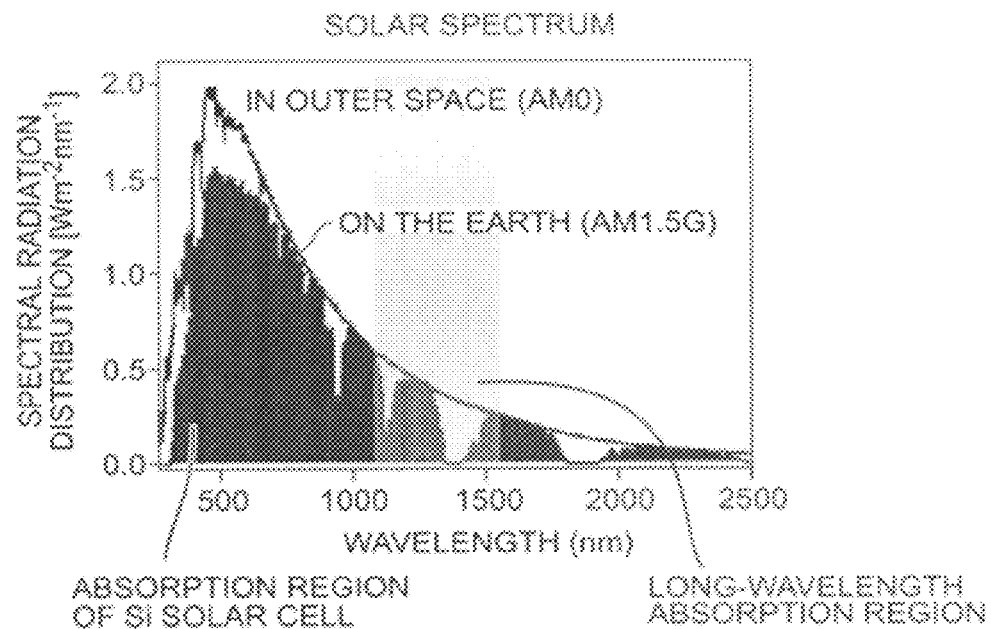
FIG. 5
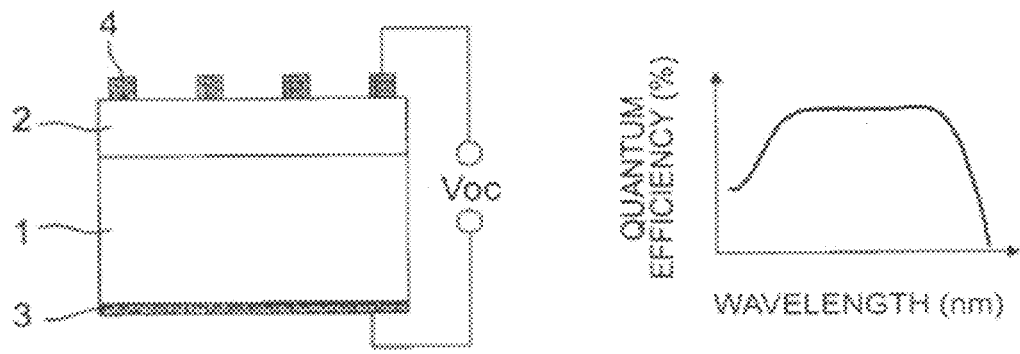
BACKGROUND ART
FIG. 6A
BACKGROUND ART
FIG. 6B

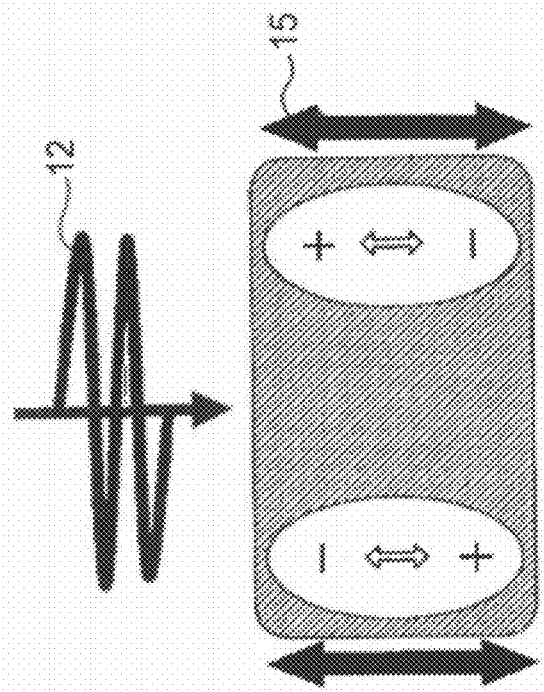
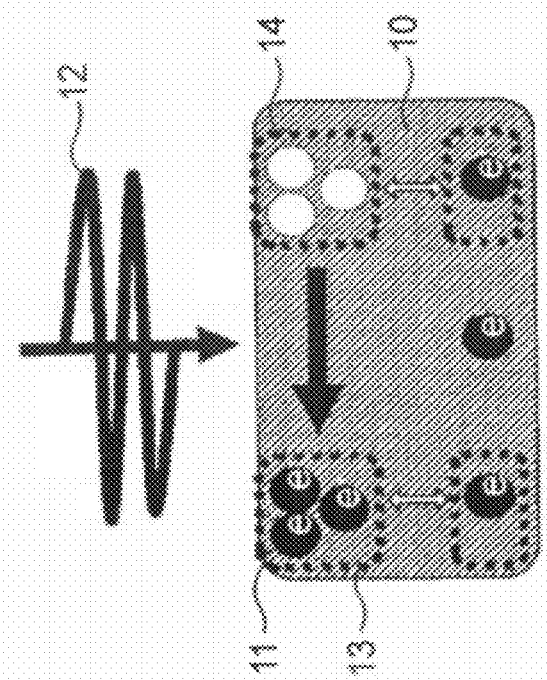

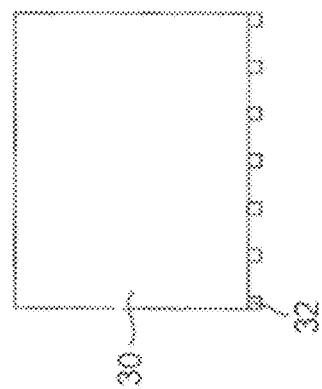
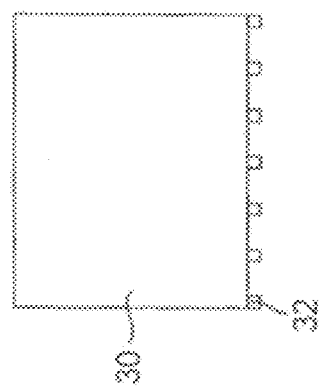
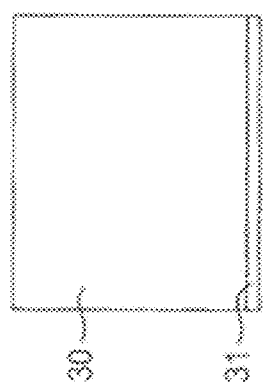
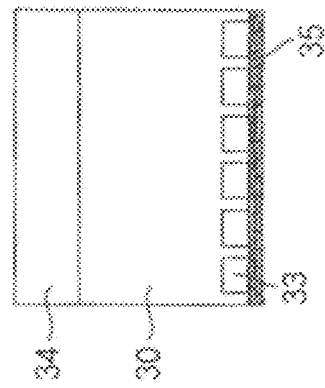
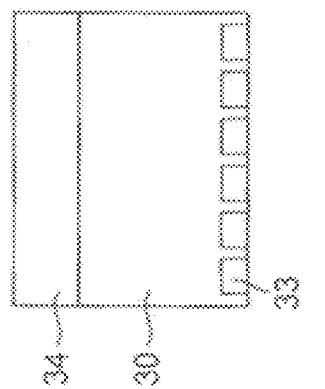
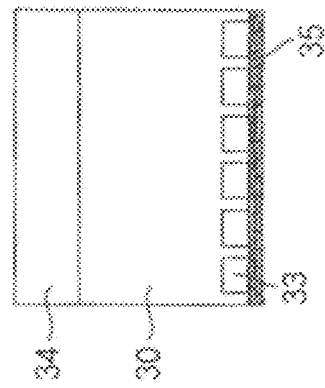

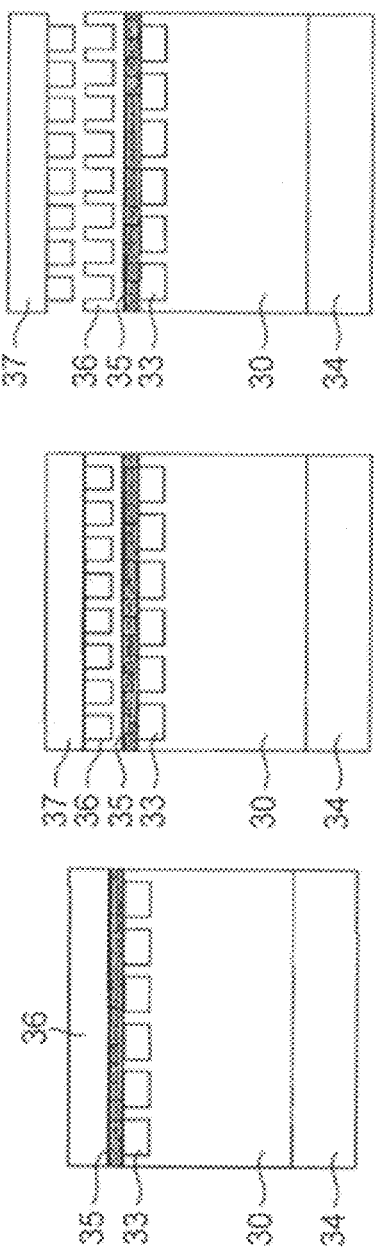
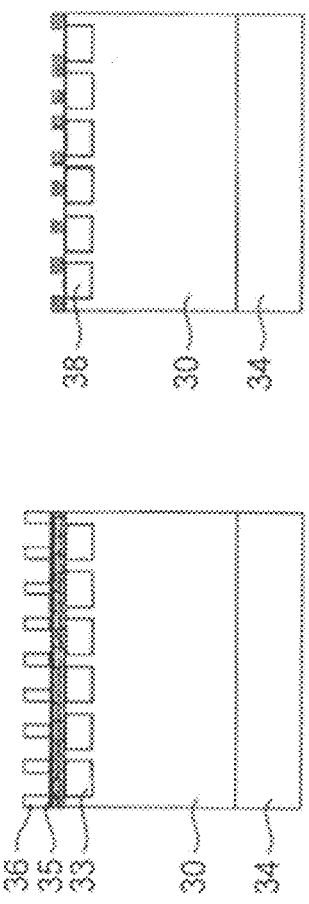
FIG. 15A  FIG. 15B  FIG. 15C  FIG. 15D  FIG. 15E

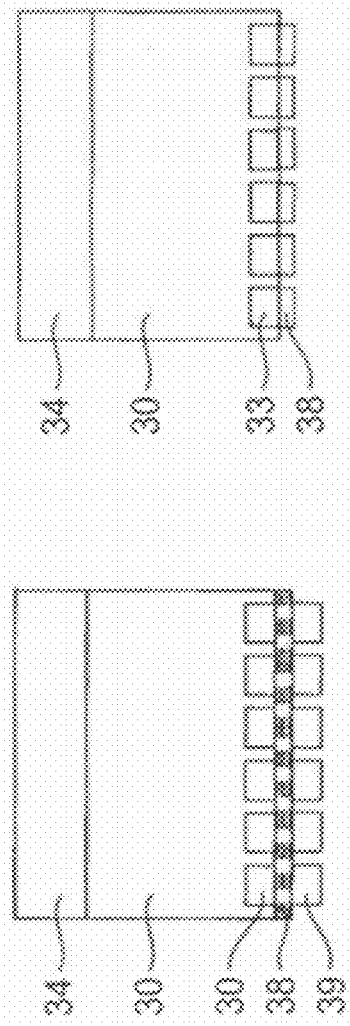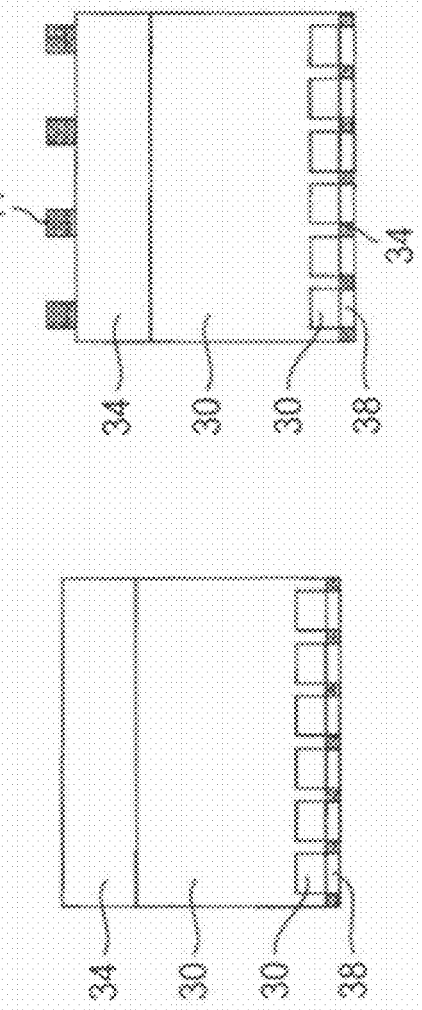

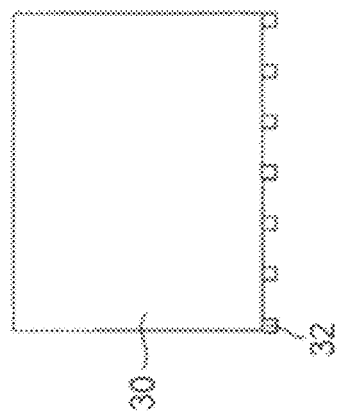
FIG. 17C
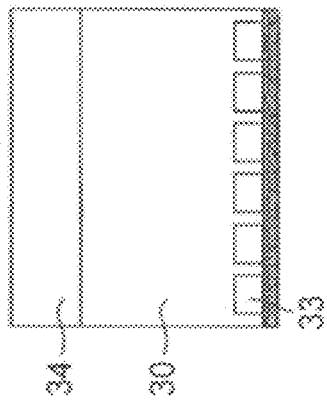
FIG. 17F
FIG. 17B
FIG. 17E
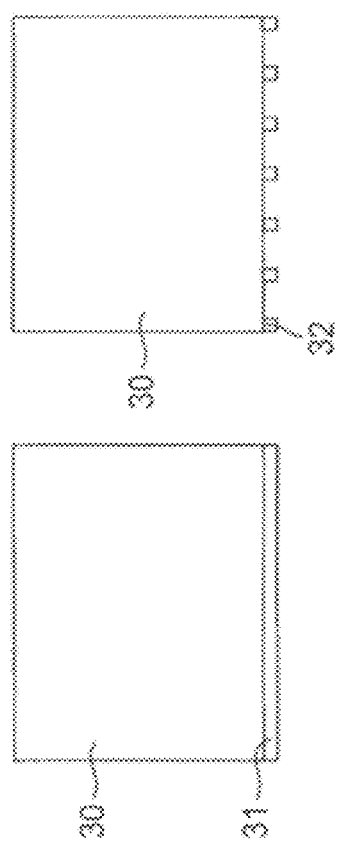
FIG. 17A
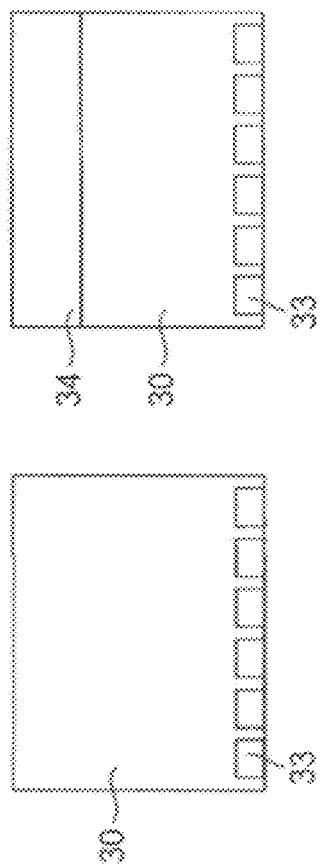
FIG. 17D

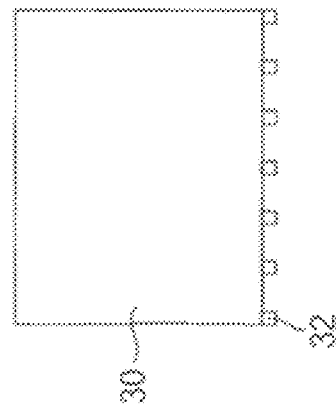
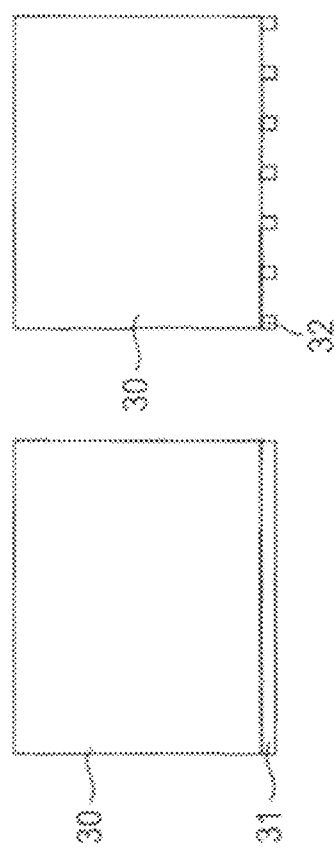
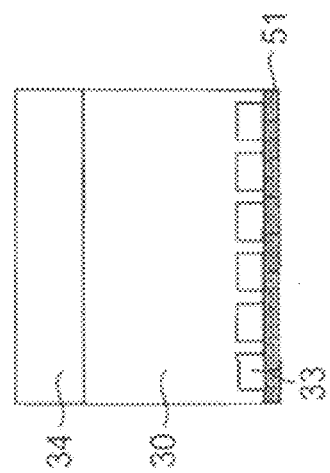
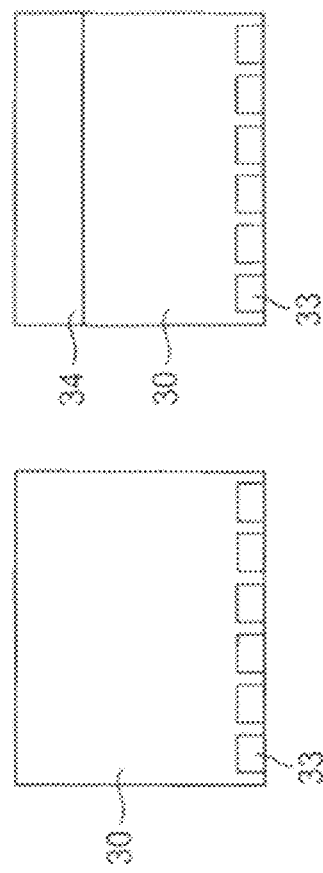

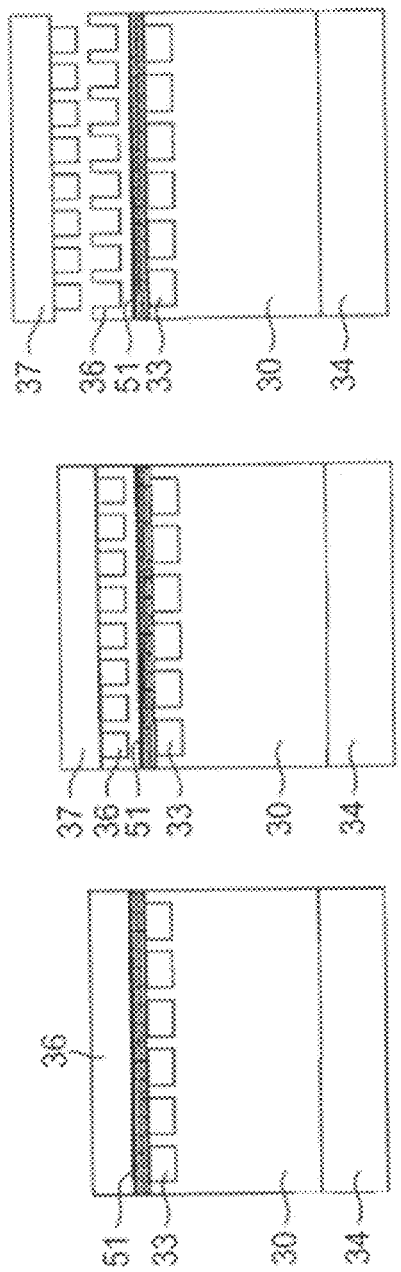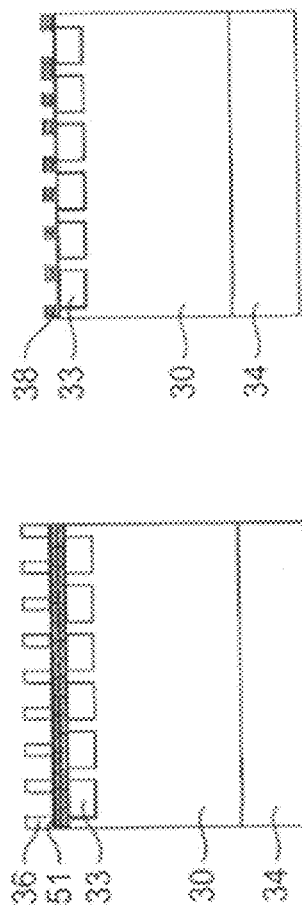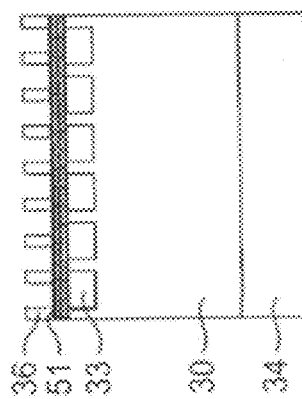

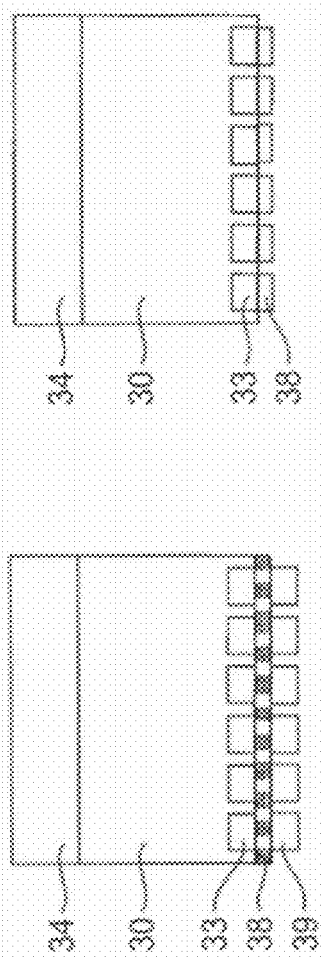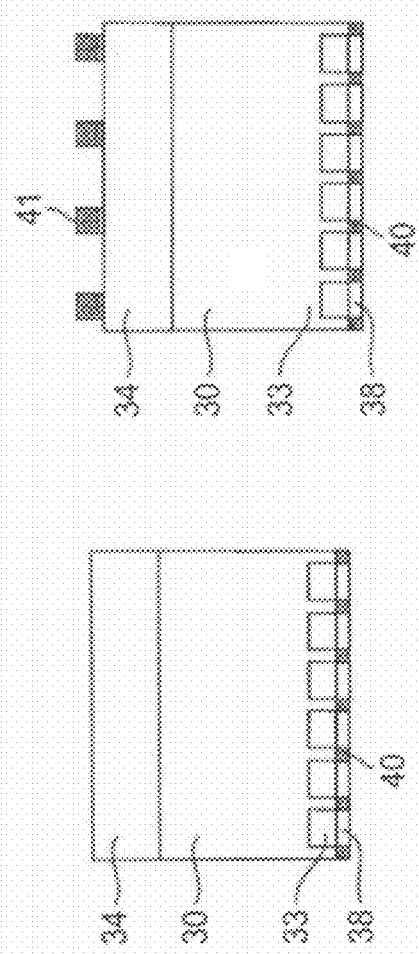

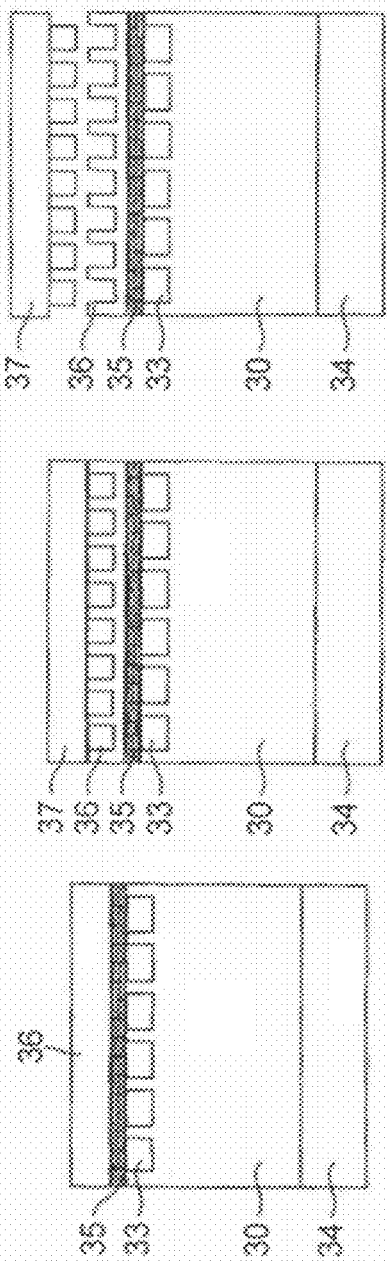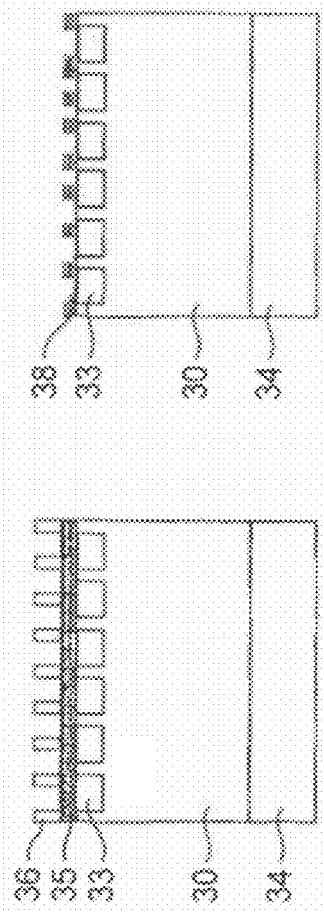

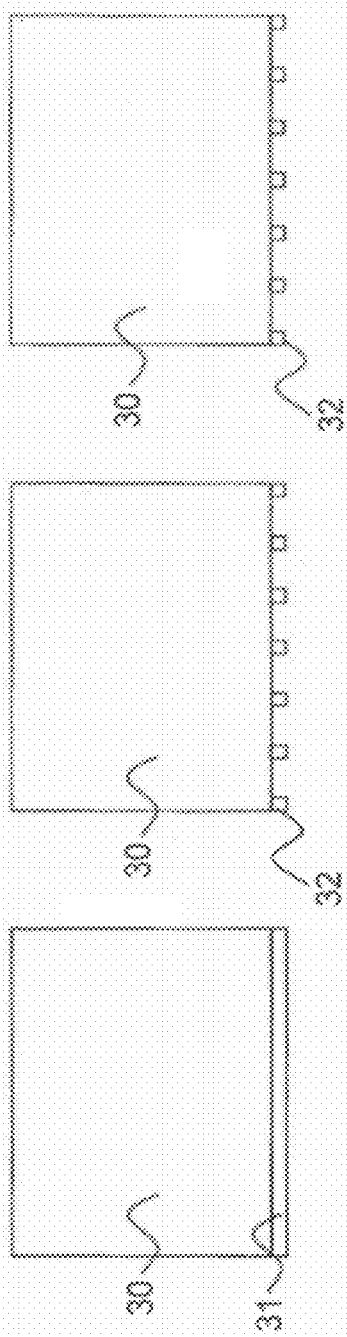
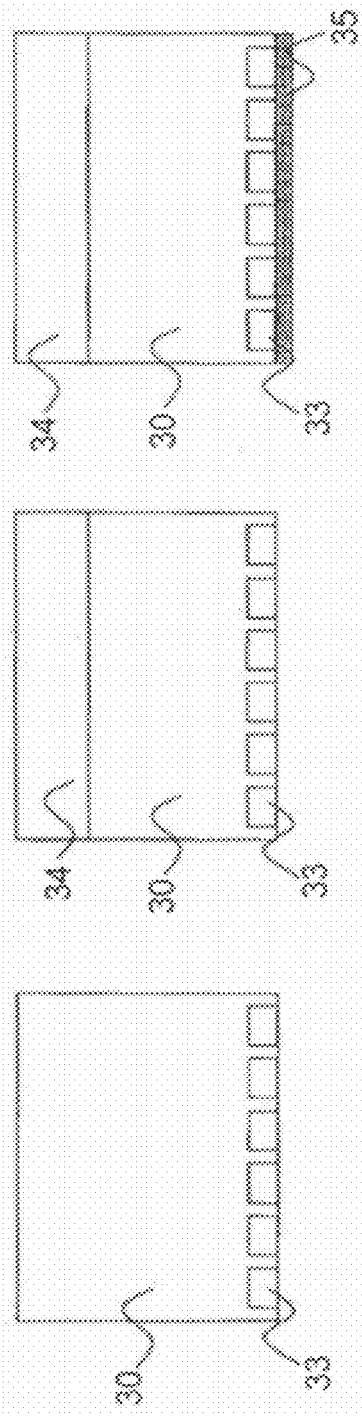
FIG. 32A
FIG. 32B
FIG. 32C
FIG. 32D
FIG. 32E
FIG. 32F

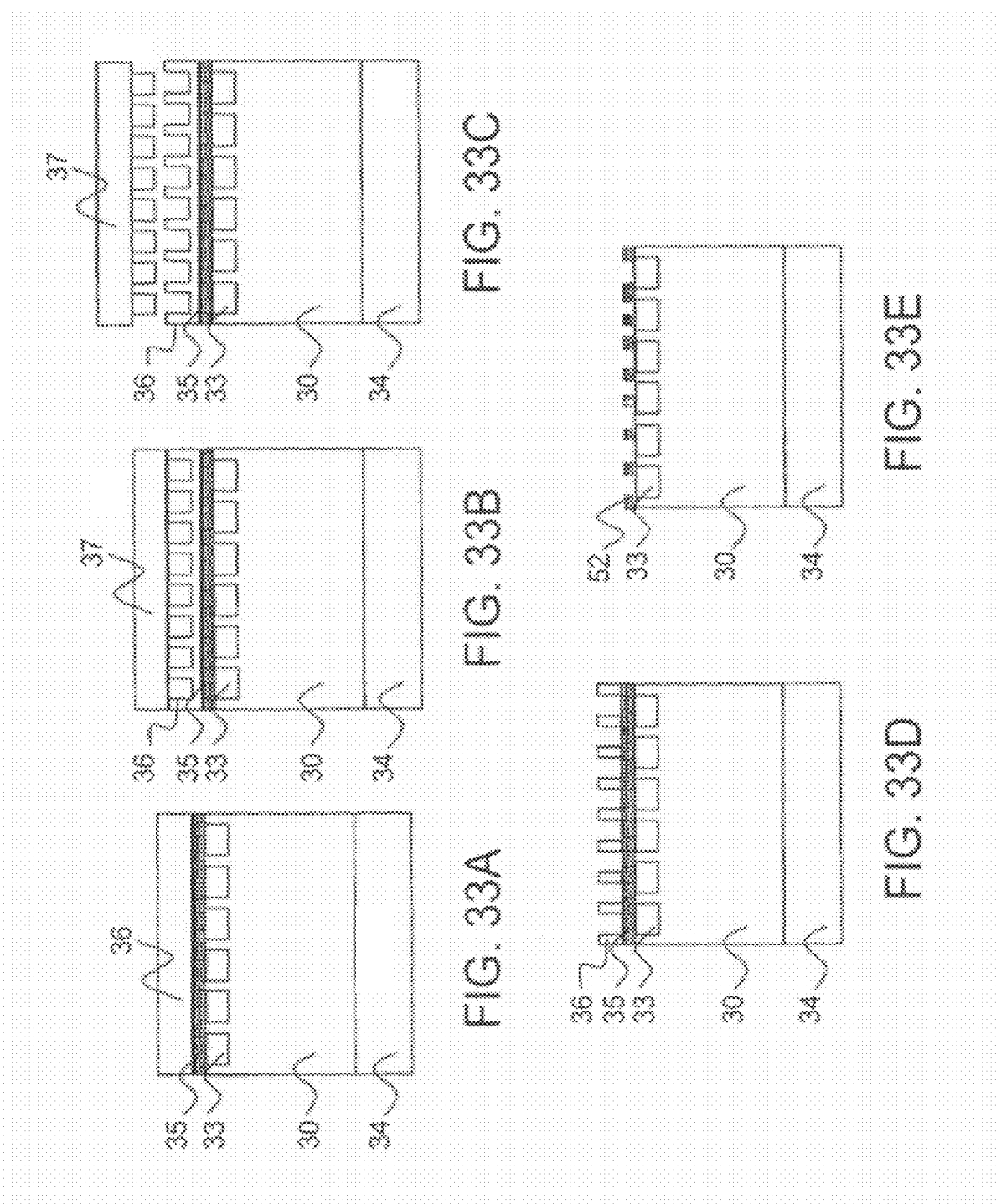

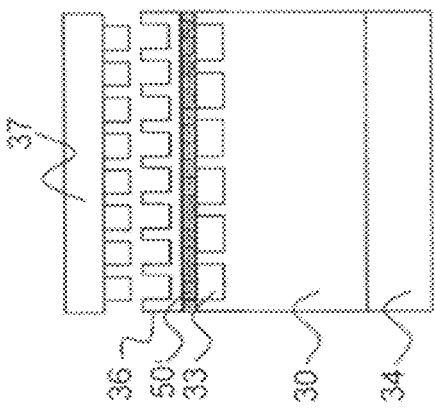
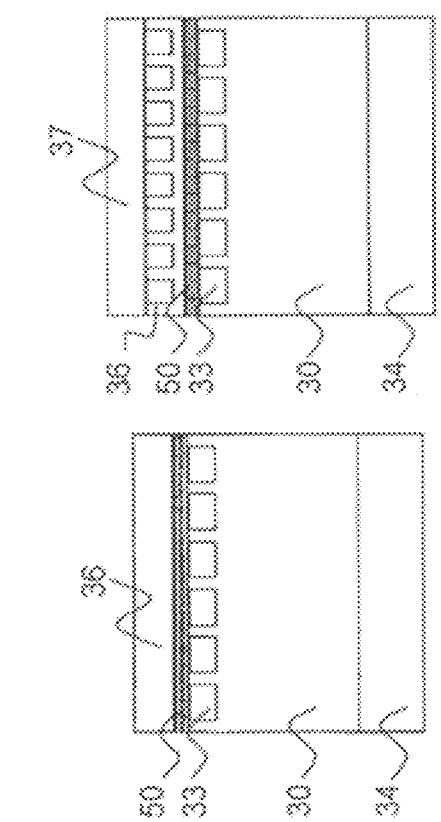
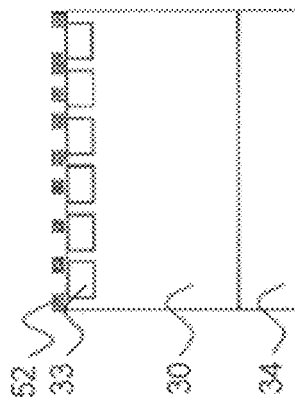
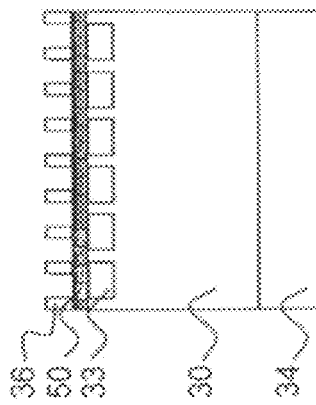

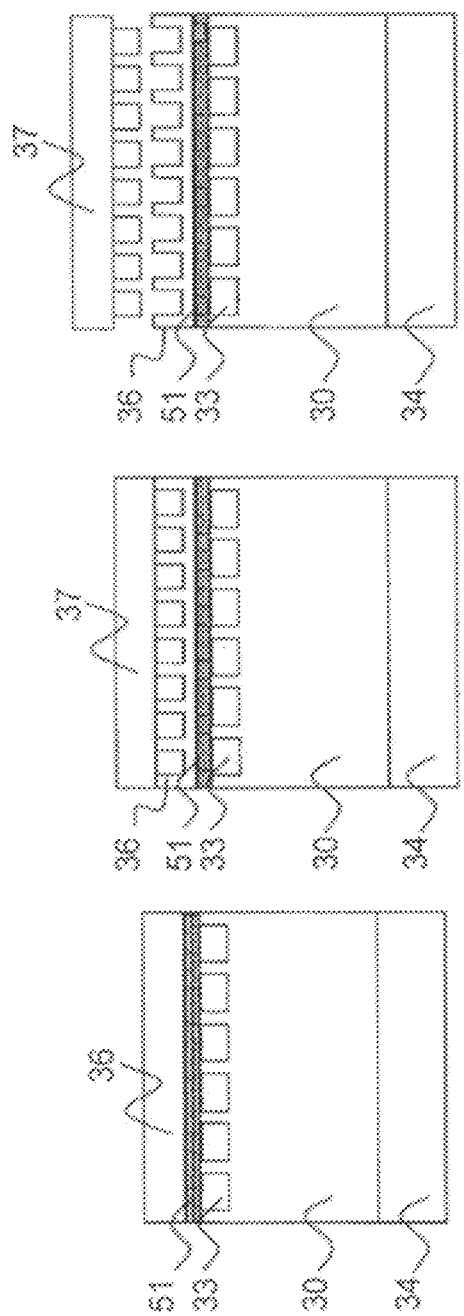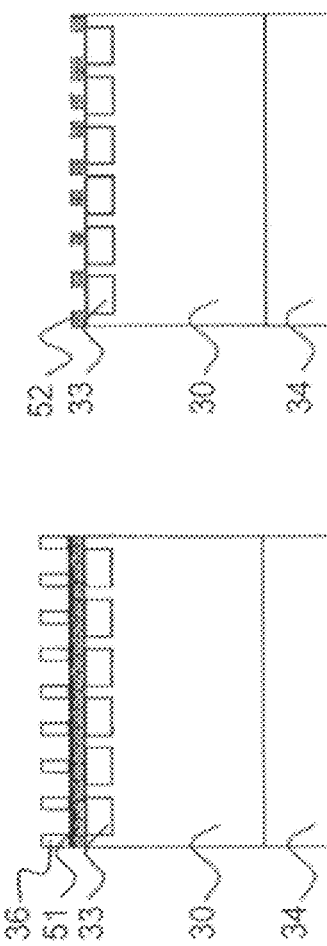

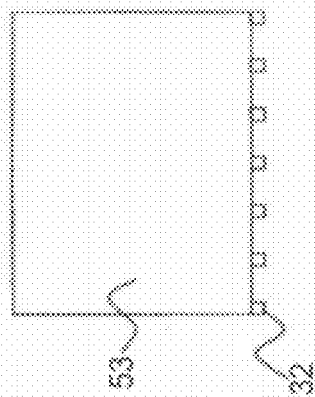
FIG. 41A
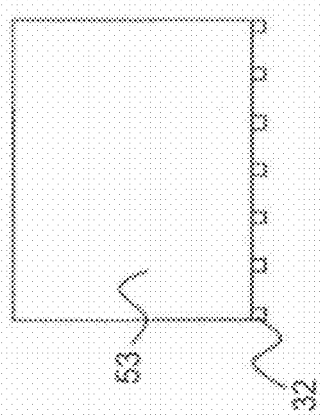
FIG. 41B
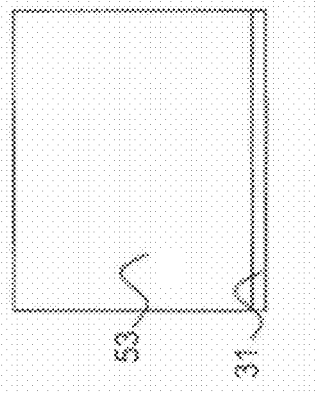
FIG. 41C
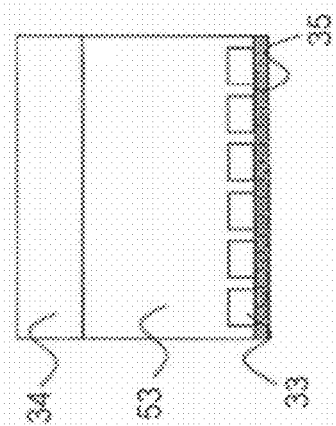
FIG. 41D
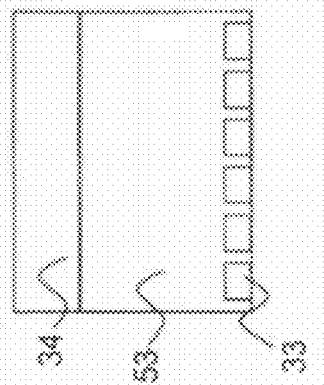
FIG. 41E
FIG. 41F

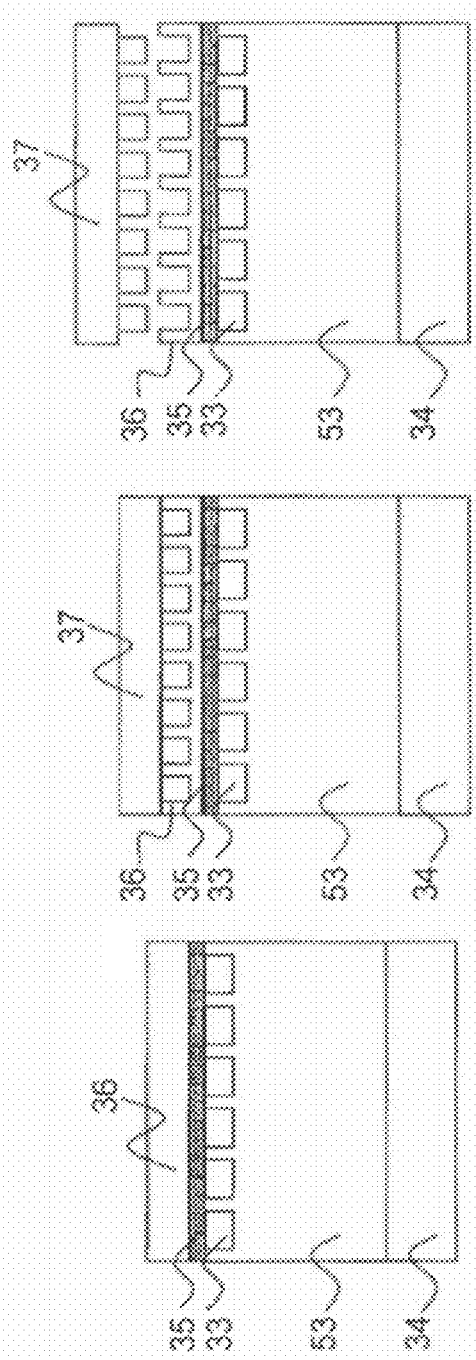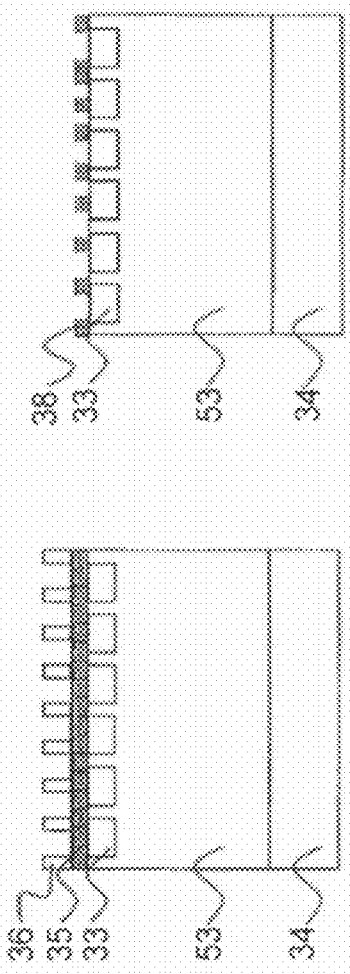

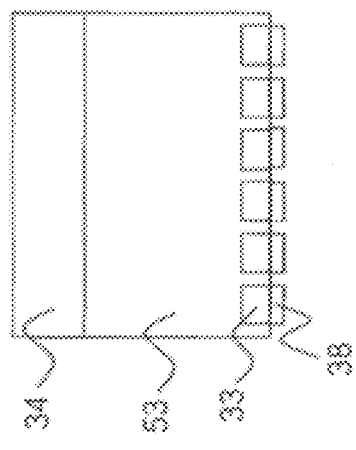
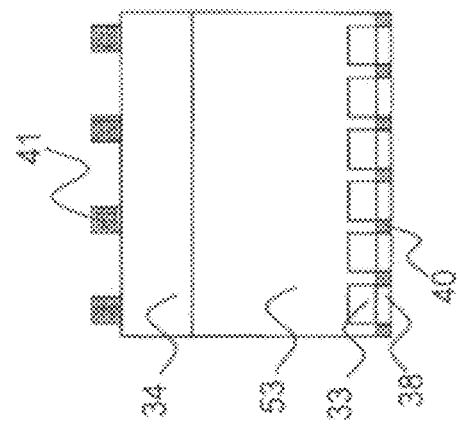
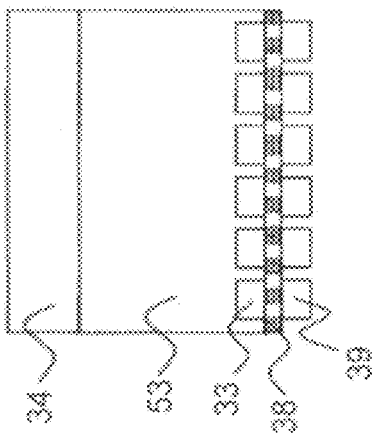
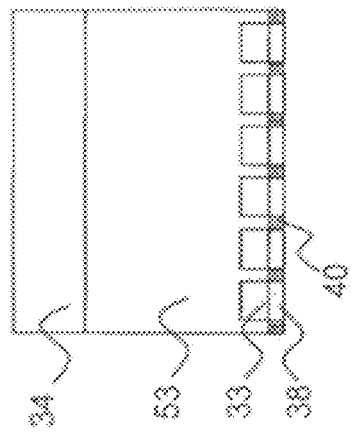

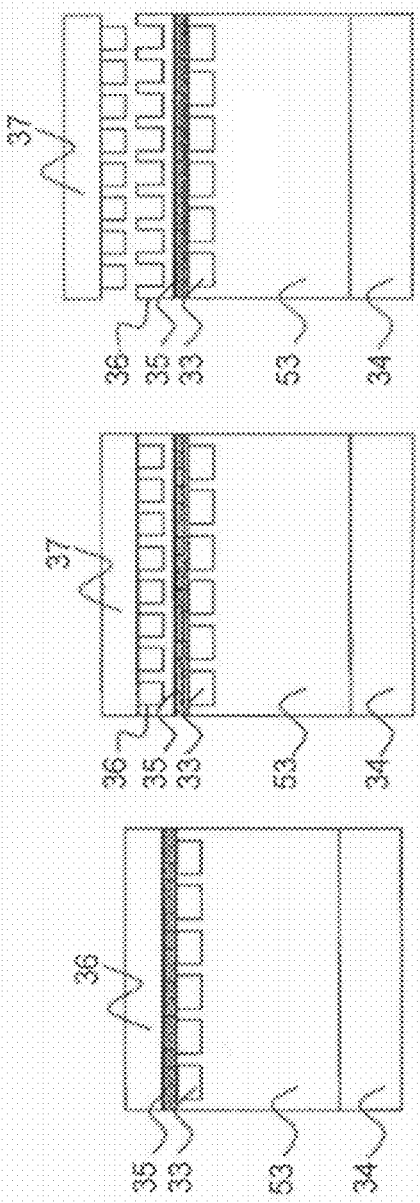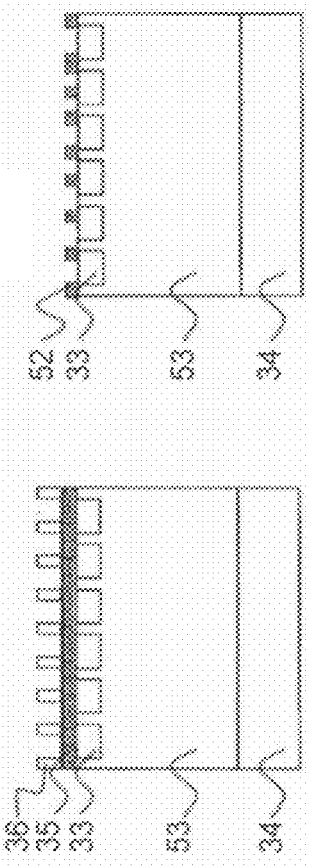

PHOTOELECTRIC CONVERSION ELEMENT

CROSS REFERENCE TO RELATED APPLICATION

This application is based upon and claims the benefit of priority from both the prior Japanese Patent Application No. 2011-069149, filed on Mar. 28, 2011, and the prior Japanese Patent Application No. 2011-218681, filed on Sep. 30, 2011, the entire contents of which are incorporated herein by reference.

FIELD

Embodiments basically relate to a photoelectric conversion element.

BACKGROUND

A general photoelectric conversion element using a semiconductor can not sufficiently absorb a solar spectrum as a result of an absorption wavelength band to be determined by a band gap of the semiconductor. A Si single-crystal solar cell, for example, can only absorb light of 300 to 1100 nm to provide power generation efficiency of about 20% or less. Accordingly, in order to enhance the power generation efficiency of a general photoelectric conversion element, it is necessary to introduce an absorption region into a photoelectric conversion layer to absorb long-wavelength light which the photoelectric conversion layer can not absorb intrinsically.

In addition, a method to increase carrier excitation has been proposed in order to provide an efficient photoelectric conversion element. The method generates enhanced electric fields due to plasmon resonance in a metal nanostructure.

BRIEF DESCRIPTION OF THE DRAWINGS

Aspects of this disclosure will become apparent upon reading the following detailed description and upon reference to accompanying drawings.

FIG. 5 is a graph showing a solar spectrum of the photoelectric conversion element in accordance with the embodiment.

FIGS. 6A and 6B are schematic diagrams showing a structure of a background photoelectric conversion element.

FIGS. 9A and 9B are schematic diagrams showing movement of free electrons in case that a metal nanostructure is irradiated with light.

FIGS. 14A to 14F are sectional views showing manufacturing steps of a photoelectric conversion element in accordance with the embodiment.

FIGS. 15A to 15E are sectional views showing the manufacturing method of the photoelectric conversion element in accordance with the embodiment.

FIGS. 16A to 16D are sectional views showing the manufacturing method of the photoelectric conversion element in accordance with the embodiment.

FIGS. 17A to 17F are sectional views showing a manufacturing method of a photoelectric conversion element according to an example 2.

FIGS. 20A to 20F are sectional views showing a manufacturing method of a photoelectric conversion element according to an example 3.

FIGS. 21A to 21E are sectional views showing the manufacturing method of the photoelectric conversion element according to the example 3.

FIGS. 22A to 22D are sectional views showing the manufacturing method of the photoelectric conversion element according to the example 3.

FIGS. 24A to 24E are sectional views showing the manufacturing method of the photoelectric conversion element according to the example 4.

FIGS. 32A to 32F are sectional views showing a manufacturing method of a photoelectric conversion element according to an example 8.

FIGS. 33A to 33E are sectional views showing the manufacturing method of the photoelectric conversion element according to the example 8.

FIGS. 36A to 36E are sectional views showing the manufacturing method of the photoelectric conversion element according to the example 9.

FIGS. 39A to 39E are sectional views showing the manufacturing method of the photoelectric conversion element according to the example 10.

FIGS. 41A to 41F are sectional views showing a manufacturing method of a photoelectric conversion element according to an example 11.

FIGS. 42A to 42E are sectional views showing the manufacturing method of the photoelectric conversion element according to the example 11.

FIGS. 43A to 43D are sectional views showing the manufacturing method of the photoelectric conversion element according to the example 11.

FIGS. 45A to 45E are sectional views showing the manufacturing method of the photoelectric conversion element according to the example 12.

DESCRIPTION

Figure 1:
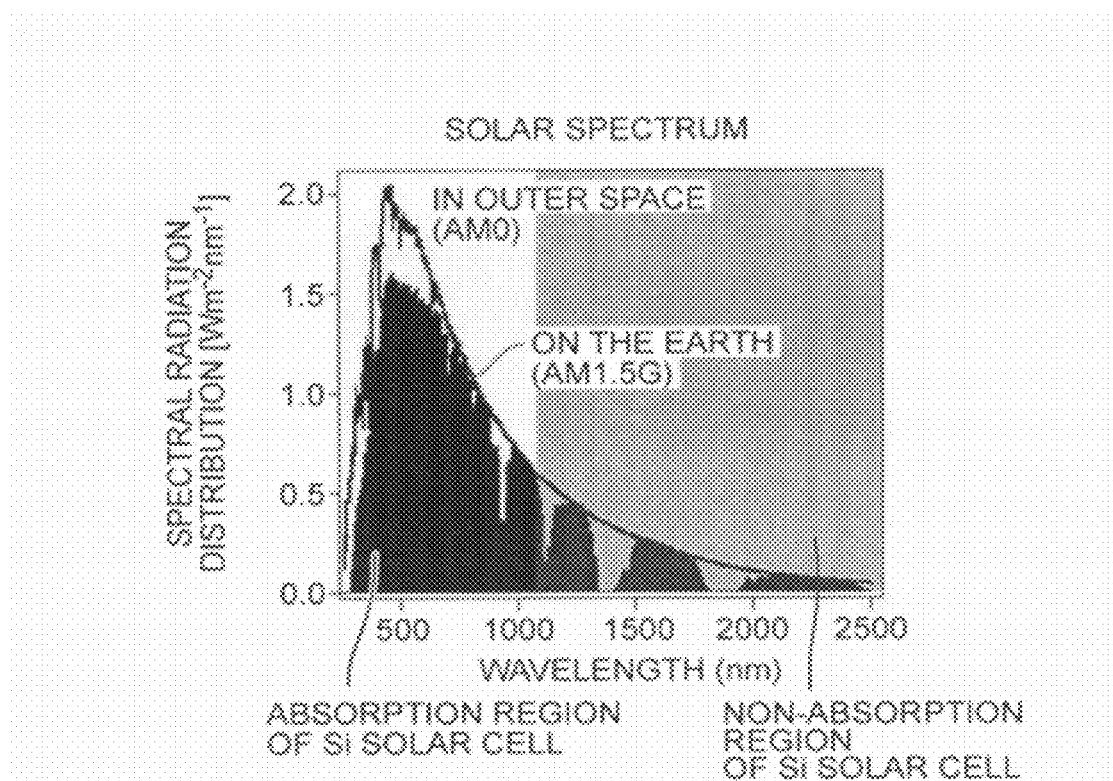
FIG. 1 is a graph showing a solar spectrum (AM 1.5) of a background photoelectric conversion element.

As will be described below, according to an embodiment, a photoelectric conversion element includes a photoelectric conversion layer to include a first metal layer, a semiconductor layer, and a second metal layer, all of which are laminated. In addition, at least one of the first metal layer and the second metal layer is a nano-mesh metal having a plurality of through holes or a dot metal having a plurality of metal dots arranged separately from each other on the semiconductor layer. The photoelectric conversion layer includes a long-wavelength absorption layer containing an impurity which is different from impurities for p-type doping and n-type doping of the semiconductor layer. The long-wavelength absorption layer is within a depth of 5 nm from the nano-mesh metal or the dot metal.

Hereinafter, embodiments will be described with reference to the drawings.

A photoelectric conversion element according to an embodiment will be described with reference to the drawings. Wherever possible, the same reference numerals or marks will be used to denote the same or like portions throughout the figures.

Figure 2:
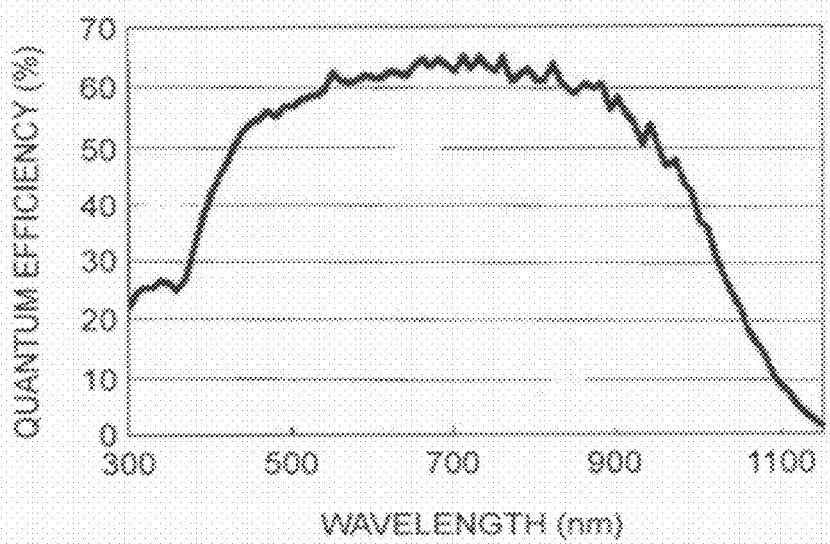
FIG. 2 is a graph showing spectrum sensitivity characteristic of a single-crystal Si solar cell of the background photoelectric conversion element.

To begin with, a principle of long wavelength absorption will be described with reference to FIGS. 1 and 2. The principle of long wavelength absorption is due to impurity level in a band gap of a photoelectric conversion layer of the photoelectric conversion element in accordance with the embodiment. FIG. 1 is a graph showing a solar spectrum (AM 1.5, Air Mass 1.5 as Solar Spectral Irradiance) of a background photoelectric conversion element. FIG. 2 is a graph showing a spectral sensitivity characteristic of a single-crystal Si solar cell in accordance with the background photoelectric conversion element. The horizontal and vertical axes of FIG. 1 denote a wavelength of the light and a spectral sensitivity characteristic, respectively. In addition, the horizontal and vertical axes of FIG. 2 denote a wavelength of the light and a quantum efficiency, respectively.

As shown in FIG. 1, the solar spectrum is based on blackbody radiation of the sun. Therefore, radiated light has a wide-range wavelength of 300 nm up to 2500 nm, i.e., a long wavelength.

On the other hand, as shown in FIG. 2, the light absorption spectrum of single-crystal Si is determined by the band gap of Si, i.e., 1.12 eV. It should be, therefore, noted that light can be absorbed only in a narrow range from 300 nm to 1100 nm. For this reason, a light absorption current can be generated only by a portion of the sunlight in the background photoelectric conversion element. As a result, the background photoelectric conversion element has a low power generation efficiency of 20%.

Here, it seems generally that a narrow-gap semiconductor, e.g., Ge is advantageous to use for a photoelectric conversion element in a longer wavelength range. However, the narrow gap expands a wavelength range of light to be absorbed while lowering an open voltage of the photoelectric conversion element, thereby leading to no increase in the power generation efficiency thereof. Actually, the power generation efficiency decreases as a result of the low open voltage.

Accordingly, it is necessary for a photoelectric conversion element to absorb light in a long-wavelength range while to keep a certain band gap (1 to 2 eV).

Consequently, the inventors found impurity levels formed in a band gap to absorb light of long wavelength. Specifically, light is absorbed by the impurity levels in the band gap to generate electrons and holes. If electrons (holes) are thermally exited to a conduction band (a valence band) at room temperature, the electrons (holes) can be taken out as a photocurrent.

Figures 3, 4:
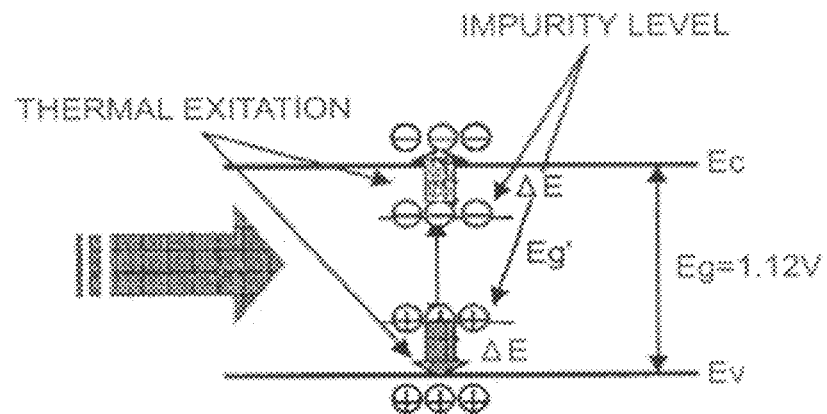
FIG. 3 is a schematic diagram showing a band gap level of a photoelectric conversion element according to an embodiment.
FIG. 4 is a table showing ΔE and a ratio of thermal excitation at room temperature of the photoelectric conversion element in accordance with the embodiment.

FIG. 3 is a schematic diagram showing a bad gap level of the photoelectric conversion element in accordance with the embodiment.

FIG. 3 shows that if a gap difference $\Delta E$ between an impurity level and a conduction band (valence band) is 0.1 eV, electrons (holes) are taken out to the conduction band (valence band) by thermal excitation, thereby allowing it to absorb the light. However, an impurity level having such a gap difference of 0.1 eV is not necessarily to be formed. Alternatively, the impurity level may be formed just to produce a gap difference between an impurity level and a conduction band (valence band), provided that the gap difference allows electrons (holes) to be excited from the impurity level to the conduction band (the valence band) and to be taken out.

FIG. 4 is a table showing $\Delta E$ and a thermal excitation ratio $\exp(\Delta E/RT)$ at room temperature for the photoelectric conversion element in accordance with the embodiment.

As shown in FIG. 4, a small ΔE increases a ratio of thermal excitation exp(ΔE/RT) from the impurity level to the conduction band (valence band), thereby allowing it to take out electrons (holes) as a photocurrent. On the other hand, a large ΔE decreases the ratio of thermal excitation, thereby making it difficult to take out electrons (holes) as a photocurrent. Accordingly, it is not preferable that ΔE is too large, but it is preferable that ΔE is smaller than 0.1 eV.

In addition, FIG. 5 is a graph showing a solar spectrum of the photoelectric conversion element in accordance with the embodiment.

FIG. 5 shows that a light absorption region extends to a long wavelength region by about 100 nm in the solar spectrum, provided that a band gap Eg of Si is 1.12 eV and ΔE is 0.1 eV.

Here, impurities for an impurity level of Si include S, In, Se, and S—O. Impurities for an impurity level in a compound semiconductor include Be, Cu, Li, Tl, Zn, Cd, O, Zn—O. However, in Si or in the compound semiconductor, the impurities are not limited only to the above-mentioned substances.

In addition, several combinations of dopants (Ga, Al, Mg, for example) for electrons and holes allow light to be absorbed in a range of the long wavelength not less than the band gap.

Figure 7A:
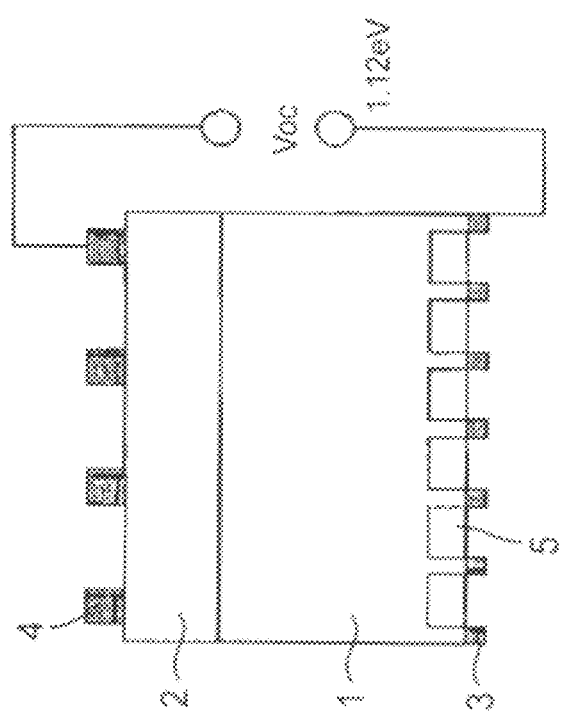
FIGS. 7A and 7B are schematic diagrams showing a structure of a photoelectric conversion element having a long-wavelength absorption layer in accordance with the embodiment.
Figure 7B:
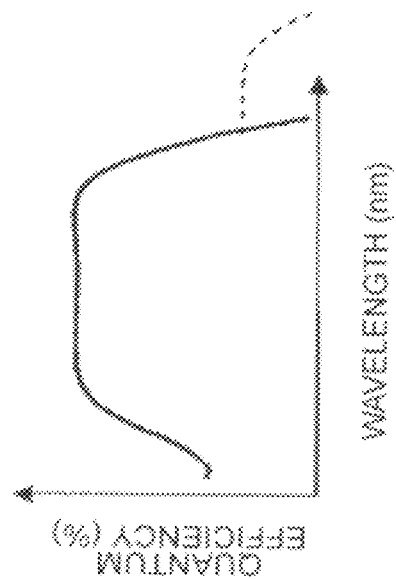

A structure of the photoelectric conversion element in accordance with the embodiment will be described with reference to FIGS. 6A to 7B. FIG. 6A is a schematic view showing a structure of a background photoelectric conversion element. FIG. 6B is a graph showing a relation between a wavelength of light and a quantum efficiency of the background photoelectric conversion element. FIG. 7A is a schematic view showing a structure of a photoelectric conversion element having a long-wavelength absorption layer in accordance with the embodiment. FIG. 7B is a graph showing a relation between a wavelength of light and a quantum efficiency in the structure of the photoelectric conversion element having the long-wavelength absorption layer in accordance with the embodiment.

As shown in FIG. 6A, an $n^+$ layer 2 is laminated on a p-type Si layer 1, and a front electrode 4 (a first metal layer) is provided to the surface of the $n^+$ layer 2 in the background photoelectric conversion element. In addition, a back electrode 3 is provided to the rear surface of the p-type Si layer 1. In the background photoelectric conversion element, when external light is incident on the p-type Si layer 1, electrons and holes are separated into the conduction band and the valence band in accordance with the levels in the band gap, and are taken out as a photocurrent to an external power source Voc.

FIG. 6B shows that a long wavelength of light decreases a quantum efficiency in the background photoelectric conversion element. Accordingly, the long wavelength of light decreases the quantum efficiency, thereby making it impossible to take out the photocurrent to the outside.

As shown in FIG. 7A, in the photoelectric conversion element having the long-wavelength absorption layer in accordance with the embodiment, the $n^+$ layer 2 is laminated on the p-type Si layer 1, and the front electrode 4 (a first metal layer) is provided to the $n^+$ layer 2 in the same way as in FIG. 6A. In addition, the back electrode 3 is provided to the rear surface of the p-type Si layer 1. Further, a long-wavelength absorption layer 5 is provided to the rear surface of the p-type Si layer 1 so as not to contact with the back electrode 3. The long-wavelength absorption layer 5 is doped with impurities from the rear surface of the p-type Si layer 1. Here, the photoelectric conversion element having the long-wavelength absorption layer 5 can provide a voltage of 1.12 eV corresponding to the band gap.

In this case, as shown in FIG. 7B, the photoelectric conversion element in accordance with the embodiment has the long-wavelength absorption layer 5 to absorb longer wavelength light than that shown in FIG. 6B. Therefore, an additional absorption region appears in the longer wavelength region (denoted by the dashed line in FIG. 7B).

However, the quantum efficiency of the absorption region is small in the longer wavelength region shown by the dashed line of FIG. 7B. This is understood as follows. A doping concentration in the long-wavelength absorption layer 5 ranges at most from $1 \times 10^{20}$ cm$^{-3}$ to $1 \times 10^{21}$ cm$^{-3}$. As a result, an absorption coefficient of light is large, whereas a light absorption amount per unit volume becomes small, thereby lowering the actual spectral sensitivity.

Accordingly, a method to increase an absorption amount of light per unit volume is needed for the photoelectric conversion element having the long-wavelength absorption layer in accordance with the embodiment.

The inventors have found the following structure of a photoelectric conversion element to assist an absorption amount of light. In the structure, an enhanced electric field is generated by plasmon resonance due to a metal nanostructure (a metal layer), thereby increasing carrier excitation. The carrier excitation generates the enhanced electric field of several to several hundred times a normal electric field within a depth of several 10 nm immediately below the metal nanostructure. The enhanced electric field assists a light absorption amount using the metal nanostructure having such an enhancing effect of electric field. The photoelectric conversion element having the aforementioned structure enables a remarkable increase in a light absorption amount of the long-wavelength absorption layer 5.

Figure 8B:
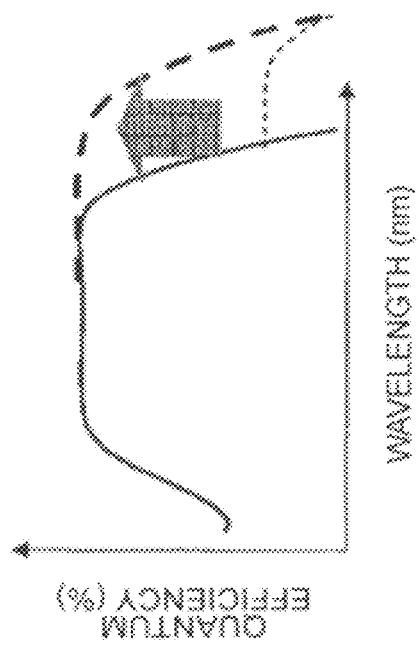
FIGS. 8A and 8B are schematic diagrams showing a structure of a photoelectric conversion element having the long-wavelength absorption layer and a nano-mesh electrode in accordance with the embodiment.
Figure 8A:
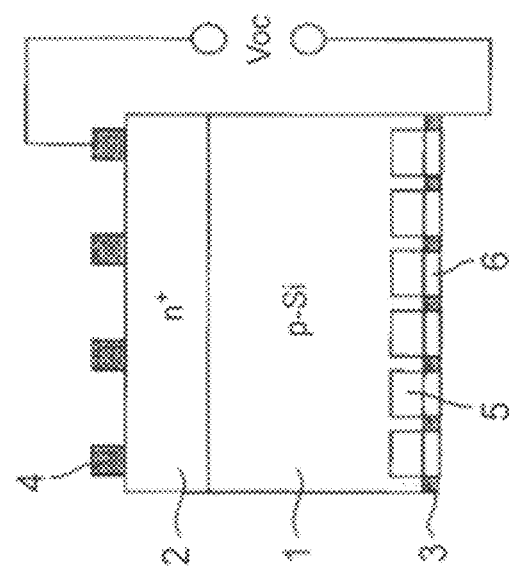

FIG. 8A is a schematic view showing a structure of a photoelectric conversion element having the long-wavelength absorption layer and a nano-mesh electrode in accordance with the embodiment. FIG. 8B is a graph showing a relation between a wavelength of light and a quantum efficiency of the photoelectric conversion element having the long-wavelength absorption layer and the nano-mesh electrode in accordance with the embodiment.

As shown in FIG. 8A, in the photoelectric conversion element having the long-wavelength absorption layer and the nano-mesh electrode in accordance with the embodiment, the $n^+$ layer 2 is laminated on the p-type Si layer 1, and the front electrode 4 (a first metal layer) is provided to the surface of the $n^+$ layer 2, in the same way as in FIG. 7A. In addition, the back electrode 3 is provided to the rear surface of the p-Si layer 1. In addition, the long-wavelength absorption layer 5 is provided to the rear surface of the p-type Si layer 1 so that the long-wavelength absorption layer 5 is not in contact with the back electrode 3. The long-wavelength absorption layer 5 is doped with impurities from the rear surface of the p-type Si layer 1. And a nano-mesh electrode 6 is provided between the back electrodes 3 so that the nano-mesh electrode 6 is in contact with the long-wavelength absorption layer 5. The nano-mesh electrode 6 forms a metal microstructure on the long-wavelength absorption layer 5.

Here, as shown in FIG. 8A, the photoelectric conversion element of the embodiment has the long-wavelength absorption layer 5 and the nano-mesh electrode 6 so that the long-wavelength absorption layer 5 is not in contact with the back electrode 3 in the same way as in FIG. 7A, thereby allowing it to acquire a voltage corresponding to the band gap of the long-wavelength absorption layer 5. The long-wavelength absorption layer 5 also adds an additional absorption region on the long wavelength side of FIG. 8B (dashed line in FIG. 8B). In addition, the long-wavelength absorption layer 5 has the nano-mesh electrode 6 thereon to increase a light absorption amount as a result of the enhancing effect of electric field. The increase in the light absorption amount enhances the quantum efficiency, as denoted by the dashed bold line in FIG. 8B.

In addition, when the long-wavelength absorption layer 5 is doped with excessively many impurities (over $1 \times 10^{22}$ $cm^{-3}$), the solid state properties (including a band gap) of the semiconductor itself, i.e., a base material, may change entirely. The excessively many impurities could prevent the formation of the long-wavelength absorption region (denoted by the dashed line in FIGS. 7B and 8B).

Further, intensity of the enhanced electric field generated by the nano-mesh electrode 6 is several to several hundred times the normal intensity thereof. In this case, a low doping amount of impurities in the long-wavelength absorption layer 5 reduces an absorption amount in the long wavelength region. Therefore, the absorption amount therein is preferably about $1 \times 10^{19}$ $cm^{-3}$.

In addition, it is necessary that the long-wavelength absorption layer 5 is provided in the vicinity of the nano-mesh electrode 6. This is because the enhanced electric field due to the nano-mesh electrode 6 is generated within a depth of several 10 nm immediately below the nano-mesh electrode 6 and the enhanced electric field peaks immediately below the nano-mesh electrode 6. Accordingly, the long-wavelength absorption layer 5 is arranged preferably within a depth of 5 nm from the nano-mesh electrode 6 in order for the long-wavelength absorption layer 5 to benefit from the enhanced electric field.

The range of the electric field enhancement due to the nano-mesh electrode 6 is in the range of several 10 nm immediately below the nano-mesh electrode 6 and peaks immediately below the nano-mesh electrode 6, thereby allowing the long-wavelength absorption layer 5 with a thickness of 10 nm to benefit from the electric field enhancement.

In addition, the long-wavelength absorption layer 5 is doped with impurities to allow a high concentration of about $1 \times 10^{19}$ $cm^{-3}$ at most at a depth of about 1000 nm from the surface thereof. However, the electric field enhancement is in the range of several 10 nm immediately below the nano-mesh electrode 6. Therefore, 1000 nm is a sufficient thickness for the long-wavelength absorption layer 5.

As described above, the photoelectric conversion element shown in FIG. 8A in accordance with the embodiment is provided with the long-wavelength absorption layer 5 and the nano-mesh electrode 6, thereby providing higher power generation efficiency thereof than that of the background photoelectric conversion element.

Next, a principle to generate an enhanced electric field with plasmon resonance due to a metal nanostructure will be described with reference to FIGS. 9A and 9B. FIGS. 9A and 9B are schematic views showing movement of free electrons and generation of a localized electric field, respectively, in a case that the metal nanostructure is irradiated with light.

FIG. 9A shows that a metal nanostructure 10 has a size comparable to the wavelength of light 12 or less and is irradiated with light 12. It is known that such a fine metal nanostructure 10 irradiated with light excites a surface plasmon therein. When the metal nanostructure 10 is irradiated with the light 12, free electrons 11 oscillate perpendicularly to the traveling direction of the light 12 in the metal nanostructure 10. At this time, a dense portion and a sparse portion are produced on the upper surface (on the side irradiated with the light 12) of the metal nanostructure 10 as a result of the oscillation of free electrons. The dense portion includes free electrons densely. The sparse portion includes free electrons sparsely.

As shown in FIG. 9B, a localized electric field 15 is excited in the vicinity of the metal nanostructure 10 to oscillate parallel to the traveling direction of the light 12. The localized electric field 15 to be excited at this time has intensity up to several hundred times the electric field generated by the light 12 to enhance the excitation of electron-hole pairs.

Figure 10B:
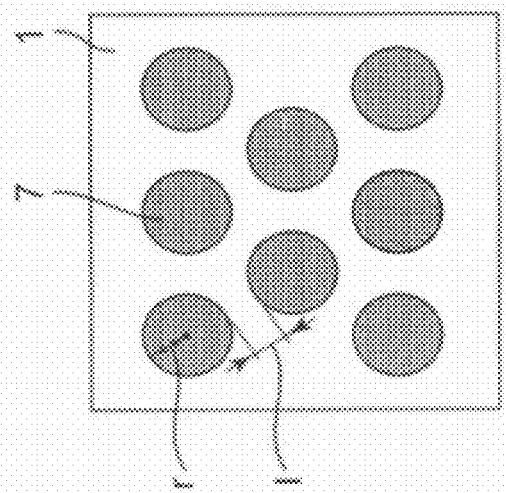
FIGS. 10A and 10B are perspective views of a nano-mesh electrode and dot metals.
Figure 10A:
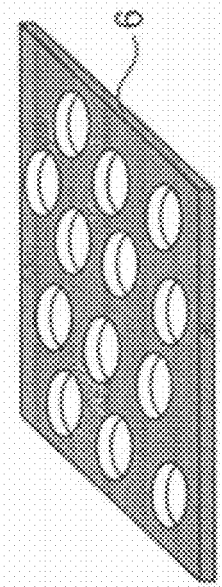

Here, the metal nanostructure including the nano-mesh electrode 6 and the dot metals 7 will be described with reference to FIGS. 10A and 10B. FIG. 10A is a perspective view showing the nano-mesh electrode 6. FIG. 10B is a perspective view showing the dot metals 7.

A porous film can be used as the metal nanostructure, e.g., the nano-mesh metal 6. In the porous film structure, two or more openings (through holes) are provided to a continuous metal film as shown in FIG. 10A. The openings have sizes comparable to the wavelength of incident light.

Or, in a porous film structure to be used as the metal nanostructure, two or more dot metals 7 are formed on a p-type Si layer 1 as shown in FIG. 10B. The metal dots have a diameter r comparable to the wavelength of incident light and are arranged at a regular distance 1.

Next, an aspect of a strong localized electric field to be excited by a metal nanostructure will be described with reference to FIGS. 11A and 11B.

Figure 11B:
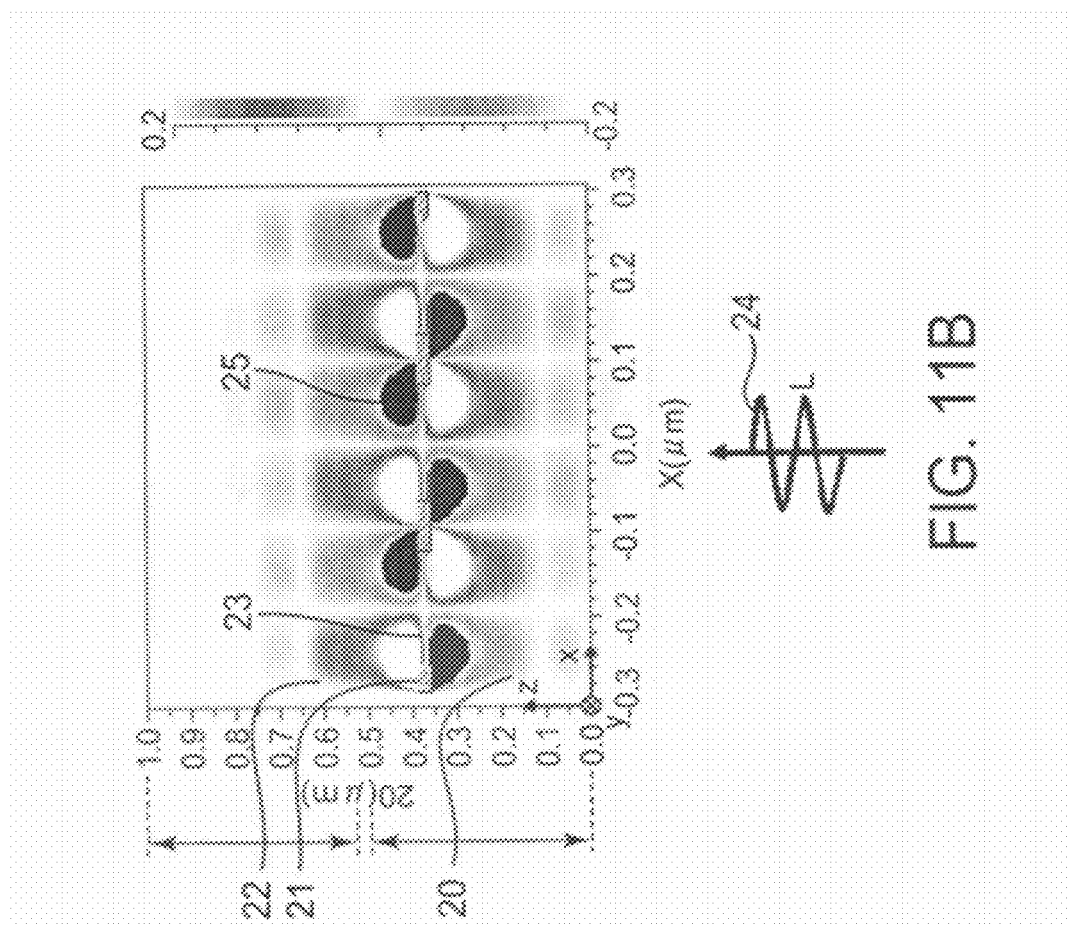
FIGS. 11A and 11B are schematic diagrams of a metal nanostructure.
Figure 11A:
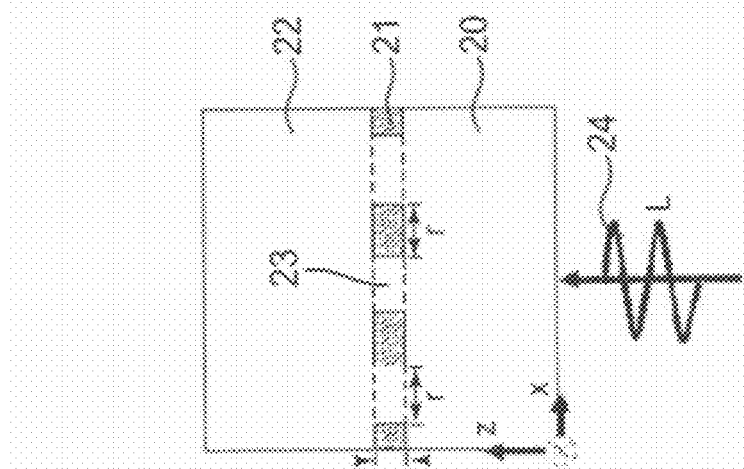

FIG. 11A is a schematic view of a metal nanostructure. FIG. 11B is a graph showing a simulation of the metal nanostructure with a Finite Difference Time Domain (FDTD) method.

As shown in FIG. 11A, a structure of Si 20/Al (aluminum) 21/air 22 is formed, provided that the thickness of the Al 21 is 30 nm and openings 23 (through holes) are prepared in the Al 21. The openings 23 of the Al 21 have a diameter r of 100 nm and a pitch l of 200 nm.

FIG. 11B is a view showing a simulation of an electric field intensity by the Finite Difference Time Domain (FDTD) method when incident light 24 (A=1000 nm, traveling direction) is incident on the structure of FIG. 11A. The simulation reveals that electric fields are enhanced in the vicinity of end portions of the Al 21, thereby generating localized electric fields 25.

Figure 12:
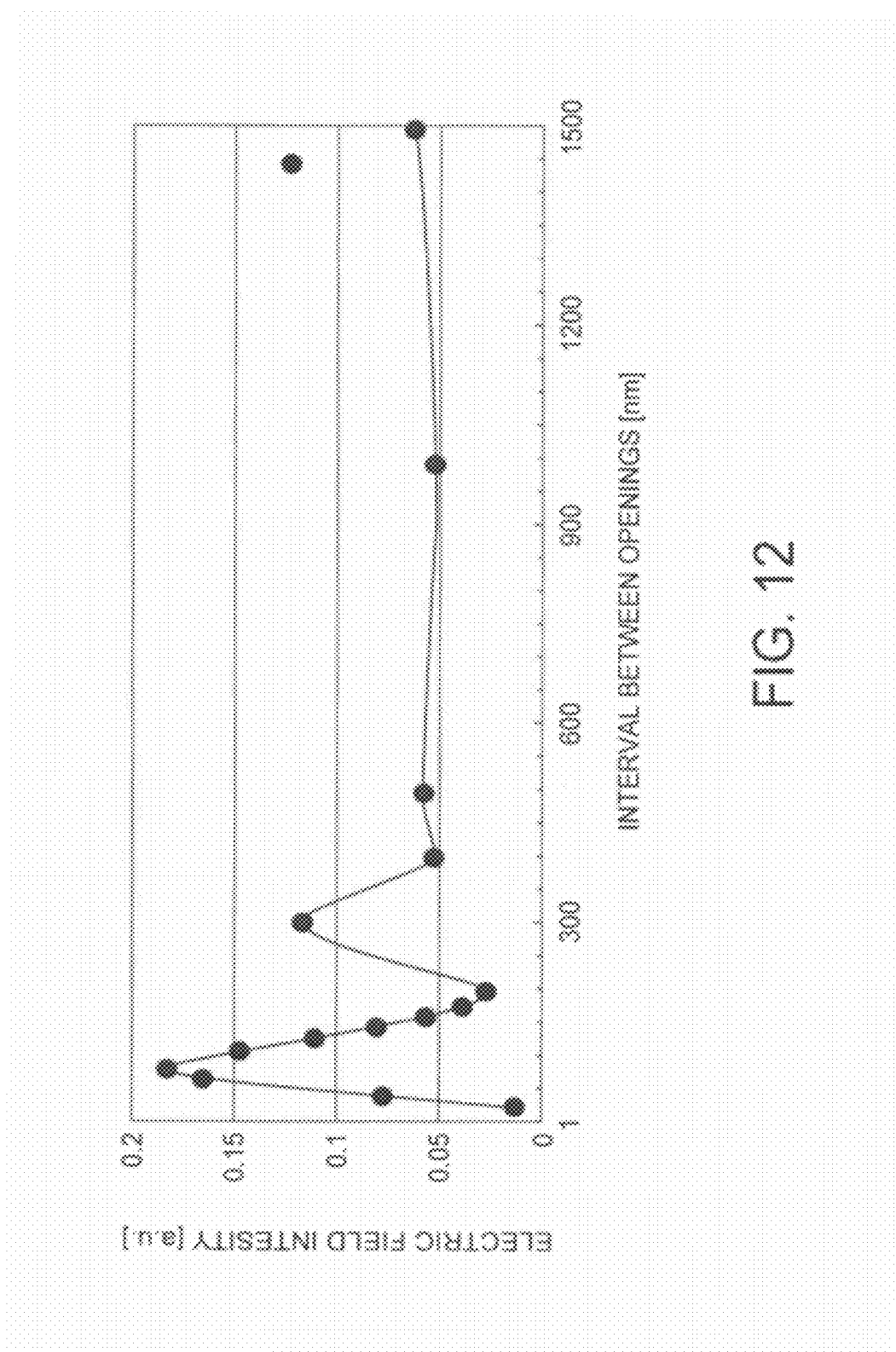
FIG. 12 is a graph showing the relation between an interval of a nano-mesh electrode and electric field enhancement.

In addition, a relation between opening intervals of the nano-mesh electrodes 6, i.e., the metal nanostructure, and electric filed enhancement will be described with reference to FIG. 12. FIG. 12 is a graph showing the relation between the opening intervals of the nano-mesh electrodes 6 and electric field enhancement. The vertical and horizontal axes denote electric field intensity and the opening intervals of the nano-mesh electrodes 6, respectively.

As shown in FIG. 12, in a region where the wavelength of light is not less than about 1000 nm, the pitch l of the openings (through holes) 23 may be not more than 1 μm in order for the end portions of the Al 21 to generate the electric field enhancement. When the pitch l is converted to an area per opening 23, the area may be not more than 0.8 $μm^2$. In addition, the pitch l of the openings 23 may be about several 10 nm from the working accuracy of the pitch l of the openings 23. When converted to an area per opening 23, the area may be not less than 80 $nm^2$.

In addition, the above-described simulation reveals the followings. When the film thickness of the Al 21 is not less than 2 nm, the electric field enhancement can be sufficiently generated. In addition, when the film thickness of the Al 21 is thicker than 200 nm, the electric field enhancement is saturated.

Figure 13:
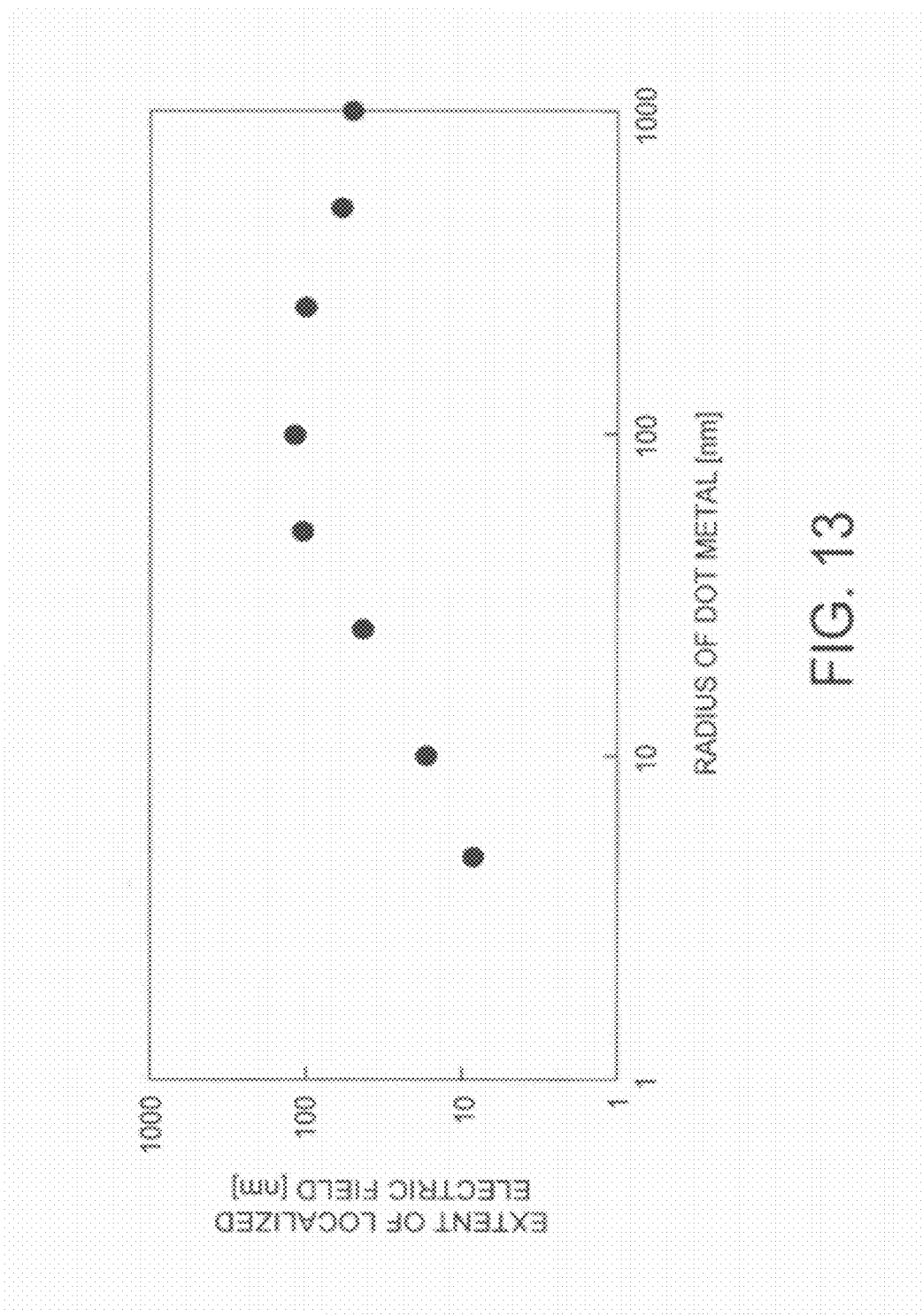
FIG. 13 is a graph showing the relation between a radius of a dot metal and a spread of a localized electric field.

Further, a simulation has been performed on the dot metals 7, i.e., the metal nanostructure, in the same way as on the nano-mesh electrode 6. FIG. 13 is a graph showing a relation between a radius of the dot metals 7 and an extent of the localized electric field. The vertical and horizontal axes denote the extent of the localized electric field immediately below the dot metals 7 and the radius of the dot metals 7, respectively.

As shown in FIG. 13, the dot metals 7 range from 1 nm to 1000 nm in radius. When the dot metal 7 is assumed to be a sphere, this range corresponds to the dot metals 7 having volumes of not less than 4 nm$^3$ and not more than 0.52 µm$^3$. The dot metals having such volumes can generate a high electric-field enhancing effect.

The following has been clarified. When the electric field enhancement is being generated in the range of 1000 nm or more, electric energy moves to an excessively narrow space between the dot metals 7, thereby reducing the electric-field enhancing effect.

As shown in FIG. 13, the small-sized dot metals 7 confines an extent of the localized electric field to about a half of the size thereof. Specifically, the dot metal 7 with a radius of 1 nm (4 nm$^3$ in volume) provides the localized electric field with an extent of 1 nm (approximately equal to the radius). However, the large-sized dot metal 7 does not necessarily provide the localized electric field with a large extent. The dot metal 7 with a radius larger than a certain length can provide the localized electric field just with an extent of 100 nm or less. Specifically, the dot metal 7 with a radius of 10 nm or more (volume is 4×10$^{-3}$ µm$^3$) provides the localized electric field with an extent of about 100 nm or less.

Accordingly, when a dot metal has a volume of less than 4×10$^{-3}$ µm$^3$ and a distance between two dot metals 7 adjacent to each other is 1 nm or more, no energy transfer occurs between the two dot metals 7.

When a dot metal has a volume of more than 4×10$^{-3}$ µm$^3$ and a distance between two dot metals 7 adjacent to each other is 100 nm or more, no energy transfer occurs between the two dot metals 7.

However, when the distance between two dot metals 7 is too long, an occupation ratio of the dot metals 7 decreases to weaken the electric field enhancement, thereby leading to a preferable distance of not more than 1 µm between the two dot metals 7 adjacent to each other.

Next, the behavior of carriers generated from the long-wavelength absorption layer 5 will be described below.

As shown in FIG. 7A, the carriers, i.e., electrons generated from the long-wavelength absorption layer 5 diffuse through the p-type layer (p-type Si substrate) and are needed to reach a depletion layer (not shown) near the n$^+$ layer 2 on the surface of the p-type Si layer 1. Therefore, it is necessary that a life time of the carriers is very long or the p-type Si layer 1 is made to be thin.

Thinning the p-type Si layer 1 probably causes a reduction in quantum efficiency at an absorption wavelength of Si to bring about undesirable results. When carriers have intrinsically a long life time, the carriers, i.e., electrons generated diffuse fully through the p-type Si layer 1 and can reach the depletion layer near the n$^+$ layer 2 on the surface of the p-type Si layer 1. Therefore, such a long life time of the carriers can maintain the quantum efficiency.

In the contrast, some difficulties such as a short life time of carriers prevents the carriers from diffusing fully through the p-type Si layer 1 to reach the depletion layer near the n$^+$ layer 2 on the surface of the p-type Si layer 1, thereby causing a risk of the reduction in the quantum efficiency. Accordingly, a preferable embodiment employs an n-type layer having a polar character opposite to that of the p-type Si layer 1 as the long-wavelength absorption layer 5.

Such a configuration forms a p-n junction to generate a built-in potential between the n-type long-wavelength absorption layer 5 and the p-type Si layer 1. Minority carriers, i.e., holes are generated in the long-wavelength absorption layer 5 being an n-type layer. When the holes reach a depletion layer at the p-n junction including the n-type long-wavelength absorption layer 5 and the p-type Si layer 1, the built-in potential sweeps the holes into the p-type Si layer 1 (substrate).

The long-wavelength absorption layer 5, i.e., the n-type layer is as thin as several micrometers or less, thereby allowing holes to reach the back electrode easily. Therefore, it is not necessary to thin the substrate or to care the life time of carriers. This enables it to efficiently take out photocurrent generated in the long-wavelength absorption layer 5.

Elements including P, Sb, B can be employed to make the long-wavelength absorption layer 5 an n-type layer having a polar character opposite to that of an photoelectric conversion layer, i.e., the p-type Si layer 1.

An exemplary manufacturing method of a photoelectric conversion element in accordance with the embodiment will be described with reference to FIGS. 14A to 16D. FIGS. 14A to 16D are sectional views showing manufacturing steps of a photoelectric conversion element in accordance with the embodiment.

In addition, in order to form a metal electrode pattern with openings of not more than 200 to 300 nm, it is necessary to use a latest exposure system and an EB lithography system both being used to manufacture semiconductor integrated circuits. However, using the leading-edge exposure system and EB lithography system does not enable a large area and cost reducing. Nanoimprint is one of the promising methods for enabling the large area and cost reducing. A producing method of a nano-mesh metal (a metal thin film) will be described.

As shown in FIG. 14A, a p-type Si single-crystal substrate 30 having a doping concentration of 1×10$^{16}$ cm$^{-3}$ was prepared as a substrate, and then a SiO$_2$ film 31 having a thickness of 150 nm was formed by thermally oxidizing the surface of the p-type Si single-crystal substrate 30.

As shown in FIG. 14B, the SiO$_2$ film 31 is patterned in a lattice shape with a width of 100 µm and a 1 mm-pitch using a photolithography method.

Further, as shown in FIG. 14C, S (Sulfur) ions are implanted to form a long-wavelength absorption layer 33 using a SiO$_2$ mask 32 as a mask.

As shown in FIG. 14D, the SiO$_2$ mask 32 is removed, and then activation annealing for implanted S is conducted to form the long-wavelength absorption layer 33. The long-wavelength absorption layer 33 is doped with S within 100 nm from the Si surface by a concentration of 1×10$^{20}$ cm$^{-3}$.

As shown in FIG. 14E, P (Phosphorus) ions are implanted on the opposite side which has been doped with S. After the ion implantation of P ions, activation annealing is conducted, thereby providing an n$^+$ layer 34 with a concentration of 1×10$^{20}$ cm$^{-3}$ within 200 nm from the Si surface.

As shown in FIG. 14F, an Ag layer with a thickness of 30 nm is formed on the side which has been doped with S using a deposition method, thereby providing an Ag layer 35.

In addition, as shown in FIG. 15A, a resist 36 is formed on the Ag layer 35 formed on the rear surface of the p-type Si single-crystal substrate 30.

As shown in FIG. 15B, imprint was conducted as follows. A quartz stamper 37 was pressed to the resist 36 with heating the p-type Si single crystal substrate 30 so that the surface of the quartz stamper 37 having convex shapes was in contact with the resist 36. The quartz stamper 37 is provided with the convex shapes of which size is 200 nm (the shapes are formed to have an area of 9 cm$^2$).

As shown in FIG. 15C, after the imprinting, the p-type Si single-crystal substrate 30 is cooled and the quartz stamper 37 is subsequently released. As a result, concave shapes with a size of 200 nm are formed on the resist 36.

In addition, as shown in FIG. 15D, the resist 36 having the concave shapes is etched by reactive ion etching (RIE) of CF4, thereby exposing the bottom of the resist 36.

As shown in FIG. 15E, after exposing the bottom of the resist 36, the Ag layer 35 is etched by ion milling. After etching the Ag layer 35, the resist 36 left thereafter is removed, thereby forming a nano-mesh metal 38 (metal thin film) having openings (through holes) in the Ag layer 35.

As shown in FIG. 16A, a resist 39 is applied on the nano-mesh metal 38 (metal thin film) and the p-type Si single-crystal substrate 30. A portion which is not doped with S, i.e., the long-wavelength absorption layer 33, is exposed and developed with a photolithography method, thereby forming a resist pattern.

As shown in FIG. 16B, the nano-mesh metal 38 (metal thin film) is etched by ion milling using the resist pattern as a mask, thereby removing the nano-mesh metal 38 (metal thin film). Then, the resist left after the etching is removed. Consequently, any portion of the nano-mesh electrode 38 other than the portion thereof just on the long-wavelength absorption layer 33 is removed.

In addition, as shown in FIG. 16C, a back electrode 40 is formed on the portion where the nano-mesh metal 38 (metal thin film) has been removed by a liftoff process.

Finally, as shown in FIG. 16D, a comb electrode 41 (a first metal layer) is formed on the n$^+$ layer 34, thereby completing the photoelectric conversion element.

As described above, the photoelectric conversion element based on a Si single-crystal substrate has been described. In addition to the photoelectric conversion element based thereon, another photoelectric conversion element can be formed on the basis of a polycrystalline substrate, an amorphous Si substrate, or a compound semiconductor substrate, which has the long-wavelength absorption layer 33 and the nano-mesh metal 38 (metal thin film) formed on the long-wavelength absorption layer 33, using a method similar to the above-described method. In addition, material examples of the compound semiconductor substrate include GaAs, CdTe, and CIS (chalcopyrite compound semiconductor made from CuInSe$_2$) systems.

EXAMPLES

The photoelectric conversion element in accordance with the embodiment will be described in more detail with examples. Photoelectric conversion elements are formed with a size of 9 cm$^2$ to be evaluated for their characteristics. In addition, in the examples below, a manufacturing method of a nano-mesh metal and dot metals is described with respect to nanoimprint, but other methods (self-organization, for example) also enable to manufacture the nano-mesh metal and the dot metals.

Outlines of examples 1 to 17 will be listed in TABLE 1.

TABLE 1

| | P-type substrate | doping material for long-wavelength absorption layer | material of electrode | structure of electrode | photo-electric conversion efficiency |
|---|---|---|---|---|---|
| Example 1 | single-crystal Si | S | Ag | nano-mesh electrode | 12% |
| Example 2 | single-crystal Si | S | Au | nano-mesh electrode | 11.8% |
| Example 3 | single-crystal Si | S, O | Cu | nano-mesh electrode | 12.5% |
| Example 4 | single-crystal Si | Se | Ag | nano-mesh electrode | 13% |
| Example 5 | single-crystal Si | In | Au | nano-mesh electrode | 11.5% |
| Example 6 | single-crystal Si | Mg, Ga | Cu | nano-mesh electrode | 11.5% |
| Example 7 | single-crystal Si (thin) | S | Ag | nano-mesh electrode | 13.6% |
| Example 8 | single-crystal Si | S | Ag | dot metals | 11% |
| Example 9 | single-crystal Si | Se | Au | dot metals | 11.2% |
| Example 10 | single-crystal Si | In | Cu | dot metals | 11.2% |
| Example 11 | poly-crystal Si | S | Ag | nano-mesh electrode | 10.5% |
| Example 12 | poly-crystal Si | S | Ag | dot metals | 9.5% |
| Example 13 | single-crystal Si | S, P | Ag | nano-mesh electrode | 13.5% |
| Example 14 | single-crystal Si | S, O, P | Cu | nano-mesh electrode | 14% |
| Example 15 | single-crystal Si | Mg, Ga, P | Cu | nano-mesh electrode | 13% |
| Example 16 | single-crystal Si | Se, P | Au | dot metals | 13% |
| Example 17 | poly-crystal Si | S, P | Ag | nano-mesh electrode | 12% |

Here, the example 14 shows the highest photoelectric conversion efficiency, i.e., 14%, providing the best result in the examples 1 to 17.

Example 1

Single-Crystal Si, S, Ag, Nano-Mesh Electrode

A manufacturing method of a photoelectric conversion element in accordance with an example 1 will be described with reference to FIGS. 14A to 16D. FIGS. 14A to 16D are sectional views showing manufacturing steps of the photoelectric conversion element in accordance with the embodiment.

As shown in FIG. 14A, a p-type Si single-crystal substrate 30 was prepared as a substrate having a thickness of 500 μm and a doping concentration of $1 \times 10^{16}$ cm$^3$. A SiO$_2$ film 31 with a thickness of 150 nm was formed on the p-type Si single-crystal substrate 30 by thermal oxidation.

As shown in FIG. 14B, after a resist (THMR IP3250, TOKYO OHKA KOGYO Co., Ltd.) solution was applied on the SiO$_2$ film 31 at 2000 rpm for 30 sec by spin coating, the applied resist was heated on a hot plate at 110° C. for 90 sec to evaporate the solvent. The film thickness of the resist was him. Then, the resist was patterned in a lattice shape with a width of 100 μm and an interval of 1 mm with a photolithography method using a lattice-shaped mask with a width of 100 μm and an interval of 1 mm. Using the resist as a mask, the SiO$_2$ film 31 was etched for 10 min under conditions of 30 sccm CF$_4$, 10 mTorr pressure, and 100 W RF power. After the CF$_4$ RIE, the resist left after the etching was removed with an organic solvent, thereby forming a lattice-shaped SiO$_2$ mask 32 with a width of 100 μm and an interval of 1 mm.

Further, as shown in FIG. 14C, using the SiO$_2$ mask 32 as a mask, S ions were implanted under the condition of 20 keV implantation energy and a dose amount of $1\times10^{15}$ cm$^{-2}$.

As shown in FIG. 14D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1\times10^{20}$ cm$^{-3}$ was obtained within 100 nm from the Si surface.

As shown in FIG. 14E, P was ion implanted on the opposite side which has been doped with S under conditions of 20 keV implantation energy and a dose amount of $5\times10^{15}$ cm$^{-2}$. After the ion implantation, activation annealing was performed at 800° C. for 30 min, thereby providing the n$^+$ layer 34 with a concentration of $1\times10^{20}$ cm$^{-3}$ within a depth of 200 nm from the Si surface.

As shown in FIG. 14F, the Ag layer 35 with a thickness of 30 nm was formed on the side which had been doped with S using an evaporation method.

In addition, as shown in FIG. 15A, a resist (THMR IP3250, TOKYO OHKA KOGYO Co., Ltd.) was diluted with ethyl lactate (EL) by 1:2 to provide a resist solution. The solution was applied on the Ag layer 35 formed on the rear surface of the p-type Si single-crystal substrate 30 by spin coating. The applied resist was heated on a hot plate at 110° C. for 90 sec to evaporate the solvent.

As shown in FIG. 15B, imprinting was conducted so that a quartz stamper 37 was pressed to the resist 36 at a pressure of 10 MPa with heating the p-type Si single-crystal substrate 30 having the resist 36 thereon. The quartz stamper 37 was provided with convex shapes of which size, pitch, and height were 100 nm, 200 nm, and 150 nm, respectively. When the quartz stamper 37 was pressed, the surface thereof having the convex shapes was in contact with the resist 36.

As shown in FIG. 15C, after the imprinting, the p-type Si single-crystal substrate 30 was cooled and the quartz stamper 37 was subsequently released. As a result, concave shapes were formed on the resist 36 to have a size of 100 nm, a pitch of 200 nm, and a depth of 100 nm.

As shown in FIG. 15D, the resist 36 having the concave shapes was etched for 30 sec by reactive ion etching (RIE) of CF4 under conditions of 30 sccm CF4, mTorr pressure, and 100 W RF power, thereby exposing the bottom of the resist 36 to expose the Ag layer 35.

As shown in FIG. 15E, the Ag layer 35 was etched by ion milling for 80 sec under conditions of an acceleration voltage of 500V and an ion current of 40 mA to form the nano-mesh electrode 38 having the openings (through holes). A pattern with an opening size of 100 nm and an opening pitch of 200 nm was provided to the Ag layer 35 by the ion milling. Here, residues of the resist 36 were removed with an organic solvent.

As shown in FIG. 16A, after a resist (THMR IP3250, TOKYO OHKA KOGYO Co., Ltd.) solution was applied on the nano-mesh electrode 38 and the p-type Si layer 30 by spin coating at 2000 rpm for 30 sec, the applied resist was heated at 110° C. for 90 sec to evaporate the solvent. The film thickness of the resist 39 was 1 μm. The resist 39 was patterned in a lattice shape with a photolithography method using a lattice-shaped mask with a width of 100 μm and an interval of 1 mm. The lattice shape has a width of 100 μm and an interval of 1 mm. The patterning exposed the portion without S doping other than the long-wavelength absorption layer 33.

In addition, as shown in FIG. 16B, the nano-mesh metal electrode 38 was etched by ion milling using the resist pattern as a mask under conditions of an acceleration voltage of 500V and an ion current of 40 mA for 80 sec to remove the nano-mesh metal 38 (metal thin film). Then, residues of the resist 39 were removed. Consequently, the nano-mesh electrode 38 was removed except on the long-wavelength absorption layer 33.

As shown in FIG. 16C, the back electrode 40 was formed with a liftoff method on the portion where the nano-mesh metal 38 (metal thin film) had been removed.

Finally, as shown in FIG. 16D, the comb electrode 41 (the first metal layer) was formed on the n$^+$ layer 34 with a screen printing technique using Ag paste including an epoxy-based thermosetting resin, thereby completing the photoelectric conversion element having the long-wavelength absorption layer 33 and the nano-mesh electrode 38.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the S-doped long-wavelength absorption layer 33 and the nano-mesh electrode 38 showed an excellent value of 12%.

On the other hand, a background-art Si single-crystal photoelectric conversion element showed a photoelectric conversion efficiency of 10.0%. The background-art Si single-crystal photoelectric conversion element had neither the S-doped long-wavelength absorption layer 33 nor the nano-mesh electrode 38.

In addition, when a background-art Si single-crystal photoelectric conversion element was evaluated for the spectral sensitivity characteristic, light was absorbed in a range of up to about 1100 nm. However, the Si single-crystal photoelectric conversion element having the S-doped long-wavelength absorption layer 33 and the nano-mesh electrode 38 of the example 1 embodiment had a light-absorption spectrum also in the range of 1100 nm to 1500 nm, although the absorption intensity thereof is not so high.

The results revealed that the S-doped long-wavelength absorption layer 33 and the nano-mesh electrode 38 allowed the photoelectric conversion efficiency to increase in a long wavelength region of light as a result of the light absorption in a long wavelength region of light.

Example 2

Single-Crystal Si, S, Au, Nano-Mesh Electrode

A manufacturing method of a photoelectric conversion element in accordance with an example 2 will be described with reference to FIGS. 17A to 19D. FIGS. 17A to 19D are sectional views showing manufacturing steps of the photoelectric conversion element in accordance with the example 2.

As shown in FIG. 17A, as a substrate was prepared the p-type Si single-crystal substrate 30 having a thickness of 500 μm and a doping concentration of $1\times10^{16}$ cm$^{-3}$. Thermal oxidation of the surface of the p-type Si single-crystal substrate 30 formed the SiO$_2$ film 31 with a thickness of 150 nm.

As shown in FIG. 17B, after a resist (THMR IP3250, TOKYO OHKA KOGYO Co., Ltd.) solution was applied on the SiO$_2$ film 31 for 30 sec at 2000 rpm by spin coating, the applied resist was heated on a hot plate at 110° C. for 90 sec to evaporate the solvent. The film thickness of the resist was 1 μm. The resist was patterned in a lattice shape with a photolithography method using a lattice-shaped mask with a width of 100 μm and an interval of 1 mm. The lattice shape had a width of 100 μm and an interval of 1 mm. Using the resist as a mask, the SiO$_2$ film 31 was etched for 10 min under conditions of 30-sccm CF4, 10 mTorr pressure, and 100 W RF power. Subsequently, residues of the resist were removed with an organic solvent to form a lattice-shaped SiO$_2$ mask 32 with a width of 100 μm and an interval of 1 mm.

Furthermore, as shown in FIG. 17C, S ions were implanted under conditions of an implantation energy of 20 keV and a dose amount of $1\times10^{15}$ cm$^{-2}$ using the SiO$_2$ mask 32.

As shown in FIG. 17D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1\times10^{20}$ cm$^{-3}$ was obtained within a depth of 100 nm from the Si surface.

As shown in FIG. 17E, P ions were implanted under conditions of an implantation energy of 20 keV and a dose amount of $5\times10^{15}$ cm$^{-2}$ on the opposite side which had been doped with S. Subsequently to the ion implantation, activation annealing was performed at 800° C. for 30 min, thereby providing the n$^+$ layer 34 with a concentration of $1\times10^{20}$ cm$^{-3}$ within a depth of 200 nm from the Si surface.

As shown in FIG. 17F, an Au layer with a thickness of 30 nm was formed on the side which had been doped with S by an evaporation method, thereby forming an Au layer 50.

Figure 18C:
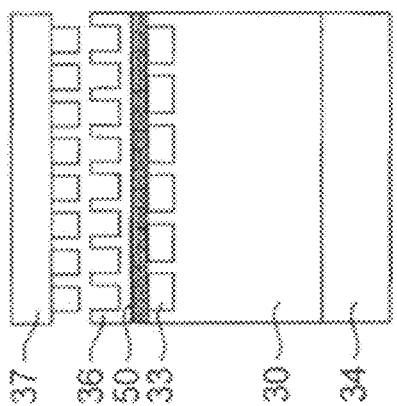
FIGS. 18A to 18E are sectional views showing the manufacturing method of the photoelectric conversion element according to the example 2.
Figure 18B:
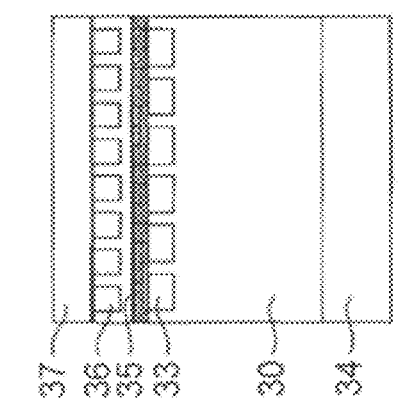
Figure 18A:
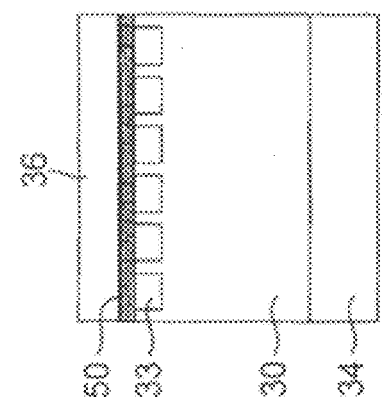

In addition, as shown in FIG. 18A, after a resist solution was applied by spin coating for 30 sec at 2000 rpm on the Au layer 50 formed on the p-type Si single-crystal substrate 30, the applied resist was heated on a hot plate at 110° C. for 90 sec to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

As shown in FIG. 18B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 was provided with the convex shapes of which pitch, size, and height were 300 nm, 150 nm, and 150 nm, respectively (the shapes are formed in an area of 9 cm$^2$).

In addition, as shown in FIG. 18C, after the imprinting, the p-type Si single-crystal substrate 30 was cooled down to room temperature and then the quartz stamper 37 was released. The imprinting formed concave shapes with a pitch of 300 nm, a size of 150 nm and a depth of 100 nm on the resist 36.

Figure 18E:
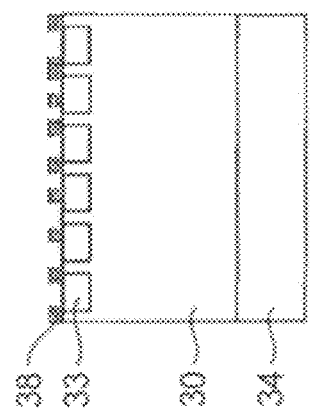
Figure 18D:
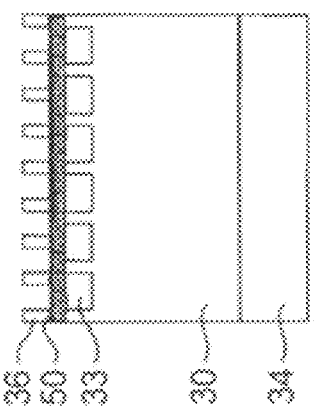

As shown in FIG. 18D, the resist pattern on which concave patterns had been formed was etched for 30 sec under conditions of 30 sccm CF4, 10 mTorr pressure, and 100 W RF power. After the CF4 RIE, the bottom of the resist 36 was exposed to expose the Au layer 50.

As shown in FIG. 18E, the Au layer 50 was etched for 90 sec by ion milling under conditions of an acceleration voltage of 500V and an ion current of 40 mA to form the nano-mesh electrode 38 having openings (through holes). The ion milling provided a pattern onto the Au layer 50. The pattern has openings (through holes) with a size of 150 nm and a pitch of 300 nm. In addition, residues of the resist 36 were removed with an organic solvent.

Figure 19A:
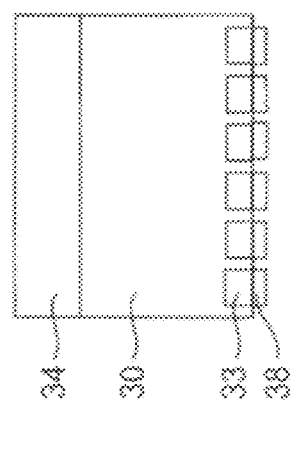
FIGS. 19A to 19D are sectional views showing the manufacturing method of the photoelectric conversion element according to the example 2.

As shown in FIG. 19A, after a solution of the resist 39 (THMR IP3250, TOKYO OHKA KOGYO Co., Ltd.) was applied on the nano-mesh electrode 38 and the p-type Si layer 30 for 30 sec at 2000 rpm by spin coating, the applied resist was heated at 110° C. for 90 sec to evaporate the solvent. The film thickness of the resist 39 was 1 μm. The resist 39 was patterned in a lattice shape with a photolithography method using a lattice-shaped mask with a width of 100 μm and an interval of 1 mm. The lattice shape had a width of 100 μm and an interval of 1 mm.

The patterning exposed the portion other than the long-wavelength absorption layer 33 which had not been doped with S.

Figure 19B:
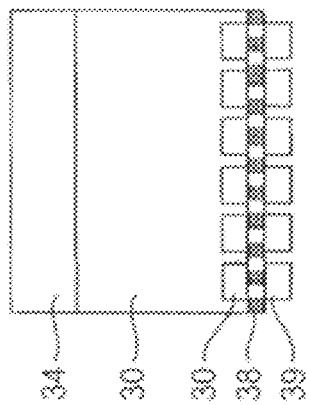

In addition, as shown in FIG. 19B, the nano-mesh metal electrode 38 was etched for 90 sec by ion milling under conditions of an acceleration voltage of 500V and an ion current of 40 mA using the resist pattern as a mask to thereby remove the nano-mesh electrode 38. Then, residues of the resist 39 were removed. Consequently, the nano-mesh electrode 38 except on the long-wavelength absorption layer 33 was removed.

Figure 19C:
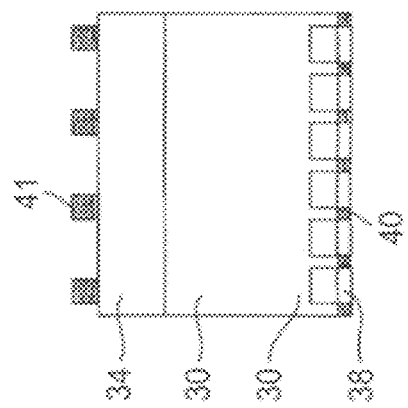

As shown in FIG. 19C, the back electrode 40 was formed with a liftoff method on the portion without the nano-mesh electrode 38.

Figure 19D:
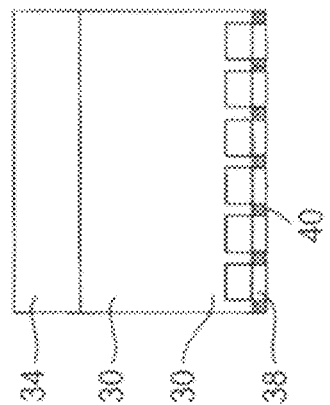

Finally, as shown in FIG. 19D, the comb electrode 41 (the first metal layer) was formed on the n$^+$ layer 34 with a screen printing method using Ag paste including an epoxy-based thermosetting resin, thereby completing the Si photoelectric conversion element having the long-wavelength absorption layer 33 and the nano-mesh electrode 38.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the S-doped long-wavelength absorption layer 33 and the nano-mesh electrode 38 showed an excellent value of 11.8%.

On the other hands, a background-art Si single-crystal photoelectric conversion element showed a photoelectric conversion efficiency of 10.0% without the S-doped long-wavelength absorption layer 33 or the nano-mesh electrode 38.

In addition, when a background-art Si single-crystal photoelectric conversion element was evaluated for the spectral sensitivity characteristic, light was absorbed in a range of up to about 1100 nm. However, the Si single-crystal photoelectric conversion element having the S-doped long-wavelength absorption layer 33 and the nano-mesh electrode 38 of the sample 2 embodiment had a light-absorption spectrum also in the range of 1100 nm to 1500 nm, although the absorption intensity thereof is not so high.

The results revealed that the S-doped long-wavelength absorption layer 33 and the nano-mesh electrode 38 allowed the photoelectric conversion efficiency to increase in a long wavelength region of light as a result of the light absorption in the long wavelength region of light.

Example 3

Single-Crystal Si, S—O, Cu, Nano-Mesh Electrode)

A manufacturing method of a photoelectric conversion element in accordance with an example 3 will be described with reference to FIGS. 20A to 22D. FIGS. 20A to 22D are sectional views showing manufacturing steps of the photoelectric conversion element in accordance with the example 3.

As shown in FIG. 20A, as a substrate was prepared the p-type Si single-crystal substrate 30 having a thickness of 500 μm and a doping concentration of $1 \times 10^{16}$ cm$^{-3}$. Thermal oxidation of the surface of the p-type Si single-crystal substrate 30 formed the SiO$_2$ film 31 with a thickness of 150 nm.

As shown in FIG. 20B, after a solution of the resist (THMR IP3250, TOKYO OHKA KOGYO Co., Ltd.) was applied on the SiO$_2$ film 31 for 30 sec at 2000 rpm by spin coating, the applied resist was heated on a hot plate at 110° C. for 90 sec to evaporate the solvent. The film thickness of the resist was 1 μm. The resist was patterned in a lattice shape with a photolithography method using a lattice-shaped mask with a width of 100 μm and an interval of 1 mm. The lattice shape had a width of 100 μm and an interval of 1 mm. Using the resist as a mask, the SiO$_2$ film 31 was etched for 10 min under conditions of 30-sccm CF4, 10 mTorr pressure, and 100 W RF power. Subsequently, residues of the resist were removed with an organic solvent to form a lattice-shaped SiO$_2$ mask 32 with a width of 100 μm and an interval of 1 mm.

Furthermore, as shown in FIG. 20C, S and O ions were simultaneously implanted under conditions of an implantation energy of 20 keV and a dose amount of $1 \times 10^{15}$ cm$^{-2}$ using the SiO$_2$ mask 32 as a mask.

As shown in FIG. 20D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1 \times 10^{20}$ cm$^{-3}$ was obtained within a depth of 100 nm from the Si surface.

As shown in FIG. 20E, P ions were implanted under conditions of an implantation energy of 20 keV and a dose amount of $5 \times 10^{15}$ cm$^{-2}$ on the opposite side which had been doped with S and O. Subsequently to the ion implantation, activation annealing was performed at 800° C. for 30 min, thereby providing the n$^+$ layer 34 with a concentration of $1 \times 10^{20}$ cm$^{-3}$ within a depth of 200 nm from the Si surface.

As shown in FIG. 20F, a Cu layer with a thickness of 30 nm was formed on the side which had been doped with S by an evaporation method, thereby forming a Cu layer 51.

In addition, as shown in FIG. 21A, after a resist solution was applied on the Cu layer 51 formed on the p-type Si single-crystal substrate 30 for 30 sec at 2000 rpm by spin coating, the applied resist was heated on a hot plate at 110° C. for 90 sec to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

As shown in FIG. 21B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 was provided with the convex shapes of which pitch, size, and height were 400 nm, 200 nm, and 150 nm, respectively (the shapes are formed in an area of 9 cm$^2$).

In addition, as shown in FIG. 21C, after the imprinting, the p-type Si single-crystal substrate 30 was cooled down to room temperature and then the quartz stamper 37 was released. The imprinting formed concave shapes with a pitch of 400 nm, a size of 150 nm and a depth of 100 nm on the resist 36.

As shown in FIG. 21D, the resist pattern on which the concave patterns had been formed was etched for 30 sec under conditions of 30 sccm CF4, 10 mTorr pressure, and 100 W RF power. After the CF4 RIE, the bottom of the resist 36 was exposed to expose the Cu layer 51.

As shown in FIG. 21E, the Cu layer 51 was etched for 90 sec by ion milling under conditions of an acceleration voltage of 500V and an ion current of 40 mA to form the nano-mesh electrode 38 having openings (through holes). The ion milling provided a pattern onto the Cu layer 51. The pattern has openings (through holes) with a size of 150 nm and a pitch of 300 nm. In addition, residues of the resist 36 were removed with an organic solvent.

As shown in FIG. 22A, after a solution of the resist 39 (THMR IP3250, TOKYO OHKA KOGYO Co., Ltd.) was applied on the nano-mesh electrode 38 and the p-type Si layer 30 for 30 sec at 2000 rpm by spin coating, the applied resist was heated at 110° C. for 90 sec to evaporate the solvent. The film thickness of the resist 39 was 1 μm. The resist 39 was patterned in a lattice shape with a photolithography method using a lattice-shaped mask with a width of 100 μm and an interval of 1 mm. The lattice shape had a width of 100 μm and an interval of 1 mm. The patterning exposed the portion which had not been doped with S.

In addition, as shown in FIG. 22B, the nano-mesh metal electrode 38 was etched for 90 sec by ion milling under conditions of an acceleration voltage of 500V and an ion current of 40 mA using the resist pattern as a mask, thereby removing the nano-mesh electrode 38. Then, residues of the resist 39 were removed. Consequently, the nano-mesh electrode 38 except on the long-wavelength absorption layer 33 was removed.

As shown in FIG. 22C, the back electrode 40 was formed with a liftoff method on the portion without the nano-mesh electrode 38.

Finally, as shown in FIG. 22D, the comb electrode 41 (the first metal layer) was formed on the n$^+$ layer 34 with a screen printing method using Ag paste including an epoxy-based thermosetting resin, thereby completing the Si photoelectric conversion element having the long-wavelength absorption layer 33 and the nano-mesh electrode 38.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the S and O-doped long-wavelength absorption layer 33 and the nano-mesh electrode 38 showed an excellent value of 12.5%.

On the other hand, a background-art Si single-crystal photoelectric conversion element showed a photoelectric conversion efficiency of 10.0% without the S and O-doped long-wavelength absorption layer 33 or the nano-mesh electrode 38.

In addition, when a background-art Si single-crystal photoelectric conversion element was evaluated for the spectral sensitivity characteristic, light was absorbed in a range of up to about 1100 nm. However, the Si single-crystal photoelectric conversion element having the S-doped long-wavelength absorption layer 33 and the nano-mesh electrode 38 of the example 3 embodiment had a light-absorption spectrum also in the range of 1100 nm to 1500 nm, although the absorption intensity thereof is not so high. S and O can form an S—O absorption pair, thereby enhancing the absorption amount and the conversion efficiency compared with the single S doping.

The results revealed that the S and O-doped long-wavelength absorption layer 33 and the nano-mesh electrode 38 allowed the photoelectric conversion efficiency to increase in a long wavelength region of light as a result of the light absorption in the long wavelength region of light.

Example 4

Single-Crystal Si, Se, Ag, Nano-Mesh Electrode

A manufacturing method of a photoelectric conversion element in accordance with an example 4 will be described with reference to FIGS. 23A to 25D. FIGS. 23A to 25D are sectional views showing manufacturing steps of the photoelectric conversion element in accordance with the example 4.

Figure 23A:
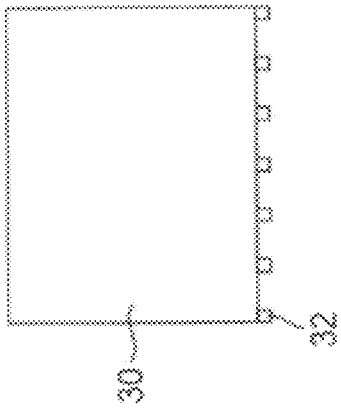
FIGS. 23A to 23F are sectional views showing a manufacturing method of a photoelectric conversion element according to an example 4.

As shown in FIG. 23A, as a substrate was prepared the p-type Si single-crystal substrate 30 having a thickness of 500 µm and a doping concentration of $1 \times 10^{16}$ cm$^{-3}$. Thermal oxidation of the surface of the p-type Si single-crystal substrate 30 formed the SiO$_2$ film 31 with a thickness of 150 nm.

Figure 23B:
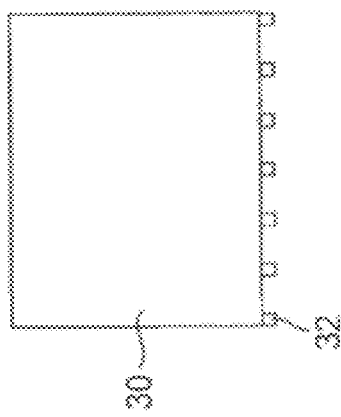

As shown in FIG. 23B, after a solution of the resist (THMR IP3250, TOKYO OHKA KOGYO Co., Ltd.) was applied on the SiO$_2$ film 31 for 30 sec at 2000 rpm by spin coating, the applied resist was heated on a hot plate at 110° C. for 90 sec to evaporate the solvent. The film thickness of the resist was 1 µm. The resist was patterned in a lattice shape with a photolithography method using a lattice-shaped mask with a width of 100 µm and an interval of 1 mm. The lattice shape had a width of 100 µm and an interval of 1 mm. Using the resist as a mask, the SiO$_2$ film 31 was etched for 10 min under conditions of 30-sccm CF4, 10 mTorr pressure, and 100 W RF power. Subsequently, residues of the resist were removed with an organic solvent to form a lattice-shaped SiO$_2$ mask 32 with a width of 100 µm and an interval of 1 mm.

Figure 23C:
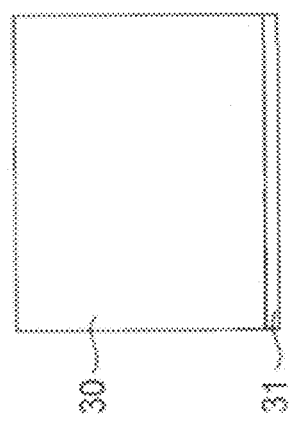

Furthermore, as shown in FIG. 23C, using the SiO$_2$ mask 32 as a mask, Se ions were implanted under conditions of an implantation energy of 20 keV and a dose amount of $1 \times 10^{15}$ cm$^{-2}$ using the SiO$_2$ mask 32 as a mask.

Figure 23D:
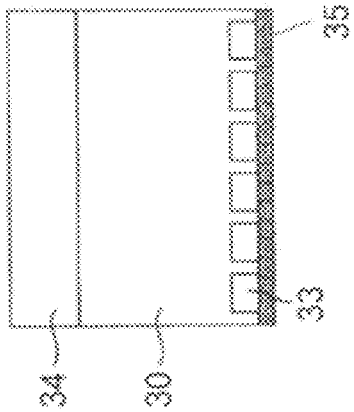

As shown in FIG. 23D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1 \times 10^{20}$ cm$^{-3}$ was obtained within a depth of 100 nm from the Si surface.

Figure 23E:
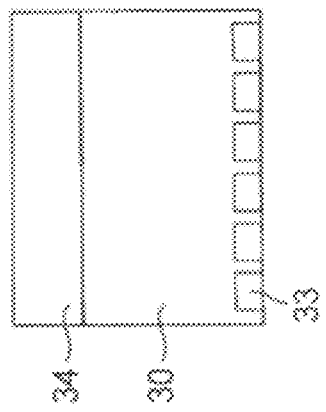

As shown in FIG. 23E, P was ion implanted under conditions of an implantation energy of 20 keV and a dose amount of $5 \times 10^{15}$ cm$^{-2}$ on the opposite side which had been doped with Se. Subsequently to the ion implantation, activation annealing was performed at 800° C. for 30 min, thereby providing the n$^+$ layer 34 with a concentration of $1 \times 10^{20}$ cm$^{-3}$ within a depth of 200 nm from the Si surface.

Figure 23F:
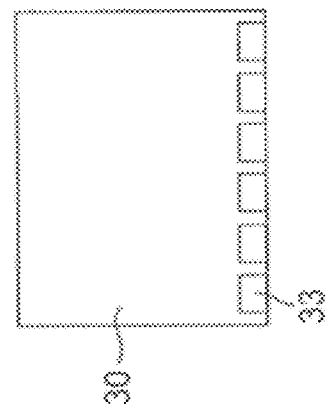

As shown in FIG. 23F, an Ag layer with a thickness of 30 nm was formed on the side which had been doped with Se with an evaporation method, thereby forming the Ag layer 35.

In addition, as shown in FIG. 24A, after a resist solution was applied on the Ag layer 35 formed on the p-type Si single-crystal substrate 30 by spin coating for 30 sec at 2000 rpm, the applied resist was heated at 110° C. for 90 sec on a hot plate to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

As shown in FIG. 24B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 was provided with the convex shapes of which pitch, size, and height were 200 nm, 100 nm, and 150 nm, respectively (the shapes are formed in an area of 9 cm$^2$).

In addition, as shown in FIG. 24C, after the imprinting, the p-type Si single-crystal substrate 30 was cooled down to room temperature and then the quartz stamper 37 was released. The imprinting formed concave shapes having a pitch of 400 nm, a size of 150 nm, and a depth of 100 nm on the resist 36.

As shown in FIG. 24D, the resist pattern on which the concave patterns had been formed was etched for 30 sec under conditions of 30 sccm CF4, 10 mTorr pressure, and 100 W RF power. After the CF4 RIE, the bottom of the resist 36 was exposed to expose the Ag layer 35.

As shown in FIG. 24E, the Ag layer 35 was etched for 90 sec by ion milling under conditions of an acceleration voltage of 500V and an ion current of 40 mA to form the nano-mesh electrode 38 having openings (through holes). The ion milling provided a pattern onto the Ag layer 35. The pattern had openings (through holes) with a size of 150 nm and a pitch of 300 nm. In addition, residues of the resist 36 were removed with an organic solvent.

Figure 25A:
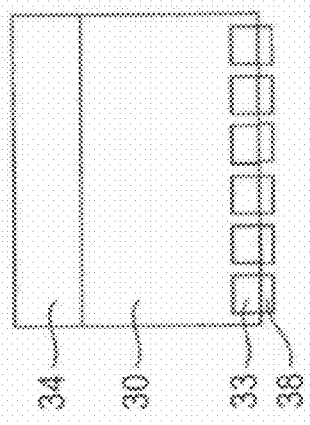
FIGS. 25A to 25D are sectional views showing the manufacturing method of the photoelectric conversion element according to the example 4.

As shown in FIG. 25A, after a solution of the resist 39 (THMR IP3250, TOKYO OHKA KOGYO Co., Ltd.) was applied on the nano-mesh electrode 38 and the P—Si layer 1 by spin coating for 30 sec at 2000 rpm, the applied resist was heated at 110° C. for 90 sec to evaporate the solvent. The film thickness of the resist 39 was 1 µm. The resist 39 was patterned in a lattice shape with a photolithography method using a lattice-shaped mask with a width of 100 µm and an interval of 1 mm. The lattice shape had a width of 100 µm and an interval of 1 mm, thereby exposing the portion which had not been doped with Se.

Figure 25B:
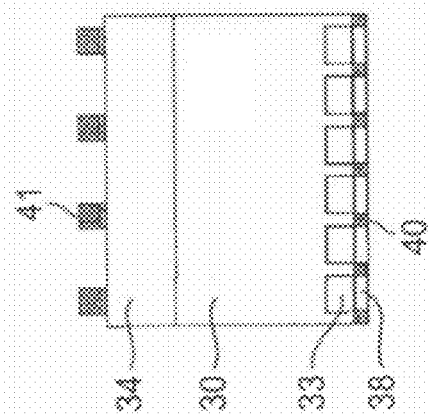

In addition, as shown in FIG. 25B, the nano-mesh metal electrode 38 was etched for 90 sec by ion milling under conditions of an acceleration voltage of 500V and an ion current of 40 mA using the resist pattern as a mask, thereby removing the nano-mesh electrode 38. Then, residues of the resist 39 were removed. Consequently, the nano-mesh electrode 38 except on the long-wavelength absorption layer 33 was removed.

Figure 25C:
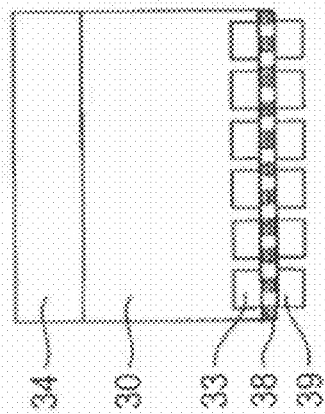

As shown in FIG. 25C, the back electrode 40 was formed on the portion without the nano-mesh electrode 38 with a liftoff method.

Figure 25D:
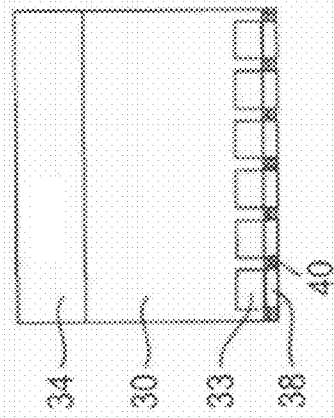

Finally, as shown in FIG. 25D, the comb electrode 41 (the first metal layer) was formed on the n$^+$ layer 34 with a screen printing method using Ag paste including an epoxy-based thermosetting resin, thereby completing the Si photoelectric conversion element having the long-wavelength absorption layer 33 and the nano-mesh electrode 38.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the Se-doped long-wavelength absorption layer 33 and the nano-mesh electrode 38 of the example 4 showed an excellent value of 13%.

On the other hand, a background-art Si single-crystal photoelectric conversion element showed a photoelectric conversion efficiency of 10.0% without the Se-doped long-wavelength absorption layer 33 or the nano-mesh electrode 38.

In addition, when a background-art Si single-crystal photoelectric conversion element was evaluated for the spectral sensitivity characteristic, light was absorbed in a range of up to about 1100 nm. However, the Si single-crystal photoelectric conversion element having the Se-doped long-wavelength absorption layer 33 and the nano-mesh electrode 38 had a light-absorption spectrum also in the range of 1100 nm to 1500 nm, although the absorption intensity thereof is not so high.

The results revealed that the Se-doped long-wavelength absorption layer 33 and the nano-mesh electrode 38 allowed the photoelectric conversion efficiency to increase in a long wavelength region of light as a result of the light absorption in the long wavelength region of light.

Example 5

Single-Crystal Si, in, Au, Nano-Mesh Electrode

A manufacturing method of a photoelectric conversion element in accordance with an example 5 will be described with reference to FIGS. 26A to 28D. FIGS. 26A to 28D are sectional views showing manufacturing steps of the photoelectric conversion element in accordance with the example 5.

Figure 26A:
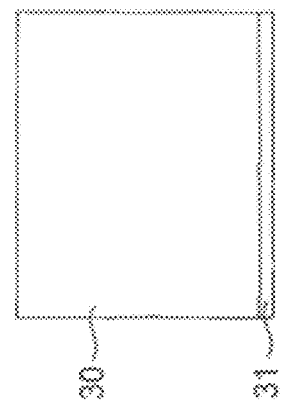
FIGS. 26A to 26F are sectional views showing a manufacturing method of a photoelectric conversion element according to an example 5.

As shown in FIG. 26A, as a substrate was prepared the p-type Si single-crystal substrate 30 having a thickness of 500 μm and a doping concentration of $1 \times 10^{16}$ cm$^{-3}$. Thermal oxidation of the surface of the p-type Si single-crystal substrate 30 formed the SiO$_2$ film 31 with a thickness of 150 nm.

Figure 26B:
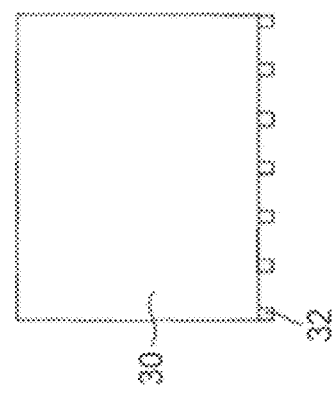

As shown in FIG. 26B, after a solution of the resist (THMR IP3250, TOKYO OHKA KOGYO Co., Ltd.) was applied on the SiO$_2$ film 31 by spin coating for 30 sec at 2000 rpm, the applied resist was heated on a hot plate at 110° C. for 90 sec to evaporate the solvent. The film thickness of the resist was 1 μm. The resist was patterned in a lattice shape with a photolithography method using a lattice-shaped mask with a width of 100 μm and an interval of 1 mm. The lattice shape had a width of 100 μm and an interval of 1 mm. Using the resist as a mask, the SiO$_2$ film 31 was etched for 10 min under conditions of 30-sccm CF4, 10 mTorr pressure, and 100 W RF power. Subsequently, residues of the resist were removed with an organic solvent to form a lattice-shaped SiO$_2$ mask 32 with a width of 100 μm and an interval of 1 mm.

Figure 26C:
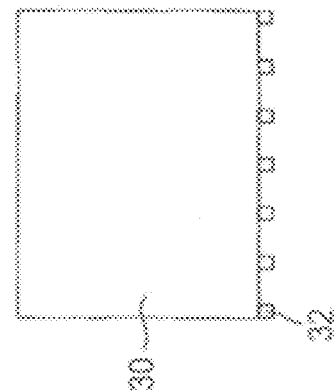

Furthermore, as shown in FIG. 26C, using the SiO$_2$ mask 32 as a mask, In ions were implanted under conditions of an implantation energy of 20 keV and a dose amount of $1 \times 10^{15}$ cm$^{-2}$ using the SiO$_2$ mask 32 as a mask.

Figure 26D:
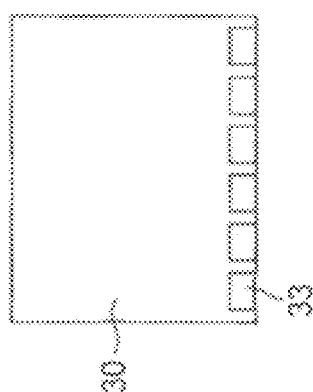

As shown in FIG. 26D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1 \times 10^{20}$ cm$^{-3}$ was obtained within a depth of 100 nm from the Si surface.

Figure 26E:
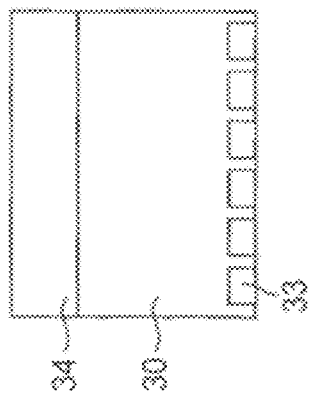

As shown in FIG. 26E, P ions were implanted under conditions of an implantation energy of 20 keV and a dose amount of $5 \times 10^{15}$ cm$^{-2}$ on the opposite side which had been doped with In. Subsequently to the ion implantation, activation annealing was performed at 800° C. for 30 min, thereby providing the n$^+$ layer 34 with a concentration of $1 \times 10^{20}$ cm$^{-3}$ within a depth of 200 nm from the Si surface.

Figure 26F:
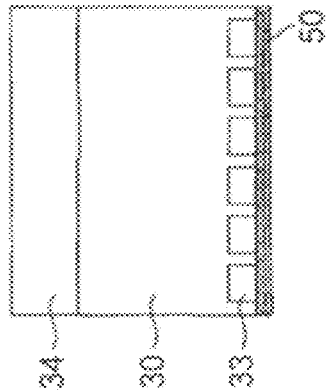

As shown in FIG. 26F, an Au layer with a thickness of 30 nm was formed on the side which had been doped with In with an evaporation method, thereby forming the Au layer 50.

Figure 27A:
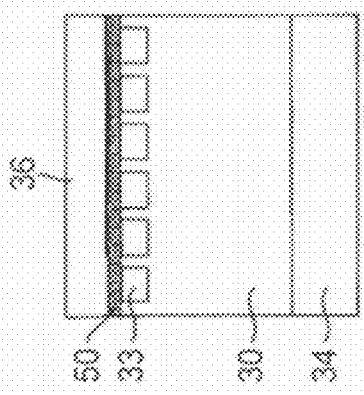
FIGS. 27A to 27E are sectional views showing the manufacturing method of the photoelectric conversion element according to the example 5.

In addition, as shown in FIG. 27A, after a resist solution was applied on the Au layer 50 formed on the p-type Si single-crystal substrate 30 by spin coating for 30 sec at 2000 rpm, the applied resist was heated at 110° C. for 90 sec on a hot plate to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

Figure 27B:
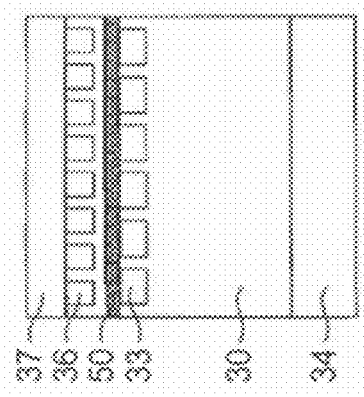

As shown in FIG. 27B, imprint was conducted as follows. A quartz stamper 37 was pressed to the resist 36 at a pressure of 10 MPa with heating p-type Si single crystal substrate 30 at 120° C. so that the surface of the quartz stamper 37 having convex shapes was in contact with the resist 36. The quartz stamper 37 was provided with the convex shapes of which pitch, size, and height were 300 nm, 150 nm, and 150 nm, respectively (the shapes are formed in an area of 9 cm$^2$).

Figure 27C:
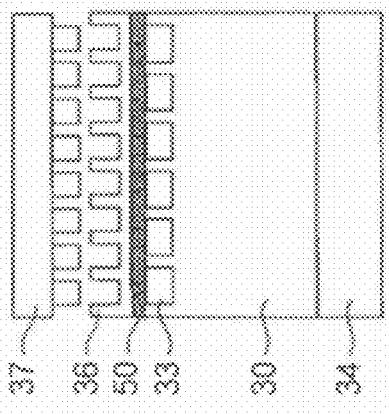

In addition, as shown in FIG. 27C, after the imprinting, the p-type Si single-crystal substrate 30 was cooled down to room temperature and then the quartz stamper 37 was released. The imprinting formed concave shapes with a pitch of 300 nm, a size of 150 nm, and a depth of 150 nm on the resist 36.

Figure 27D:
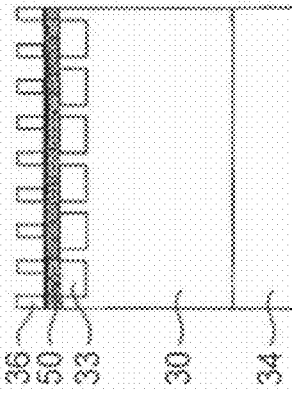

As shown in FIG. 27D, the resist pattern on which the concave patterns had been formed was etched for 30 sec under conditions of 30 sccm CF4, 10 mTorr pressure, and 100 W RF power. After the CF4 RIE, the bottom of the resist 36 was exposed to expose the Au layer 50.

Figure 27E:
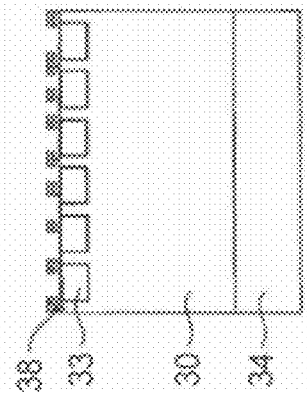

As shown in FIG. 27E, the Au layer 50 was etched for 90 sec by ion milling under conditions of an acceleration voltage of 500 V and an ion current of 40 mA to form the nano-mesh electrode 38 having openings (through holes). The ion milling provided a pattern onto the Au layer 50. The pattern has openings (through holes) with a size of 150 nm and a pitch of 300 nm. In addition, residues of the resist 36 were removed with an organic solvent.

Figure 28B:
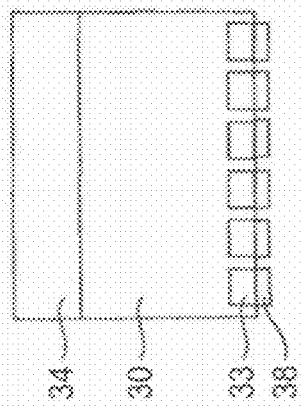
FIGS. 28A to 28D are sectional views showing the manufacturing method of the photoelectric conversion element according to the example 5.
Figure 28D:
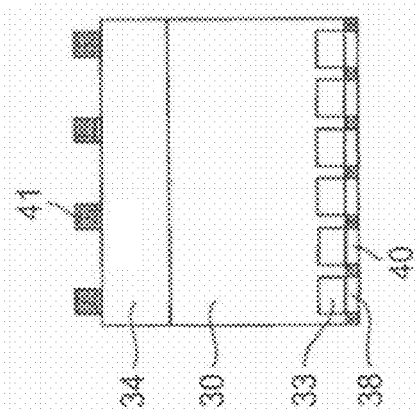
Figure 28A:
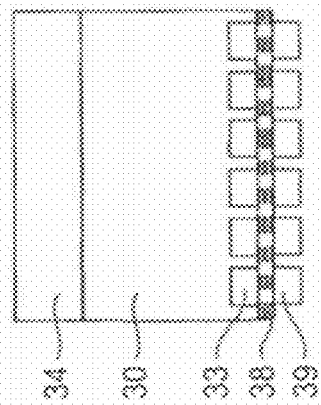

As shown in FIG. 28A, after a solution of the resist 39 (THMR IP3250, TOKYO OHKA KOGYO Co., Ltd.) was applied on the nano-mesh electrode 38 and the p-type Si layer 30 by spin coating for 30 sec at 2000 rpm, the applied resist was heated at 110° C. for 90 sec to evaporate the solvent. The film thickness of the resist 39 was 1 μm. The resist 39 was patterned in a lattice shape with a photolithography method using a lattice-shaped mask with a width of 100 nm and an interval of 1 mm. The lattice shape had a width of 100 μm and an interval of 1 mm. The patterning exposed the portion which had not been doped with In.

In addition, as shown in FIG. 28B, the nano-mesh metal electrode 38 was etched for 90 sec by ion milling under conditions of an acceleration voltage of 500V and an ion current of 40 mA using the resist pattern as a mask, thereby removing the nano-mesh electrode 38. Subsequently, residues of the resist 39 were removed. Consequently, the nano-mesh electrode 38 except on the long-wavelength absorption layer 33 was removed.

Figure 28C:
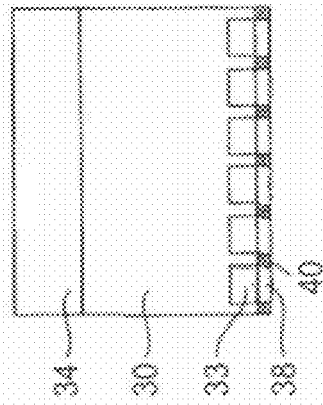

As shown in FIG. 28C, the back electrode 40 was formed on the portion without the nano-mesh electrode 38 with a liftoff method.

Finally, as shown in FIG. 28D, the comb electrode 41 (the first metal layer) was formed on the n$^+$ layer 34 with a screen printing method using Ag paste including an epoxy-based thermosetting resin, thereby completing the Si photoelectric conversion element having the long-wavelength absorption layer 33 and the nano-mesh electrode 38.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the Se-doped long-wavelength absorption layer 33 and the nano-mesh electrode 38 of the example 5 embodiment showed an excellent value of 11.5%.

On the other hand, a background-art Si single-crystal photoelectric conversion element showed a photoelectric conversion efficiency of 10.0% without the In-doped long-wavelength absorption layer 33 or the nano-mesh electrode 38.

In addition, when a background-art Si single-crystal photoelectric conversion element was evaluated for the spectral sensitivity characteristic, light was absorbed in a range of up to about 1100 nm. However, the Si single-crystal photoelectric conversion element having the In-doped long-wavelength absorption layer 33 and the nano-mesh electrode 38 had a light-absorption spectrum also in the range of 1100 nm to 1500 nm, although the absorption intensity thereof is not so high.

The results revealed that the In-doped long-wavelength absorption layer 33 and the nano-mesh electrode 38 allowed the photoelectric conversion efficiency to increase in a long wavelength region of light as a result of the light absorption in the long wavelength region of light.

Example 6

Single-Crystal Si, in, Au, Nano-Mesh Electrode

A manufacturing method of a photoelectric conversion element in accordance with an example 6 will be described with reference to FIGS. 29A to 31D. FIGS. 29A to 31D are sectional views showing manufacturing steps of the photoelectric conversion element in accordance with the example 6.

Figure 29C:
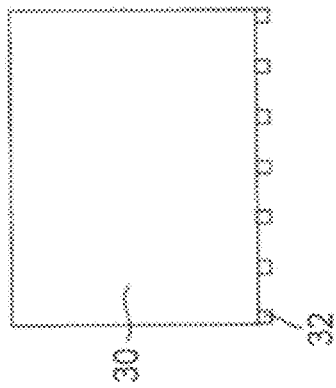
FIGS. 29A to 29F are sectional views showing a manufacturing method of a photoelectric conversion element according to an example 6.
Figure 29B:
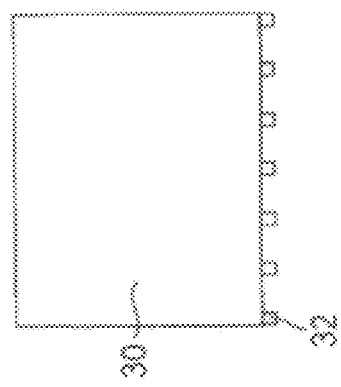
Figure 29A:
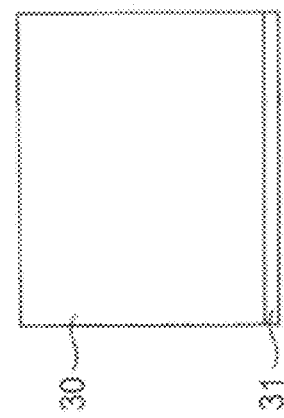

As shown in FIG. 29A, as a substrate was prepared the p-type Si single-crystal substrate 30 having a thickness of 500 μm and a doping concentration of $1 \times 10^{16}$ cm$^{-3}$. Thermal oxidation of the surface of the p-type Si single-crystal substrate 30 formed the SiO$_2$ film 31 with a thickness of 150 nm.

As shown in FIG. 29B, after a solution of the resist (THMR IP3250, TOKYO OHKA KOGYO Co., Ltd.) was applied on the SiO$_2$ film 31 by spin coating for 30 sec at 2000 rpm, the applied resist was heated on a hot plate at 110° C. for 90 sec to evaporate the solvent. The film thickness of the resist was 1 μm. The resist was patterned in a lattice shape with a photolithography method using a lattice-shaped mask with a width of 100 μm and an interval of 1 mm. The lattice shape had a width of 100 μm and an interval of 1 mm. Using the resist as a mask, the SiO$_2$ film 31 was etched for 10 min under conditions of 30-sccm CF4, 10 mTorr pressure, and 100 W RF power. Subsequently, residues of the resist were removed with an organic solvent to form a lattice-shaped SiO$_2$ mask 32 with a width of 100 μm and an interval of 1 mm.

Furthermore, as shown in FIG. 29C, Mg ions and Ga ions were simultaneously implanted under conditions of an implantation energy of 20 keV and a dose amount of $1 \times 10^{15}$ cm$^{-2}$ using the SiO$_2$ mask 32 as a mask.

Figure 29F:
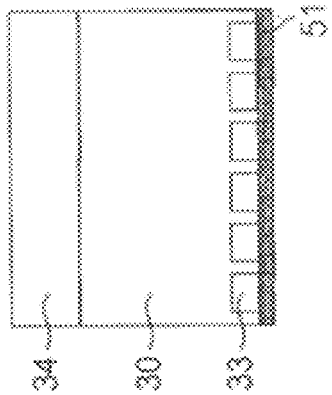
Figure 29E:
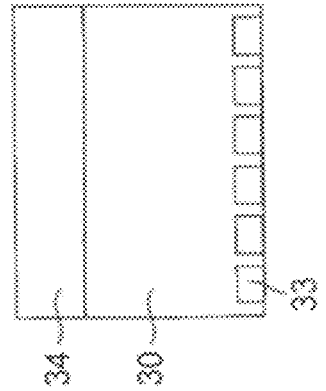
Figure 29D:
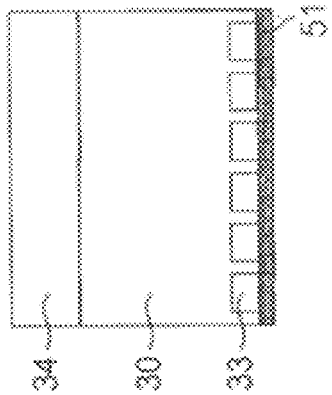

As shown in FIG. 29D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1 \times 10^{20}$ cm$^{-3}$ was obtained within a depth of 100 nm from the Si surface.

As shown in FIG. 29E, P ions were implanted under conditions of an implantation energy of 20 keV and a dose amount of $5 \times 10^{15}$ cm$^{-2}$ on the opposite side which had been doped with Mg and Ga. Subsequently to the ion implantation, activation annealing was performed at 800° C. for 30 min, thereby providing the n$^+$ layer 34 with a concentration of $1 \times 10^{20}$ cm$^{-3}$ within a depth of 200 nm from the Si surface.

As shown in FIG. 29F, a Cu layer with a thickness of 30 nm was formed on the side which had been doped with Mg and Ga with an evaporation method, thereby forming the Cu layer 51.

Figure 30A:
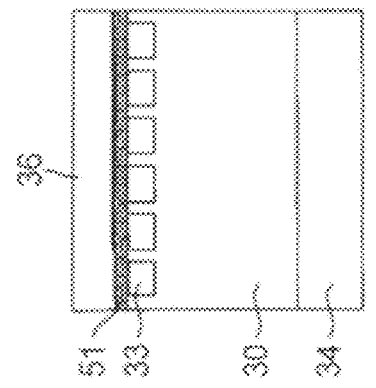
FIGS. 30A to 30E are sectional views showing the manufacturing method of the photoelectric conversion element according to the example 6.

In addition, as shown in FIG. 30A, after a resist solution was applied on the Cu layer 51 formed on the p-type Si single-crystal substrate 30 for 30 sec at 2000 rpm by spin coating, the applied resist was heated at 110° C. for 90 sec on a hot plate to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

Figure 30B:
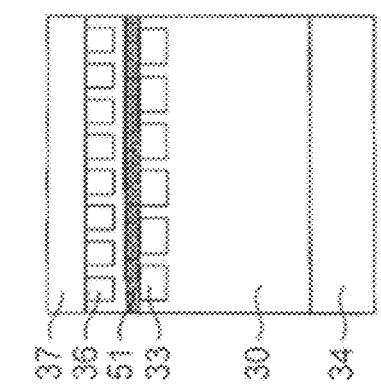

As shown in FIG. 30B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 was provided with the convex shapes of which pitch, size, and height were 300 nm, 150 nm, and 150 nm, respectively (the shapes are formed in an area of 9 cm$^2$).

Figure 30C:
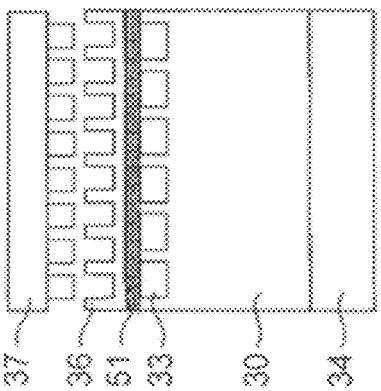

In addition, as shown in FIG. 30C, after the imprinting, the p-type Si single-crystal substrate 30 was cooled down to room temperature and then the quartz stamper 37 was released. The imprinting formed concave shapes with a pitch of 400 nm, a size of 200 nm, and a depth of 100 nm on the resist 36.

Figure 30D:
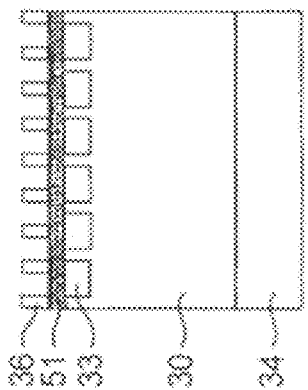

As shown in FIG. 30D, the resist pattern on which the concave patterns had been formed was etched for 30 sec under conditions of 30 sccm CF4, 10 mTorr pressure, and 100 W RF power. After the CF4 RIE, the bottom of the resist 36 was exposed to expose the Cu layer 51.

Figure 30E:
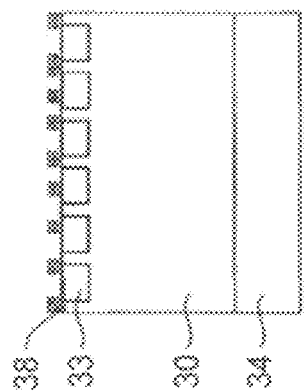

As shown in FIG. 30E, the Cu layer 51 was etched for 90 sec by ion milling under conditions of an acceleration voltage of 500 V and an ion current of 40 mA to form the nano-mesh electrode 38 having openings (through holes). The ion milling provided a pattern onto the Cu layer 51. The pattern has openings (through holes) with a size of 200 nm and a pitch of 400 nm. In addition, residues of the resist 36 were removed with an organic solvent.

Figure 31A:
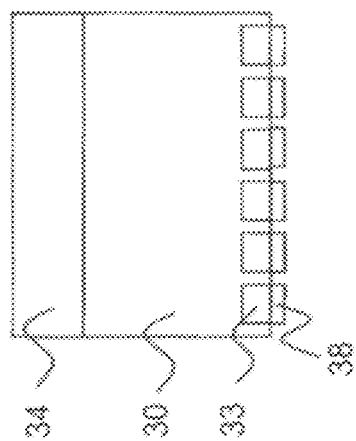
FIGS. 31A to 31D are sectional views showing the manufacturing method of the photoelectric conversion element according to the example 6.

As shown in FIG. 31A, after a solution of the resist 39 (THMR IP3250, TOKYO OHKA KOGYO Co., Ltd.) was applied on the nano-mesh electrode 38 and the p-type Si layer 30 by spin coating for 30 sec at 2000 rpm, the applied resist was heated at 110° C. for 90 sec to evaporate the solvent. The film thickness of the resist 39 was 1 μm. The resist 39 was patterned in a lattice shape with a photolithography method using a lattice-shaped mask with a width of 100 μm and an interval of 1 mm. The lattice shape had a width of 100 μm and an interval of 1 mm. The patterning exposed the portion which had not been doped with Mg and Ga.

Figure 31B:
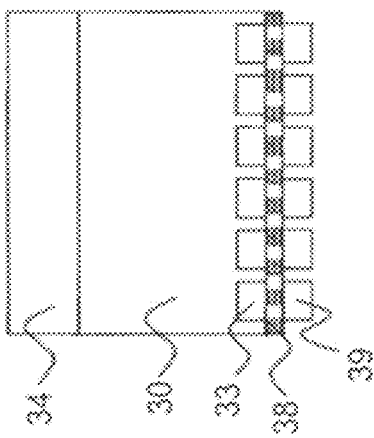

In addition, as shown in FIG. 31B, the nano-mesh metal electrode 38 was etched for 90 sec by ion milling under conditions of an acceleration voltage of 500V and an ion current of 40 mA using the resist pattern as a mask, thereby removing the nano-mesh electrode 38. Then, residues of the resist 39 were removed. Consequently, the nano-mesh electrode 38 except on the long-wavelength absorption layer 33 was removed.

Figure 31C:
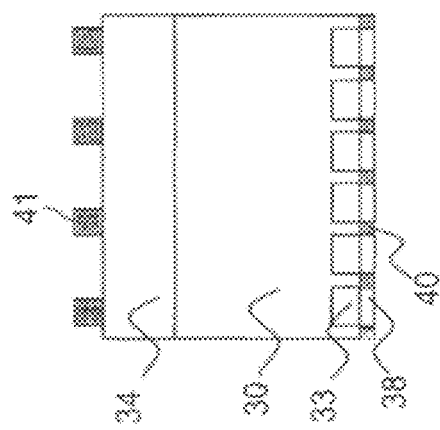

As shown in FIG. 31C, the back electrode 40 was formed on the portion without the nano-mesh electrode 38 using a liftoff method.

Figure 31D:
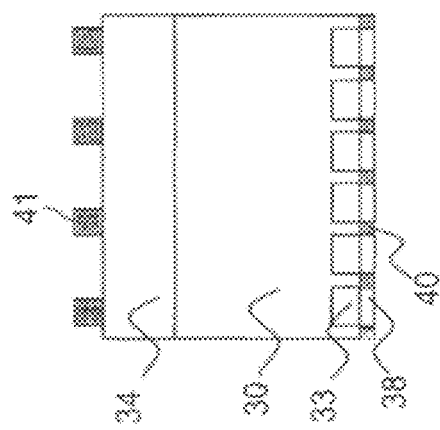

Finally, as shown in FIG. 31D, the comb electrode 41 (the first metal layer) was formed on the n$^+$ layer 34 with a screen printing method using Ag paste including an epoxy-based thermosetting resin, thereby completing the Si photoelectric conversion element having the long-wavelength absorption layer 33 and the nano-mesh electrode 38.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the Mg and Ga-doped long-wavelength absorption layer 33 of the example 6 embodiment and the nano-mesh electrode 38 showed an excellent value of 11.5%.

On the other hands, a background-art Si single-crystal photoelectric conversion element showed a photoelectric conversion efficiency of 10.0% without the Mg and Ga-doped long-wavelength absorption layer 33 or the nano-mesh electrode 38.

In addition, when a background-art Si single-crystal photoelectric conversion element was evaluated for the spectral sensitivity characteristic, light was absorbed in a range of up to about 1100 nm. However, the Si single-crystal photoelectric conversion element having the Mg and Ga-doped long-wavelength absorption layer 33 and the nano-mesh electrode 38 had a light-absorption spectrum also in the range of 1100 nm to 1400 nm, although the absorption intensity thereof is not so high.

The results revealed that the Mg and Ga-doped long-wavelength absorption layer 33 and the nano-mesh electrode 38 allowed the photoelectric conversion efficiency to increase in a long wavelength region of light as a result of the light absorption in the long wavelength region of light.

In addition, Mg has a level on the side of the conduction band and Ga has a level on the side of valence band. An absorption band of light was generated in a long wavelength region of light by the absorption between the two levels. As described above, the absorption band of light was little generated in a long wavelength region of light by one impurity level. Using two or more impurity levels allows light absorption in such a long wavelength region of light.

Example 7

Thin Single-Crystal Si, S, Ag, Nano-Mesh Electrode

A manufacturing method of a photoelectric conversion element in accordance with an example 7 will be described also with reference to FIGS. 14A to 16D. FIGS. 14A to 16D are sectional views showing manufacturing steps of the photoelectric conversion element in accordance with the example 7.

As shown in FIG. 14A, as a substrate was prepared the p-type Si single-crystal substrate 30 having a thickness of 100 µm and a doping concentration of $1\times10^{16}$ cm$^{-3}$. Thermal oxidation of the surface of the p-type Si single-crystal substrate 30 formed the SiO$_2$ film 31 with a thickness of 150 nm.

As shown in FIG. 14B, after a solution of the resist (THMR IP3250, TOKYO OHKA KOGYO Co., Ltd.) was applied on the SiO$_2$ film 31 for 30 sec at 2000 rpm by spin coating, the applied resist was heated on a hot plate at 110° C. for 90 sec to evaporate the solvent. The film thickness of the resist was 1 µm. The resist was patterned in a lattice shape with a photolithography method using a lattice-shaped mask with a width of 100 µm and an interval of 1 mm. The lattice shape had a width of 100 µm and an interval of 1 mm. Using the resist as a mask, the SiO$_2$ film 31 was etched for 10 min under conditions of 30-sccm CF4, 10 mTorr pressure, and 100 W RF power. Subsequently, residues of the resist were removed with an organic solvent to form a lattice-shaped SiO$_2$ mask 32 with a width of 100 µm and an interval of 1 mm.

Furthermore, as shown in FIG. 14C, S ions were implanted under conditions of an implantation energy of 20 keV and a dose amount of $1\times10^{15}$ cm$^{-2}$ using the SiO$_2$ mask 32 as a mask.

As shown in FIG. 14D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1\times10^{20}$ cm$^{-3}$ was obtained within a depth of 100 nm from the Si surface.

As shown in FIG. 14E, P ions were implanted under conditions of an implantation energy of 20 keV and a dose amount of $5\times10^{15}$ cm$^{-2}$ on the opposite side which had been doped with S. Subsequently to the ion implantation, activation annealing was performed at 800° C. for 30 min, thereby providing the n$^+$ layer 34 with a concentration of $1\times10^{20}$ cm$^{-3}$ within a depth of 200 nm from the Si surface.

As shown in FIG. 14F, an Ag layer with a thickness of 30 nm was formed with an evaporation method on the side which had been doped with Mg and Ga, thereby forming the Ag layer 35.

In addition, as shown in FIG. 15A, after a resist solution was applied on the Ag layer 35 formed on the p-type Si single-crystal substrate 30 by spin coating for 30 sec at 2000 rpm, the applied resist was heated at 110° C. for 90 sec on a hot plate to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

As shown in FIG. 15B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 was provided with the convex shapes of which pitch, size, and height were 300 nm, 150 nm, and 150 nm, respectively (the shapes are formed in an area of 9 cm$^2$).

In addition, as shown in FIG. 15C, after the imprinting, the p-type Si single-crystal substrate 30 was cooled down to room temperature and then the quartz stamper 37 was released. The imprinting formed concave shapes with a pitch of 400 nm, a size of 200 nm and a depth of 100 nm on the resist 36.

As shown in FIG. 15D, the resist pattern on which the concave patterns had been formed was etched for 30 sec under conditions of 30 sccm CF4, 10 mTorr pressure, and 100 W RF power. After the CF4 RIE, the bottom of the resist 36 was exposed to expose the Ag layer 35.

As shown in FIG. 15E, the Ag layer 35 was etched for 90 sec by ion milling under conditions of an acceleration voltage of 500 V and an ion current of 40 mA to form the nano-mesh electrode 38 having openings (through holes). The ion milling provided a pattern onto the Ag layer 35. The pattern has openings (through holes) with a size of 200 nm and a pitch of 400 nm. In addition, residues of the resist 36 were removed with an organic solvent.

As shown in FIG. 16A, after a solution of the resist 39 (THMR IP3250, TOKYO OHKA KOGYO Co., Ltd.) was applied on the nano-mesh electrode 38 and the p-type Si layer 30 by spin coating for 30 sec at 2000 rpm, the applied resist was heated at 110° C. for 90 sec to evaporate the solvent. The film thickness of the resist 39 was him. The resist 39 was patterned in a lattice shape with a photolithography method using a lattice-shaped mask with a width of 100 µm and an interval of 1 mm. The lattice shape had a width of 100 µm and an interval of 1 mm. The patterning exposed the portion which had not been doped with S.

In addition, as shown in FIG. 16B, the nano-mesh metal electrode 38 was etched for 80 sec by ion milling under conditions of an acceleration voltage of 500V and an ion current of 40 mA using the resist pattern as a mask, thereby removing the nano-mesh electrode 38. Subsequently, residues of the resist 39 were removed. Consequently, the nano-mesh electrode 38 except on the long-wavelength absorption layer 33 was removed.

As shown in FIG. 16C, the back electrode 40 was formed on the portion without the nano-mesh electrode 38 using a liftoff method.

Finally, as shown in FIG. 16D, the comb electrode 41 (the first metal layer) was formed on the n+ layer 34 with a screen printing method using Ag paste including an epoxy-based thermosetting resin, thereby completing the Si photoelectric conversion element having the long-wavelength absorption layer 33 and the nano-mesh electrode 38.

(Characteristic of the Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the Mg and Ga-doped long-wavelength absorption layer 33 of the example 7 embodiment and the nano-mesh electrode 38 showed an excellent value of 13.6%.

On the other hand, a background-art Si single-crystal photoelectric conversion element showed a photoelectric conversion efficiency of 10.0% without the S-doped long-wavelength absorption layer 33 or the nano-mesh electrode 38.

In addition, when a background-art Si single-crystal photoelectric conversion element was evaluated for the spectral sensitivity characteristic, light was absorbed in a range of up to about 1100 nm. However, the Si single-crystal photoelectric conversion element having the Mg and Ga-doped long-wavelength absorption layer 33 and the nano-mesh electrode 38 had a light-absorption spectrum also in the range of 1100 nm to 1500 nm, although the absorption intensity thereof is not so high.

The results revealed that the S-doped long-wavelength absorption layer 33 and the nano-mesh electrode 38 allowed the photoelectric conversion efficiency to increase in a long wavelength region of light as a result of the light absorption in the long wavelength region of light.

In addition, the example 7 is different from the example 1 in the thickness of the Si substrate. Thinning the Si substrate increases a ratio of the carriers generated in the S-doped long-wavelength absorption layer 33 to reach a depletion layer, thereby enhancing the photoelectric conversion efficiency. It should be, therefore, noted that thinning the Si substrate is also effective to enhance the photoelectric conversion efficiency.

Example 8

Single-Crystal Si, S, Ag, Nano-Mesh Electrode

A manufacturing method of a photoelectric conversion element in accordance with an example 8 will be described with reference to FIGS. 32A to 34D. FIGS. 32A to 34D are sectional views showing manufacturing steps of the photoelectric conversion element in accordance with the example 8.

As shown in FIG. 32A, as a substrate was prepared the p-type Si single-crystal substrate 30 having a thickness of 500 μm and a doping concentration of $1 \times 10^{16}$ cm$^{-3}$. Thermal oxidation of the surface of the p-type Si single-crystal substrate 30 formed the SiO$_2$ film 31 with a thickness of 150 nm.

As shown in FIG. 32B, after a solution of the resist (THMR IP3250, TOKYO OHKA KOGYO Co., Ltd.) was applied on the SiO$_2$ film 31 for 30 sec at 2000 rpm by spin coating, the applied resist was heated on a hot plate at 110° C. for 90 sec to evaporate the solvent. The film thickness of the resist was 1 μm. The resist was patterned in a lattice shape with a photolithography method using a lattice-shaped mask with a width of 100 μm and an interval of 1 mm. The lattice shape had a width of 100 μm and an interval of 1 mm. Using the resist as a mask, the SiO$_2$ film 31 was etched for 10 min under conditions of 30-sccm CF4, 10 mTorr pressure, and 100 W RF power. Subsequently to the CF4 RIE, residues of the resist were removed with an organic solvent to form a lattice-shaped SiO$_2$ mask 32 with a width of 100 μm and an interval of 1 mm.

Furthermore, as shown in FIG. 32C, S ions were implanted under conditions of an implantation energy of 20 keV and a dose amount of $1 \times 10^{15}$ cm$^{-2}$ using the SiO$_2$ mask 32 as a mask.

As shown in FIG. 32D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1 \times 10^{20}$ cm$^{-3}$ was obtained within a depth of 100 nm from the Si surface.

As shown in FIG. 32E, P ions were implanted under conditions of an implantation energy of 20 keV and a dose amount of $5 \times 10^{15}$ cm$^{-2}$ on the opposite side which had been doped with S. Subsequently to the ion implantation, activation annealing was performed at 800° C. for 30 min, thereby providing the n+ layer 34 with a concentration of $1 \times 10^{20}$ cm$^{-3}$ within a depth of 200 nm from the Si surface.

As shown in FIG. 32F, an Ag layer with a thickness of 30 nm was formed with an evaporation method on the side which had been doped with S, thereby forming the Ag layer 35.

In addition, as shown in FIG. 33A, after a resist solution was applied on the Ag layer 35 formed on the rear surface of the p-type Si single-crystal substrate 30 by spin coating for 30 sec at 2000 rpm, the applied resist was heated at 110° C. for 90 sec on a hot plate to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

As shown in FIG. 33B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 was provided with the convex shapes of which size and height were 150 nm and 100 nm, respectively (the shapes are formed in an area of 9 cm$^2$).

In addition, as shown in FIG. 33C, after the imprinting, the p-type Si single-crystal substrate 30 was cooled down to room temperature and then the quartz stamper 37 was released. The imprinting provided concave shapes with a size of 150 nm and a depth of 80 nm on the resist 36.

As shown in FIG. 33D, the resist pattern on which the concave patterns had been formed was etched for 30 sec under conditions of 30 sccm CF4, 10 mTorr pressure, and 100 W RF power. After the CF4 RIE, the bottom of the resist 36 was exposed to expose the Ag layer 35.

As shown in FIG. 33E, the Ag layer 35 was etched for 90 sec by ion milling under conditions of an acceleration voltage of 500V and an ion current of 40 mA to form the nano-mesh electrode 38. The ion milling provided dot metals 52 on the p-type Si layer 30. The dot metals formed a dot-pattern with a size of 150 nm. In addition, residues of the resist 36 were removed with an organic solvent.

Figure 34B:
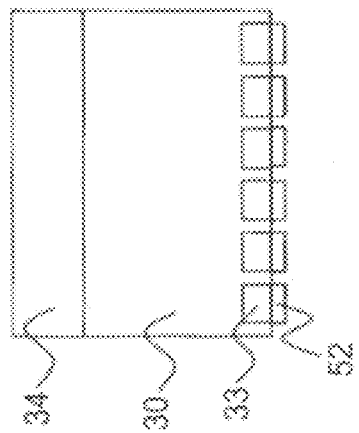
FIGS. 34A to 34D are sectional views showing the manufacturing method of the photoelectric conversion element according to the example 8.
Figure 34D:
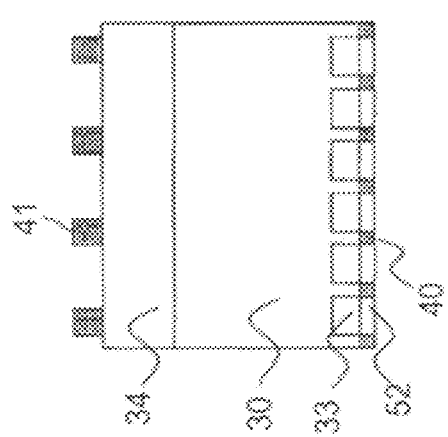
Figure 34A:
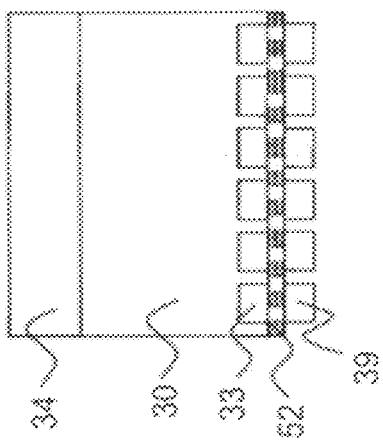

As shown in FIG. 34A, after a solution of the resist 39 (THMR IP3250, TOKYO OHKA KOGYO Co., Ltd.) was applied on the dot metals 52 and the P—Si layer 1 by spin coating for 30 sec at 2000 rpm, the applied resist was heated at 110° C. for 90 sec to evaporate the solvent. The film thickness of the resist 39 was 1 μm. The resist 39 was patterned in a lattice shape with a photolithography method using a lattice-shaped mask with a width of 100 μm and an interval of 1 mm. The lattice shape had a width of 100 µm and an interval of 1 mm. The patterning exposed the portion which had not been doped with S.

In addition, as shown in FIG. 34B, the dot metals 52 were etched for 80 sec by ion milling under conditions of an acceleration voltage of 500V and an ion current of 40 mA using the resist pattern as a mask, thereby removing the dot metals 52. Then, residues of the resist 39 were removed. Consequently, the dot metals 52 except on the long-wavelength absorption layer 33 were removed.

Figure 34C:
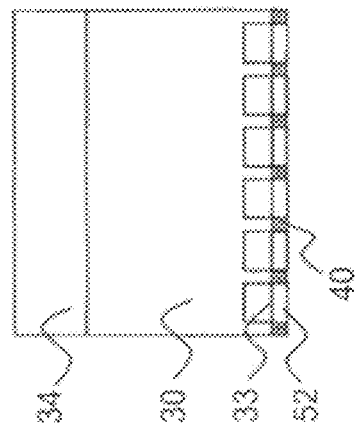

As shown in FIG. 34C, the back electrode 40 was formed with a liftoff method on the portion without the dot metals 52.

Finally, as shown in FIG. 34D, the comb electrode 41 (the metal layer) was formed on the n$^+$ layer 34 with a screen printing method using Ag paste including an epoxy-based thermosetting resin, thereby completing the Si photoelectric conversion element having the long-wavelength absorption layer 33 and the dot metals 52.

(Characteristic of the Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the S-doped long-wavelength absorption layer 33 and the dot metals 52 of the example 8 showed an excellent value of 11%. On the other hand, a background-art Si single-crystal photoelectric conversion element showed a photoelectric conversion efficiency of 10.0% without the S-doped long-wavelength absorption layer 33 or the dot metals 52.

In addition, when a background-art Si single-crystal photoelectric conversion element was evaluated for the spectral sensitivity characteristic, light was absorbed in a range of up to about 1100 nm. However, the Si single-crystal photoelectric conversion element having the S-doped long-wavelength absorption layer 33 and the dot metals 52 had a light-absorption spectrum also in the range of 1100 nm to 1500 nm, although the absorption intensity thereof is not so high.

The results revealed that the S-doped long-wavelength absorption layer 33 and the dot metals 52 allowed the photoelectric conversion efficiency to increase in a long wavelength region of light as a result of the light absorption in the long wavelength region of light.

Example 9

Single-Crystal Si, Se, Au, Dot Metals

A manufacturing method of a photoelectric conversion element in accordance with an example 9 will be described with reference to FIGS. 35A to 37D. FIGS. 35A to 37D are sectional views showing the manufacturing method of the photoelectric conversion element in accordance with the example 9.

Figure 35A:
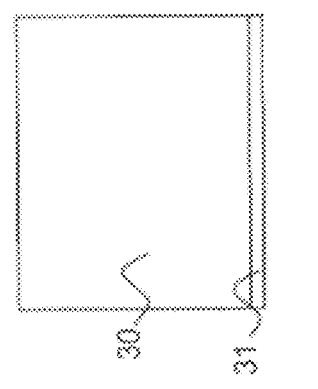
FIGS. 35A to 35F are sectional views showing a manufacturing method of a photoelectric conversion element according to an example 9.

As shown in FIG. 35A, as a substrate was prepared the p-type Si single-crystal substrate 30 having a thickness of 500 µm and a doping concentration of $1\times10^{16}$ cm$^{-3}$. Thermal oxidation of the surface of the p-type Si single-crystal substrate 30 formed the SiO$_2$ film 31 with a thickness of 150 nm.

Figure 35B:
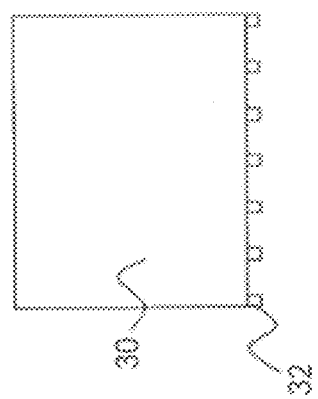

As shown in FIG. 35B, after a solution of the resist (THMR IP3250, TOKYO OHKA KOGYO Co., Ltd.) was applied on the SiO$_2$ film 31 for 30 sec at 2000 rpm by spin coating, the applied resist was heated on a hot plate at 110° C. for 90 sec to evaporate the solvent. The film thickness of the resist was 1 µm. The resist was patterned in a lattice shape with a photolithography method using a lattice-shaped mask with a width of 100 µm and an interval of 1 mm. The lattice shape had a width of 100 µm and an interval of 1 mm. Using the resist as a mask, the SiO$_2$ film 31 was etched for 10 min under conditions of 30-sccm CF4, 10 mTorr pressure, and 100 W RF power. Subsequently to the CF4 RIE, residues of the resist were removed with an organic solvent to form a lattice-shaped SiO$_2$ mask 32 with a width of 100 µm and an interval of 1 mm.

Figure 35C:
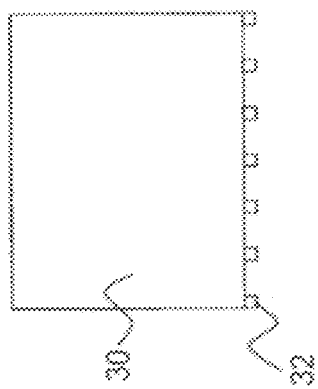

Furthermore, as shown in FIG. 35C, Se ions were implanted under conditions of an implantation energy of 20 keV and a dose amount of $1\times10^{15}$ cm$^{-2}$ using the SiO$_2$ mask 32 as a mask.

Figure 35D:
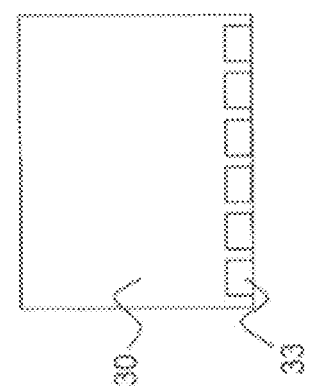

As shown in FIG. 35D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1\times10^{20}$ cm$^{-3}$ was obtained within a depth of 100 nm from the Si surface.

Figure 35E:
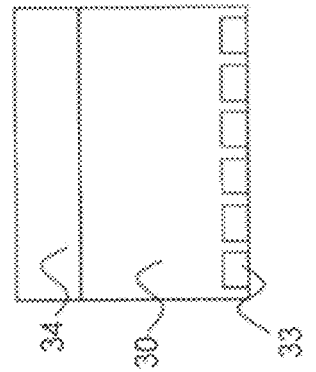

As shown in FIG. 35E, P ions were implanted under conditions of an implantation energy of 20 keV and a dose amount of $5\times10^{15}$ cm$^{-2}$ on the opposite side which had been doped with Se. Subsequently to the ion implantation, activation annealing was performed at 800° C. for 30 min, thereby providing the n$^+$ layer 34 with a concentration of $1\times10^{20}$ cm$^{-3}$ within a depth of 200 nm from the Si surface.

Figure 35F:
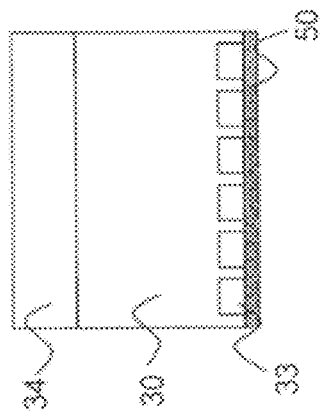

As shown in FIG. 35F, an Au layer with a thickness of 30 nm was formed with an evaporation method on the side which had been doped with Se, thereby forming the Au layer 50.

In addition, as shown in FIG. 36A, after a resist solution obtained by diluting a resist 36 (THMR IP3250, TOKYO OHKA KOGYO Co., Ltd.) with ethyl lactate (EL) by 1:2 was applied on the Au layer 50 formed on the rear surface of the p-type Si single-crystal substrate 30 by spin coating for 30 sec at 2000 rpm, the applied resist was heated at 110° C. for 90 sec on a hot plate to evaporate the solvent. The film thickness of the resist 36 was 150 nm.

As shown in FIG. 36B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 was provided with the convex shapes of which size and height were 200 nm and 100 nm, respectively (the shapes are formed in an area of 9 cm$^2$).

In addition, as shown in FIG. 36C, after the imprinting, the p-type Si single-crystal substrate 30 was cooled down to room temperature and then the quartz stamper 37 was released. The imprinting provided concave shapes with a size of 200 nm and a depth of 80 nm on the resist 36.

As shown in FIG. 36D, the resist pattern on which the concave patterns had been formed was etched for 30 sec under conditions of 30 sccm CF4, 10 mTorr pressure, and 100 W RF power. After the CF4 RIE, the bottom of the resist 36 was exposed to expose the Au layer 50.

As shown in FIG. 36E, the Au layer 50 was etched for 90 sec by ion milling under conditions of an acceleration voltage of 500V and an ion current of 40 mA to form the nano-mesh electrode 38. The ion milling provided dot metals 52 on the p-type Si layer 30. The dot metals formed a dot-pattern with a size of 200 nm. In addition, residues of the resist 36 were removed with an organic solvent.

Figure 37A:
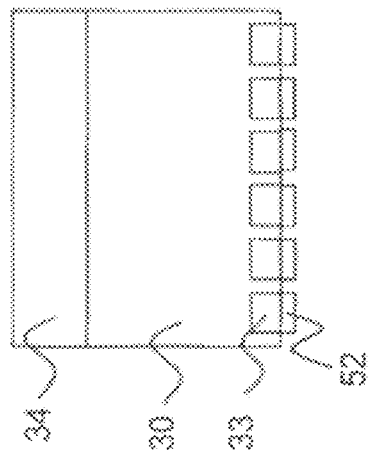
FIGS. 37A to 37D are sectional views showing the manufacturing method of the photoelectric conversion element according to the example 9.

As shown in FIG. 37A, after a resist 39 (THMR IP3250, TOKYO OHKA KOGYO Co., Ltd.) was applied on the dot metals 52 and the p-type Si layer 30 by spin coating for 30 sec at 2000 rpm, the applied resist was heated at 110° C. for 90 sec to evaporate the solvent. The film thickness of the resist 39 was 1 µm. The resist 39 was patterned in a lattice shape with a photolithography method using a lattice-shaped mask with a width of 100 μm and an interval of 1 mm. The lattice shape had a width of 100 μm and an interval of 1 mm. The patterning exposed the portion which had not been doped with Se.

Figure 37B:
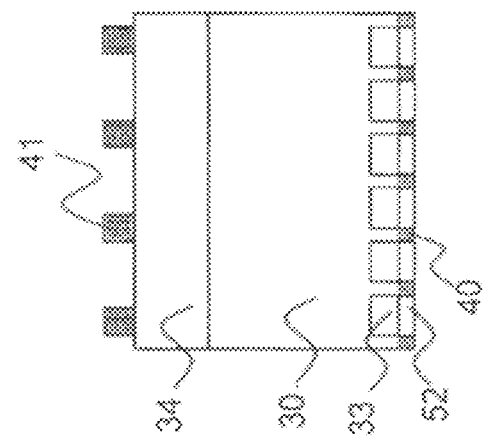

In addition, as shown in FIG. 37B, the dot metals 52 were etched for 80 sec by ion milling under conditions of an acceleration voltage of 500V and an ion current of 40 mA using the resist pattern as a mask, thereby removing the dot metals 52. Then, residues of the resist 39 were removed. Consequently, the dot metals 52 except on the long-wavelength absorption layer 33 were removed.

Figure 37C:
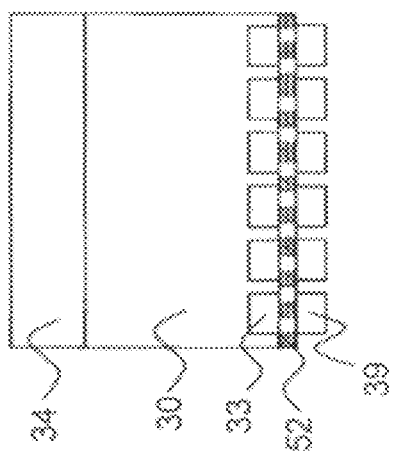

As shown in FIG. 37C, the back electrode 40 was formed with a liftoff method on the portion without the dot metals 52.

Figure 37D:
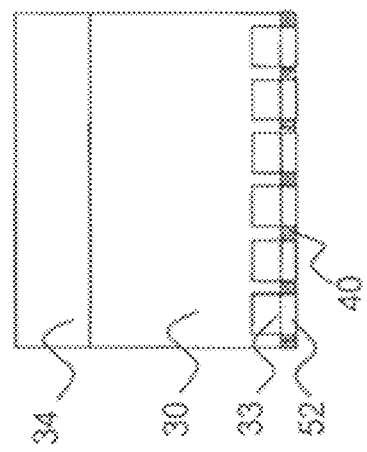

Finally, as shown in FIG. 37D, the comb electrode 41 (the metal layer) was formed on the n⁺ layer 34 with a screen printing method using Ag paste including an epoxy-based thermosetting resin, thereby completing the Si photoelectric conversion element having the long-wavelength absorption layer 33 and the dot metals 52.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the Se-doped long-wavelength absorption layer 33 and the dot metals 52 of the example 9 showed an excellent value of 11.2%.

On the other hand, a background-art Si single-crystal photoelectric conversion element showed a photoelectric conversion efficiency of 10.0% without the Se-doped long-wavelength absorption layer 33 or the dot metals 52.

In addition, when a background-art Si single-crystal photoelectric conversion element was evaluated for the spectral sensitivity characteristic, light was absorbed in a range of up to about 1100 nm. However, the Si single-crystal photoelectric conversion element having the Se-doped long-wavelength absorption layer 33 and the dot metals 52 had a light-absorption spectrum also in the range of 1100 nm to 1500 nm, although the absorption intensity thereof is not so high.

The results revealed that the Se-doped long-wavelength absorption layer 33 and the dot metals 52 allowed the photoelectric conversion efficiency to increase in a long wavelength region of light as a result of the light absorption in the long wavelength region of light.

Example 10

Single-Crystal Si, in, Cu, Dot Metals

A manufacturing method of a photoelectric conversion element in accordance with an example 10 will be described with reference to FIGS. 38A to 40D. FIGS. 38A to 40D are sectional views showing manufacturing steps of the photoelectric conversion element in accordance with the example 10.

Figure 38A:
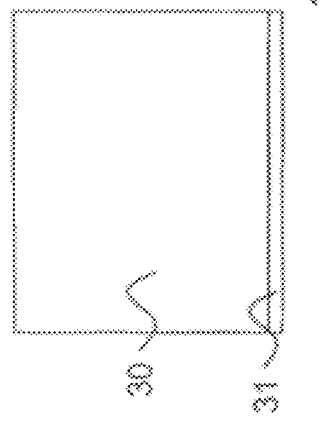
FIGS. 38A to 38F are sectional views showing a manufacturing method of a photoelectric conversion element according to an example 10.

As shown in FIG. 38A, as a substrate was prepared the p-type Si single-crystal substrate 30 having a thickness of 500 μm and a doping concentration of $1 \times 10^{16}$ cm$^{-3}$. Thermal oxidation of the surface of the p-type Si single-crystal substrate 30 formed the SiO$_2$ film 31 with a thickness of 150 nm.

Figure 38B:
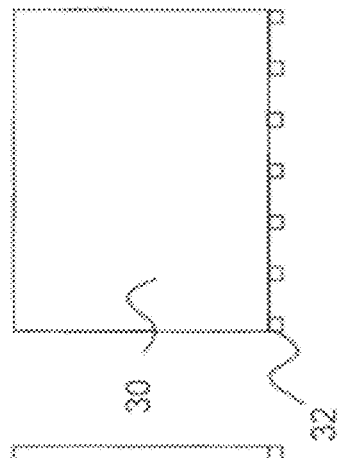

As shown in FIG. 38B, after a solution of the resist (THMR IP3250, TOKYO OHKA KOGYO Co., Ltd.) was applied on the SiO$_2$ film 31 for 30 sec at 2000 rpm by spin coating, the applied resist was heated on a hot plate at 110° C. for 90 sec to evaporate the solvent. The film thickness of the resist was 1 μm. The resist was patterned in a lattice shape with a photolithography method using a lattice-shaped mask with a width of 100 μm and an interval of 1 mm. The lattice shape had a width of 100 μm and an interval of 1 mm. Using the resist as a mask, the SiO$_2$ film 31 was etched for 10 min under conditions of 30-sccm CF4, 10 mTorr pressure, and 100 W RF power. Subsequently to the CF4 RIE, residues of the resist were removed with an organic solvent to form a lattice-shaped SiO$_2$ mask 32 with a width of 100 μm and an interval of 1 mm.

Figure 38C:
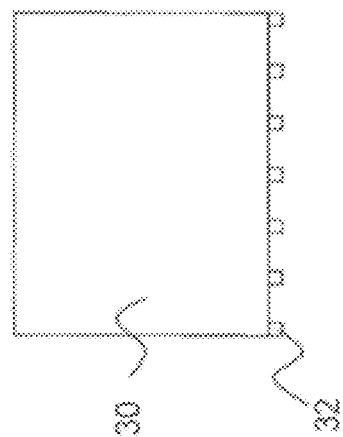

Furthermore, as shown in FIG. 38C, In ions were implanted under conditions of an implantation energy of 20 keV and a dose amount of $1 \times 10^{15}$ cm$^{-2}$ using the SiO$_2$ mask 32 as a mask.

Figure 38D:
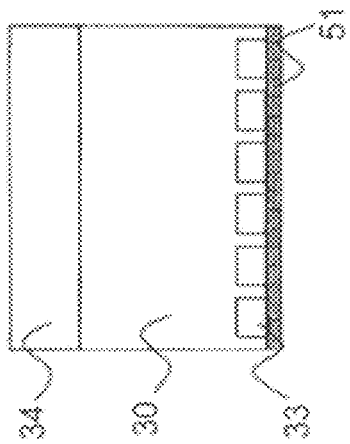

As shown in FIG. 38D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1 \times 10^{20}$ cm$^{-3}$ was obtained within a depth of 100 nm from the Si surface.

Figure 38E:
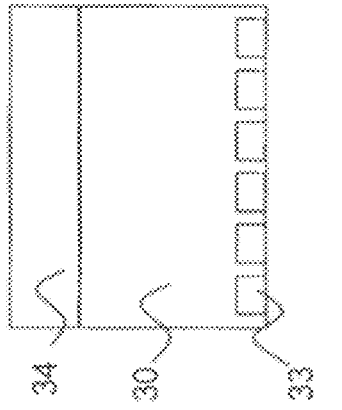

As shown in FIG. 38E, P ions were implanted under conditions of an implantation energy of 20 keV and a dose amount of $5 \times 10^{15}$ cm$^{-2}$ on the opposite side which had been doped with In. Subsequently to the ion implantation, activation annealing was performed at 800° C. for 30 min, thereby providing the n⁺ layer 34 with a concentration of $1 \times 10^{20}$ cm$^{-3}$ within a depth of 200 nm from the Si surface.

Figure 38F:
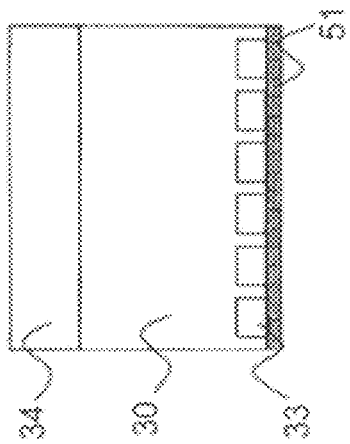

As shown in FIG. 38F, a Cu layer with a thickness of 30 nm was formed with an evaporation method on the side which had been doped with In, thereby forming the Cu layer 51.

In addition, as shown in FIG. 39A, after a resist solution was applied on the Cu layer 51 formed on the rear surface of the p-type Si single-crystal substrate 30 by spin coating for 30 sec at 2000 rpm, the applied resist was heated at 110° C. for 90 sec on a hot plate to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

As shown in FIG. 39B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 was provided with the convex shapes of which size and height are 100 nm and 100 nm, respectively (the shapes are formed in an area of 9 cm²).

In addition, as shown in FIG. 39C, after the imprinting, the p-type Si single-crystal substrate 30 was cooled down to room temperature and then the quartz stamper 37 was released. The imprinting provided concave shapes with a size of 100 nm and a depth of 80 nm on the resist 36.

As shown in FIG. 39D, the resist pattern on which the concave patterns had been formed was etched for 30 sec under conditions of 30 sccm CF$_4$, 10 mTorr pressure, and 100 W RF power. After the CF4 RIE, the bottom of the resist 36 was exposed to expose the Cu layer 51.

As shown in FIG. 39E, the Cu layer 51 was etched for 90 sec by ion milling under conditions of an acceleration voltage of 500V and an ion current of 40 mA to form dot metals 52. The ion milling provided the dot metals 52 on the p-type Si layer 30. The dot metals formed a dot-pattern with a size of 200 nm. In addition, residues of the resist 36 were removed with an organic solvent.

Figure 40A:
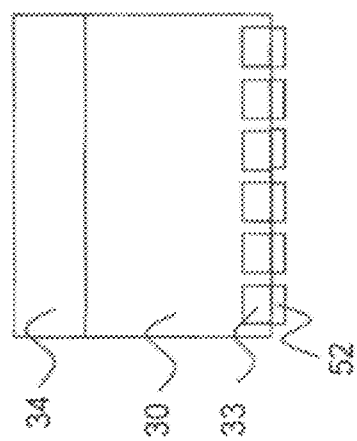
FIGS. 40A to 40D are sectional views showing the manufacturing method of the photoelectric conversion element according to the example 10.

As shown in FIG. 40A, after a solution of the resist 39 (THMR IP3250, TOKYO OHKA KOGYO Co., Ltd.) was applied on the dot metals 52 and the p-type Si layer 30 by spin coating for 30 sec at 2000 rpm, the applied resist was heated at 110° C. for 90 sec to evaporate the solvent. The film thickness of the resist 39 was 1 μm. The resist 39 was patterned in a lattice shape with a photolithography method using a lattice-shaped mask with a width of 100 μm and an interval of 1 mm. The lattice shape had a width of 100 μm and an interval of 1 mm. The patterning exposed the portion which had not been doped with In.

Figure 40B:
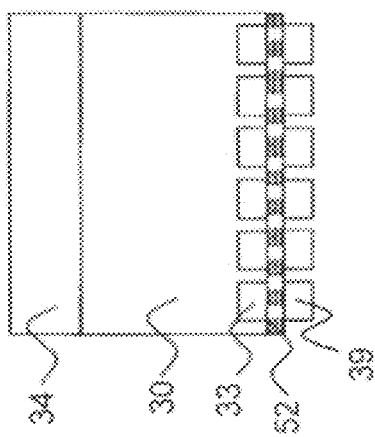

In addition, as shown in FIG. 40B, the dot metals 52 were etched for 80 sec by ion milling under conditions of an acceleration voltage of 500V and an ion current of 40 mA using the resist pattern as a mask, thereby removing the dot metals 52. Then, residues of the resist 39 were removed. Consequently, the dot metals 52 except on the long-wavelength absorption layer 33 were removed.

Figure 40C:
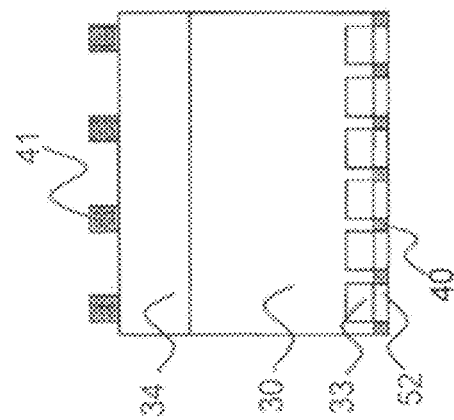

As shown in FIG. 40C, the back electrode 40 was formed with a liftoff method on the portion without the dot metals 52.

Figure 40D:
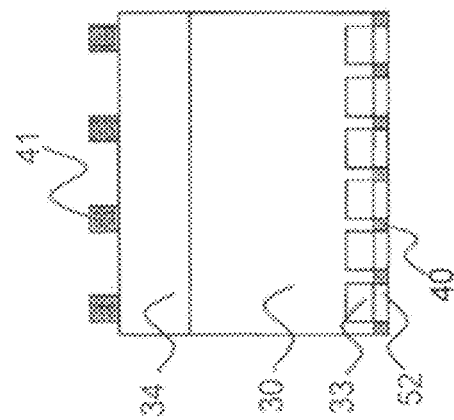

Finally, as shown in FIG. 40D, the comb electrode 41 (the first metal layer) was formed on the n⁺ layer 34 with a screen printing method using Ag paste including an epoxy-based thermosetting resin, thereby completing the Si photoelectric conversion element having the long-wavelength absorption layer 33 and the dot metals 52.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the In-doped long-wavelength absorption layer 33 and the dot metals 52 of the example 10 embodiment showed an excellent value of 11.2%.

On the other hand, a background-art Si single-crystal photoelectric conversion element showed a photoelectric conversion efficiency of 10.0% without the In-doped long-wavelength absorption layer 33 or the dot metals 52.

In addition, when a background-art Si single-crystal photoelectric conversion element was evaluated for the spectral sensitivity characteristic, light was absorbed in a range of up to about 1100 nm. However, the Si single-crystal photoelectric conversion element having the In-doped long-wavelength absorption layer 33 and the dot metals 52 had a light-absorption spectrum also in the range of 1100 nm to 1500 nm, although the absorption intensity thereof is not so high.

The results revealed that the In-doped long-wavelength absorption layer 33 and the dot metals 52 allowed the photoelectric conversion efficiency to increase in a long wavelength region of light as a result of the light absorption in the long wavelength region of light.

Example 11

Polycrystal Si, S, Ag, Nano-Mesh Electrode

A manufacturing method of a photoelectric conversion element in accordance with an example 11 will be described with reference to FIGS. 41A to 43D. FIGS. 41A to 43D are sectional views showing manufacturing steps of the photoelectric conversion element in accordance with the example 11.

As shown in FIG. 41A, as a substrate was prepared the p-type Si single-crystal substrate 30 having a thickness of 400 μm and a doping concentration of $1 \times 10^{17}$ cm$^{-3}$. Thermal oxidation of the surface of the p-type Si polycrystal substrate 53 formed the SiO$_2$ film 31 with a thickness of 150 nm.

As shown in FIG. 41B, after a solution of the resist (THMR IP3250, TOKYO OHKA KOGYO Co., Ltd.) was applied on the SiO$_2$ film 31 for 30 sec at 2000 rpm by spin coating, the applied resist was heated on a hot plate at 110° C. for 90 sec to evaporate the solvent. The film thickness of the resist was 1 μm. The resist was with a photolithography method using a lattice-shaped mask with a width of 100 μm and an interval of 1 mm. The lattice shape had a width of 100 μm and an interval of 1 mm. Using the resist as a mask, the SiO$_2$ film 31 was etched for 10 min under conditions of 30-sccm CF4, 10 mTorr pressure, and 100 W RF power. Subsequently to the CF4 RIE, residues of the resist were removed with an organic solvent to form a lattice-shaped SiO$_2$ mask 32 with a width of 100 μm and an interval of 1 mm.

Furthermore, as shown in FIG. 41C, S ions were implanted under conditions of an implantation energy of 20 keV and a dose amount of $1 \times 10^{15}$ cm$^{-2}$ using the SiO$_2$ mask 32 as a mask.

As shown in FIG. 41D, after the SiO$_2$ mask 32 was removed with hydrofluoric acid, activation annealing was performed at 1000° C. for 30 min to form the long-wavelength absorption layer 33. In the long-wavelength absorption layer 33, a concentration of $1 \times 10^{20}$ cm$^{-3}$ was obtained within a depth of 100 nm from the Si surface.

As shown in FIG. 41E, P ions were implanted under conditions of an implantation energy of 20 keV and a dose amount of $5 \times 10^{15}$ cm$^{-2}$ on the opposite side which had been doped with In. Subsequently to the ion implantation, activation annealing was performed at 800° C. for 30 min, thereby providing the n⁺ layer 34 with a concentration of $1 \times 10^{20}$ cm$^{-3}$ within a depth of 200 nm from the Si surface.

As shown in FIG. 41F, an Ag layer with a thickness of 30 nm was formed with an evaporation method on the side which had been doped with S, thereby forming the Ag layer 35.

In addition, as shown in FIG. 42A, after a resist solution was applied on the Ag layer 35 formed on the rear surface of the p-type Si single-crystal substrate 53 by spin coating for 30 sec at 2000 rpm, the applied resist was heated at 110° C. for 90 sec on a hot plate to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

As shown in FIG. 42B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 was provided with the convex shapes of which pitch, size, and height were 200 nm, 100 nm, and 150 nm, respectively (the shapes are formed in an area of 9 cm$^2$).

In addition, as shown in FIG. 42C, after the imprinting, the p-type Si polycrystal substrate 53 was cooled down to room temperature and then the quartz stamper 37 was released. The imprinting provided concave shapes with a pitch of 200 nm, a size of 100 nm, and a depth of 100 nm on the resist 36.

As shown in FIG. 42D, the resist pattern on which the concave patterns had been formed was etched for 30 sec under conditions of 30 sccm CF4, 10 mTorr pressure, and 100 W RF power. After the CF4 RIE, the bottom of the resist 36 was exposed to expose the Ag layer 35.

As shown in FIG. 42E, the Ag layer 35 was etched for 80 sec by ion milling under conditions of an acceleration voltage of 500V and an ion current of 40 mA to form nano-mesh electrode 38 on the p-type Si layer 53. The Ag layer 35 was processed by the ion milling to be the nano-mesh electrode 38 having openings (through holes) with a pitch of 200 nm and a size of 100 nm. In addition, residues of the resist 36 were removed with an organic solvent.

As shown in FIG. 43A, after a solution of the resist 39 (THMR IP3250, TOKYO OHKA KOGYO Co., Ltd.) was applied on the nano-mesh electrode 38 and the p-type Si layer 53 by spin coating for 30 sec at 2000 rpm, the applied resist was heated at 110° C. for 90 sec to evaporate the solvent. The film thickness of the resist 39 was 1 µm. The resist 39 was patterned in a lattice shape with a photolithography method using a lattice-shaped mask with a width of 100 µm and an interval of 1 mm. The lattice shape has a width of 100 µm and an interval of 1 mm. The patterning exposed the portion which had not been doped with S.

In addition, as shown in FIG. 43B, the nano-mesh metal electrode 38 was etched for 80 sec by ion milling under conditions of an acceleration voltage of 500V and an ion current of 40 mA using the resist pattern as a mask, thereby removing the nano-mesh metal electrode 38. Then, residues of the resist 39 were removed. Consequently, the nano-mesh metal electrode 38 except on the long-wavelength absorption layer 33 was removed.

As shown in FIG. 43C, the back electrode 40 was formed on the portion without the nano-mesh electrode 38 using a liftoff method.

Finally, as shown in FIG. 43D, the comb electrode 41 (the first metal layer) was formed on the n+ layer 34 with a screen printing method using Ag paste including an epoxy-based thermosetting resin, thereby completing the Si photoelectric conversion element having the long-wavelength absorption layer 33 and the nano-mesh electrode 38.
(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the S-doped long-wavelength absorption layer 33 and the dot metals 52 of the example 11 embodiment showed an excellent value of 10.5%.

On the other hand, a background-art Si single-crystal photoelectric conversion element showed a photoelectric conversion efficiency of 10.0% without the S-doped long-wavelength absorption layer 33 or the dot metals 52.

In addition, when a background-art Si polycrystal photoelectric conversion element was evaluated for the spectral sensitivity characteristic, light was absorbed in a range of up to about 1100 nm. However, the Si polycrystal photoelectric conversion element having the S-doped long-wavelength absorption layer 33 and the dot metals 52 had a light-absorption spectrum also in the range of 1100 nm to 1500 nm, although the absorption intensity thereof is not so high.

The results revealed that the In-doped long-wavelength absorption layer 33 and the nano-mesh electrode 38 allowed the photoelectric conversion efficiency to increase in a long wavelength region of light as a result of the light absorption in the long wavelength region of light.

Example 12

Polycrystal Si, S, Ag, Dot Metals

A manufacturing method of a photoelectric conversion element in accordance with an example 12 will be described with reference to FIGS. 44A to 46D. FIGS. 44A to 46D are sectional views showing manufacturing steps of the photoelectric conversion element in accordance with the example 12.

Figure 44A:
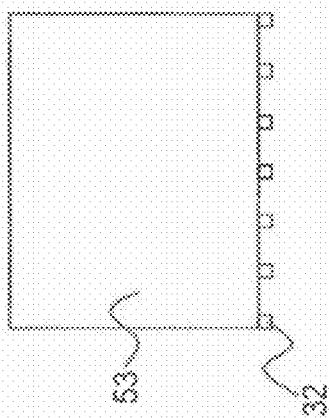
FIGS. 44A to 44F are sectional views showing a manufacturing method of a photoelectric conversion element according to an example 12.

As shown in FIG. 44A, as a substrate was prepared the p-type Si polycrystal substrate 53 having a thickness of 500 nm and a doping concentration of $1\times10^{17}$ $cm^{-3}$. Thermal oxidation of the surface of the p-type Si polycrystal substrate 53 provided the $SiO_2$ film 31 with a thickness of 150 nm.

Figure 44B:
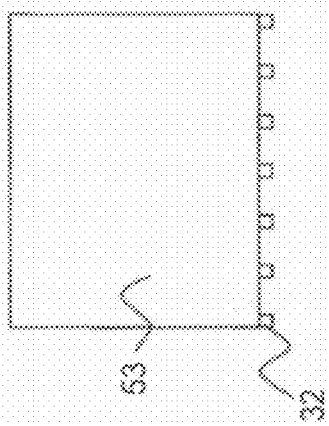

As shown in FIG. 44B, after a solution of the resist (THMR IP3250, TOKYO OHKA KOGYO Co., Ltd.) was applied on the $SiO_2$ film 31 by spin coating for 30 sec at 2000 rpm, the applied resist was heated on a hot plate at 110° C. for 90 sec to evaporate the solvent. The film thickness of the resist was 1 µm. The resist was patterned in a lattice shape with a photolithography method using a lattice-shaped mask with a width of 100 µm and an interval of 1 mm. The lattice shape has a width of 100 µm and an interval of 1 mm. Using the resist as a mask, the $SiO_2$ film 31 was etched for 10 min under conditions of 30-sccm CF4, 10 mTorr pressure, and 100 W RF power. Subsequently to the CF4 RIE, residues of the resist were removed with an organic solvent to form a lattice-shaped $SiO_2$ mask 32 with a width of 100 µm and an interval of 1 mm.

Figure 44C:
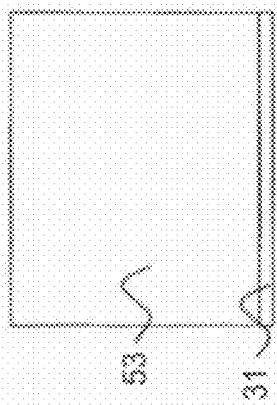

Furthermore, as shown in FIG. 44C, S ions were implanted under conditions of an implantation energy of 20 keV and a dose amount of $1\times10^{15}$ $cm^{-2}$ using the $SiO_2$ mask 32 as a mask.

Figure 44D:
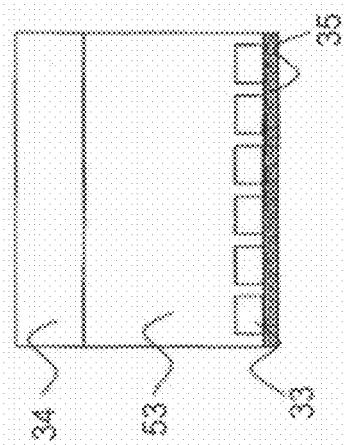

As shown in FIG. 44D, after the $SiO_2$ mask 32 was removed with hydrofluoric acid, activation annealing was performed at 1000° C. for 30 min to form the long-wavelength absorption layer 33. In the long-wavelength absorption layer 33, a concentration of $1\times10^{20}$ $cm^{-3}$ was obtained within a depth of 100 nm from the Si surface.

Figure 44E:
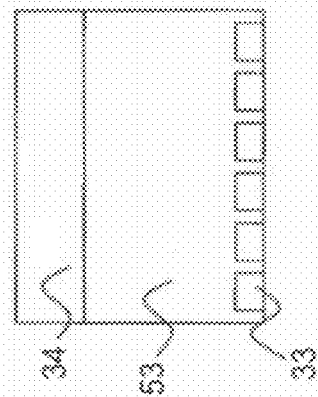

As shown in FIG. 44E, P ions were implanted under conditions of an implantation energy of 20 keV and a dose amount of $5\times10^{15}$ $cm^{-2}$ on the opposite side which had been doped with S. Subsequently to the ion implantation, activation annealing was performed at 800° C. for 30 min, thereby providing the n+ layer 34 with a concentration of $1\times10^{20}$ $cm^{-3}$ within a depth of 200 nm from the Si surface.

Figure 44F:
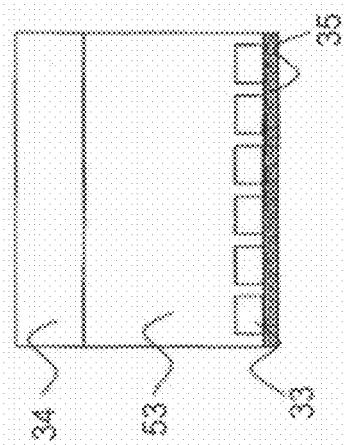

As shown in FIG. 44F, an Ag layer with a thickness of 30 nm was formed with an evaporation method on the side which had been doped with S, thereby forming the Ag layer 35.

In addition, as shown in FIG. 45A, after a resist solution was applied on the Ag layer 35 formed on the rear surface of the p-type Si single-crystal substrate 30 by spin coating for 30 sec at 2000 rpm, the applied resist was heated at 110° C. for 90 sec on a hot plate to evaporate the solvent. The resist solution was obtained by diluting a resist 36 (THMR IP3250, TOKYO OHKA KOGYO Co., Ltd.) with ethyl lactate (EL) by 1:2. The film thickness of the resist 36 was 150 nm.

As shown in FIG. 45B, imprint was conducted as follows. A quartz stamper 37 was pressed to the resist 36 at a pressure of 10 MPa with heating the p-type Si single crystal substrate 30 at 120° C. so that the surface of the quartz stamper 37 having convex shapes was in contact with the resist 36. The quartz stamper 37 is provided with the convex shapes of which size and height were 100 nm and 150 nm, respectively (the shapes are formed in an area of 9 $cm^2$).

In addition, as shown in FIG. 45C, after the imprinting, the p-type Si polycrystal substrate 53 was cooled down to room temperature and then the quartz stamper 37 was released. The imprinting provided concave shapes with a size of 150 nm and a depth of 80 nm on the resist 36.

As shown in FIG. 45D, the resist pattern on which the concave patterns had been formed was etched for 30 sec under conditions of 30 sccm CF4, 10 mTorr pressure, and 100 W RF power. After the CF4 RIE, the bottom of the resist 36 was exposed to expose the Ag layer 35.

As shown in FIG. 45E, the Ag layer 35 was etched for 80 sec by ion milling under conditions of an acceleration voltage of 500V and an ion current of 40 mA to form dot metals 52 on the p-type Si layer 53. The Ag layer 35 was processed by the ion milling to be the dot metals 52 having a size of 150 nm. In addition, residues of the resist 36 were removed with an organic solvent.

Figure 46A:
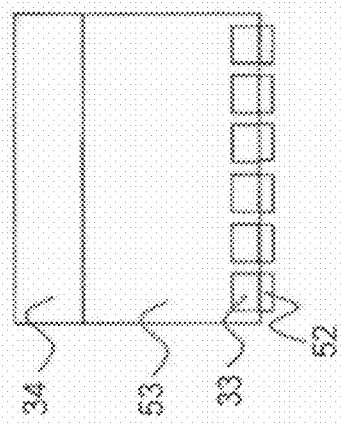
FIGS. 46A to 46D are sectional views showing the manufacturing method of the photoelectric conversion element according to the example 12.

As shown in FIG. 46A, after a solution of the resist 39 (THMR IP3250, TOKYO OHKA KOGYO Co., Ltd.) was applied on the dot metals 52 and the p-type Si layer 53 by spin coating for 30 sec at 2000 rpm, the applied resist was heated at 110° C. for 90 sec to evaporate the solvent. The film thickness of the resist 39 was 1 µm. The resist 39 was patterned in a lattice shape with a photolithography method using a lattice-shaped mask with a width of 100 µm and an interval of 1 mm. The lattice shape had a width of 100 µm and an interval of 1 mm. The patterning exposed the portion which had not been doped with S.

Figure 46B:
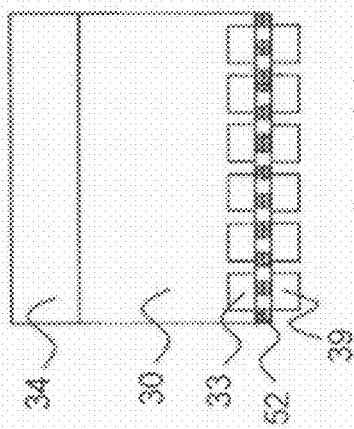

In addition, as shown in FIG. 46B, the dot metals 52 were etched for 80 sec by ion milling under conditions of an acceleration voltage of 500V and an ion current of 40 mA using the resist pattern as a mask, thereby removing the dot metals 52. Then, residues of the resist 39 were removed. Consequently, the dot metals 52 except on the long-wavelength absorption layer 33 were removed.

Figure 46C:
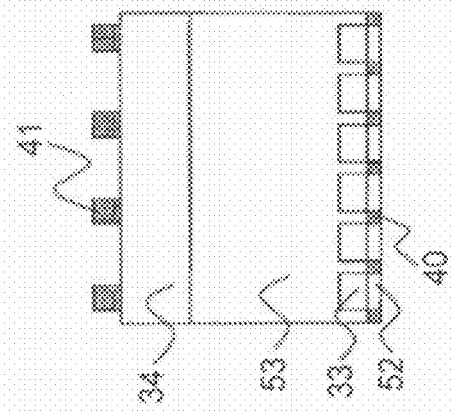

As shown in FIG. 46C, the back electrode 40 was formed on the portion without the dot metals 38 using a liftoff method.

Figure 46D:
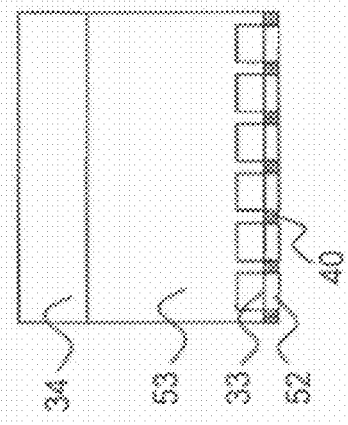

Finally, as shown in FIG. 46D, the comb electrode 41 (the first metal layer) was formed on the n$^+$ layer 34 with a screen printing method using Ag paste including an epoxy-based thermosetting resin, thereby completing the Si photoelectric conversion element having the long-wavelength absorption layer 33 and the dot metals 52.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si polycrystal photoelectric conversion element having the S-doped long-wavelength absorption layer 33 and the dot metals 52 of the example 12 embodiment showed an excellent value of 9.5%.

On the other hand, a background-art Si polycrystal photoelectric conversion element showed a photoelectric conversion efficiency of 8.0% without the S-doped long-wavelength absorption layer 33 or the dot metals 52.

In addition, when the background-art Si polycrystal photoelectric conversion element was evaluated for the spectral sensitivity characteristic, light was absorbed in a range of up to about 1100 nm. However, the Si polycrystal photoelectric conversion element having the S-doped long-wavelength absorption layer 33 and the dot metals 52 had a light-absorption spectrum also in the range of 1100 nm to 1500 nm, although the absorption intensity thereof is not so high.

The results revealed that the In-doped long-wavelength absorption layer 33 and the dot metals 52 allowed the photoelectric conversion efficiency to increase in a long wavelength region of light as a result of the light absorption in the long wavelength region of light.

A photoelectric conversion element in accordance with at least one of the above-described embodiments employs a metal nano structure on a photoelectric conversion layer of the photoelectric conversion element to which impurity levels are introduced within a band gap of the photoelectric conversion layer by doping the photoelectric conversion layer with an impurity. Such a photoelectric conversion element can provide high conversion efficiency.

Example 13

Single Crystal Si, S, P, Ag, Nano-Mesh Electrode

As an example 13, a Si photoelectric conversion element was manufactured in the same way as in FIG. 14C of the example 1, except that S and P ions were implanted under conditions of an implantation energy of 20 keV and a dose amount of $1 \times 10^{15}$ cm$^{-2}$ using the SiO$_2$ mask 32 as a mask.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the S and P-doped long-wavelength absorption layer 33 and the nano-mesh electrode 38 showed an excellent value of 13.5%.

On the other hand, a background-art Si single-crystal photoelectric conversion element showed a photoelectric conversion efficiency of 10.0% without the S-doped long-wavelength absorption layer 33 or the nano-mesh electrode 38 as described in the example 1.

When the background-art Si single-crystal photoelectric conversion element was evaluated for the spectral sensitivity characteristic, light was absorbed in a range of up to about 1100 nm. However, the Si single-crystal photoelectric conversion element having the S and P-doped long-wavelength absorption layer 33 and the nano-mesh electrode 38 showed higher absorption than when the long-wavelength absorption layer was doped with S only. In addition, the Si single-crystal photoelectric conversion element having the S and P-doped long-wavelength absorption layer 33 and the nano-mesh electrode 38 showed a light-absorption spectrum also in the range of 1100 nm to 1500 nm.

The results revealed that the S and P-doped long-wavelength absorption layer 33 and the nano-mesh electrode 38 allowed the photoelectric conversion efficiency to increase in a long wavelength region of light as a result of the light absorption in the long wavelength region of light.

Example 14

Single Crystal Si, S—O, P, Cu, Nano-Mesh Electrode

As an example 14, a Si photoelectric conversion element was manufactured in the same way as in FIG. 20C of the example 3, except that S, O, and P ions were implanted under conditions of an implantation energy of 20 keV and a dose amount of $1 \times 10^{15}$ cm$^{-2}$ using the SiO$_2$ mask 32 as a mask.

(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the S, O, and P-doped long-wavelength absorption layer 33 and the nano-mesh electrode 38 showed an excellent value of 14%.

On the other hand, a background-art Si single-crystal photoelectric conversion element showed a photoelectric conversion efficiency of 10.0% without the S-doped long-wavelength absorption layer 33 or the nano-mesh electrode 38 as described in the example 3.

When the background-art Si single-crystal photoelectric conversion element was evaluated for the spectral sensitivity characteristic, light was absorbed in a range of up to about 1100 nm. However, the Si single-crystal photoelectric conversion element having the S, O and P-doped long-wavelength absorption layer 33 and the nano-mesh electrode 38 showed higher absorption than when the long-wavelength absorption layer was doped with S and O only. In addition, the Si single-crystal photoelectric conversion element having the S, O and P-doped long-wavelength absorption layer 33 and the nano-mesh electrode 38 showed a light-absorption spectrum also in the range of 1100 nm to 1500 nm. S and O can form an absorption pair S—O. The absorption pair provided a higher absorption amount than S only.

The results revealed that the S, O, and P-doped long-wavelength absorption layer 33 and the nano-mesh electrode 38 allowed the photoelectric conversion efficiency to increase in a long wavelength region of light as a result of the light absorption in the long wavelength region of light.

Example 15

Single Crystal Si, Mg, Ga, P, Cu, Nano-Mesh Electrode

As an example 15, a Si photoelectric conversion element was manufactured in the same way as in FIG. 29C of the example 6, except that Mg, Ga, and P ions were implanted under conditions of an implantation energy of 20 keV and a dose amount of $1 \times 10^{15}$ cm$^{-2}$ using the SiO$_2$ mask 32 as a mask.
(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the Mg, Ga, and P-doped long-wavelength absorption layer 33 and the nano-mesh electrode 38 showed an excellent value of 13%.

On the other hand, a background-art Si single-crystal photoelectric conversion element showed a photoelectric conversion efficiency of 10.0% without the Mg, Ga, and P-doped long-wavelength absorption layer 33 or the nano-mesh electrode 38 as described in the example 6.

When the background-art Si single-crystal photoelectric conversion element was evaluated for the spectral sensitivity characteristic, light was absorbed in a range of up to about 1100 nm. However, the Si single-crystal photoelectric conversion element having the Mg, Ga and P-doped long-wavelength absorption layer 33 and the nano-mesh electrode 38 showed higher absorption than when the long-wavelength absorption layer was doped with Mg and Ga only. In addition, the Si single-crystal photoelectric conversion element having the Mg, Ga and P-doped long-wavelength absorption layer 33 and the nano-mesh electrode 38 showed a light-absorption spectrum also in the range of 1100 nm to 1400 nm.

The results revealed that the Mg, Ga, and P-doped long-wavelength absorption layer 33 and the nano-mesh electrode 38 allowed the photoelectric conversion efficiency to increase in a long wavelength region of light as a result of the light absorption in the long wavelength region of light. Furthermore, Mg and Ga have levels near the conduction band and the valence band, respectively. The absorption due to electronic transition produced an absorption band in the long wavelength region of light.

As described above, a single impurity level provides little absorption bands in the long wavelength region of light. However, two or more impurity levels can clearly provide absorption bands in the long wavelength region of light.

Example 16

Single Crystal Si, Se, P, Au, Dot Metals

As an example 16, a Si photoelectric conversion element was manufactured in the same way as in FIG. 35C of the example 9, except that Se and P ions were implanted under conditions of an implantation energy of 20 keV and a dose amount of $1 \times 10^{15}$ cm$^{-2}$ using the SiO$_2$ mask 32 as a mask.
(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the Se and P-doped long-wavelength absorption layer 33 and the dot metals 52 showed an excellent value of 13%.

On the other hand, a background-art Si single-crystal photoelectric conversion element showed a photoelectric conversion efficiency of 10.0% without the Se and P-doped long-wavelength absorption layer 33 or the dot metals 52 as described in the example 9.

When the background-art Si single-crystal photoelectric conversion element was evaluated for the spectral sensitivity characteristic, light was absorbed in a range of up to about 1100 nm. However, the Si single-crystal photoelectric conversion element having the Se and P-doped long-wavelength absorption layer 33 and the nano-mesh electrode 38 showed higher absorption than when the long-wavelength absorption layer was doped with Se only. In addition, the Si single-crystal photoelectric conversion element having the Mg, Ga and P-doped long-wavelength absorption layer 33 and the dot metals 52 showed a light-absorption spectrum also in the range of 1100 nm to 1400 nm.

The results revealed that the Se and P-doped long-wavelength absorption layer 33 and the nano-mesh electrode 38 allowed the photoelectric conversion efficiency to increase in a long wavelength region of light as a result of the light absorption in the long wavelength region of light.

Example 17

Polycrystal Si, S, P, Ag, Nano-Mesh Electrode

As an example 17, a Si photoelectric conversion element was manufactured in the same way as in FIG. 41C of the example 11, except that S ions were implanted under conditions of an implantation energy of 20 keV and a dose amount of $1 \times 10^{15}$ cm$^{-2}$ using the SiO$_2$ mask 32 as a mask.
(Characteristic of Solar Cell)

The photoelectric conversion element manufactured as described above was irradiated with a pseudo-sunlight of AM 1.5 and was evaluated for the photoelectric conversion efficiency at room temperature. As a result, the photoelectric conversion efficiency of the Si single-crystal photoelectric conversion element having the S and P-doped long-wavelength absorption layer 33 and the nano-mesh electrode 38 showed an excellent value of 12%.

On the other hand, a background-art Si polycrystal photoelectric conversion element showed a photoelectric conversion efficiency of 8.0% without the S and P-doped long-wavelength absorption layer 33 or the nano-mesh electrode 38 as described in the example 11.

When the background-art Si polycrystal photoelectric conversion element was evaluated for the spectral sensitivity characteristic, light was absorbed in a range of up to about 1100 nm. However, the Si polycrystal photoelectric conversion element having the S and P-doped long-wavelength absorption layer 33 and the nano-mesh electrode 38 showed higher absorption than when the long-wavelength absorption layer was doped with S only. In addition, the Si polycrystal photoelectric conversion element having the S and P-doped long-wavelength absorption layer 33 and the nano-mesh electrode 38 showed a light-absorption spectrum in the range of 1100 nm to 1400 nm.

The results revealed that the S and P-doped long-wavelength absorption layer 33 and the nano-mesh electrode 38 allowed the photoelectric conversion efficiency to increase in a long wavelength region of light as a result of the light absorption in the long wavelength region of light.

While certain embodiments have been described, those embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photoelectric conversion element comprising:
   a semiconductor layer having a p-type semiconductor layer and an n-type semiconductor layer to form a pn-junction;
   a long-wavelength absorption layer partially provided in the p-type semiconductor layer within a depth of 5 nm from a surface of the p-type semiconductor layer, the long-wavelength absorption layer containing an impurity different from impurities for p-type doping and n-type doping of the semiconductor layer and absorbing light having a wavelength longer than light absorbed into the semiconductor layer, the light entering from a side of the n-type semiconductor layer; and
   a metal layer provided to contact the long-wavelength absorption layer, the metal layer being a nano-mesh metal having a plurality of through holes or a dot metal having a plurality of metal dots arranged separately from each other.

2. The element according to claim 1, wherein
the long-wavelength absorption layer containing the impurity has a polar character opposite to the polar character of the semiconductor layer to form a pn-junction.

3. The element according to claim 1, wherein
the nano-mesh metal has a thickness of not less than 2 nm and not more than 200 nm and has the through holes, each of which has a mean opening area of not less than 80 nm$^2$ and not more than 0.8 μm$^2$.

4. The element according to claim 1, wherein
the metal dots have a mean volume of not less than 4 nm$^3$ and not more than 0.52 μm$^3$, and have a mean interval of 1 nm or more when the mean volume is less than $4\times10^{-3}$ μm$^3$, or have a mean interval of not less than 100 nm and not more than 1 μm when the mean volume is not less than $4\times10^{-3}$ μm$^3$.

5. The element according to claim 1, wherein
the metal layer comprises at least one element selected from the group consisting of Al, Ag, Au, Cu, Pt, Ni, Co, Cr and Ti.

6. The element according to claim 1, wherein
the long-wavelength absorption layer comprises at least one element selected from the group consisting of S, In, Se, Be, Cu, Li, Tl, Zn, Cd, O, Ga, Al and Mg.

7. The element according to claim 1, wherein
the long-wavelength absorption layer has an impurity concentration of not less than $10^{19}$ cm$^{-3}$ and not more than $10^{21}$ cm$^{-3}$ and a thickness of not less than 10 nm and not more than 1000 nm.

8. The element according to claim 1, wherein
the semiconductor layer includes a single-crystalline silicon, a polycrystalline silicon, or an amorphous silicon.

9. The element according to claim 1, wherein
the semiconductor layer includes a compound semiconductor.

10. The element according to claim 1, wherein
the semiconductor layer comprises GaAs, CdTe, or SiC.

11. The element according to claim 10, wherein
a concentration of the p-type dopant in a central p-type doping of the semiconductor layer is $1\times10^{16}$ cm$^{-3}$.

12. The element according to claim 1, wherein
the semiconductor layer comprises an n-type doping region adjacent to a first metal layer and a central p-type doping region.

13. The element according to claim 1, wherein
the metal layer comprises a nano-mesh aluminum having a thickness of from 2 nm to 200 nm and including a plurality of through-holes.

14. The element according to claim 1, wherein
an area of a through-hole opening is from 80 nm$^2$ to 0.8 μm$^2$.

15. The element according to claim 1, wherein
a concentration of the S in the long-wavelength absorption layer is $1\times10^{20}$ cm$^{-3}$.

16. The element according to claim 1, wherein
the semiconductor layer comprises single crystal Si,
the metal layer is nano-mesh Ag, and
the long-wavelength absorption layer comprises S.

17. The element according to claim 1, wherein
the semiconductor layer comprises single crystal Si,
the metal layer is nano-mesh Cu, and
the long-wavelength absorption layer comprises S and O.

18. The element according to claim 1, wherein
the semiconductor layer comprises single crystal Si,
the metal layer is nano-mesh Ag, and
the long-wavelength absorption layer comprises Se.

19. The element according to claim 1, wherein
the semiconductor layer comprises single crystal Si,
the metal layer is nano-mesh Au, and
the long-wavelength absorption layer comprises S.

20. The element according to claim 1, wherein
the semiconductor layer comprises single crystal Si,
the metal layer is nano-mesh Au, and
the long-wavelength absorption layer comprises In.

21. The element according to claim 1, wherein
the long-wavelength absorption layer partially provided in the p-type semiconductor layer within the depth of 5 nm from the surface of the p-type semiconductor layer.

* * * * *